United States Patent [19]

Shinagawa et al.

[11] Patent Number: 5,635,932
[45] Date of Patent: Jun. 3, 1997

[54] LEMPEL-ZIV COMPRESSION WITH EXPULSION OF DICTIONARY BUFFER MATCHES

[75] Inventors: Akio Shinagawa, Kawasaki; Hitoshi Ohno; Yuko Abe, both of Tokyo, all of Japan

[73] Assignee: Fujitsu Limited, Kawasaki, Japan

[21] Appl. No.: 505,760

[22] Filed: Jul. 21, 1995

[30] Foreign Application Priority Data

Oct. 17, 1994 [JP] Japan .................................. 6-251016
Oct. 17, 1994 [JP] Japan .................................. 6-251017

[51] Int. Cl.$^6$ ........................................ H03M 7/30
[52] U.S. Cl. ........................................ 341/51; 341/87
[58] Field of Search ........................................ 341/51, 87

[56] References Cited

U.S. PATENT DOCUMENTS

| | | | |
|---|---|---|---|
| 5,010,345 | 4/1991 | Nagy | 341/51 |
| 5,281,967 | 1/1994 | Jung | 341/51 |

FOREIGN PATENT DOCUMENTS

| | | |
|---|---|---|
| 4-123619 | 4/1992 | Japan . |
| 4-280517 | 10/1992 | Japan . |

OTHER PUBLICATIONS

Storer, *Data Compression Methods and Theory*, 1988 Computer Science Press, pp. 64–69.

*Primary Examiner*—Howard L. Williams
*Attorney, Agent, or Firm*—Staas & Halsey

[57] ABSTRACT

A data processing apparatus has a dictionary control unit in which pieces of dictionary data stored in a dictionary buffer are compared with pieces of input data to be compressed input one after another, a piece of particular dictionary data agreeing with a piece of particular input data is expelled from the dictionary buffer, the dictionary data stored in the dictionary buffer are placed close together in a direction, and the particular input data is written in the dictionary buffer. Also, a data processing apparatus has an occurrence frequency producing editor for counting an occurrence frequency of each of types of pieces of input data to be compressed and producing an occurrence frequency table formed of a plurality of occurrence frequencies of the types of the input data to be compressed, a data comparing editor for predicting an occurrence of a piece of next input data subsequent to a piece of input data, and a code converting editor for converting the types of pieces of input data according to the occurrence prediction of the next input data in the data comparing editor on condition that a type of a piece of input data is converted into a piece of compressed data having a shorter bit length as an occurrence probability of the type of the input data is higher.

9 Claims, 25 Drawing Sheets

AGREEMENT START POSITION

3-BYTE AGREEMENT

3 BYTES OF CHARACTERS ARE EXPELLED FROM A HEAD POSITION

TRANSFERING OF "a, b, c"

DUPLICATE DICTIONARY DATA

FIG.9(A)
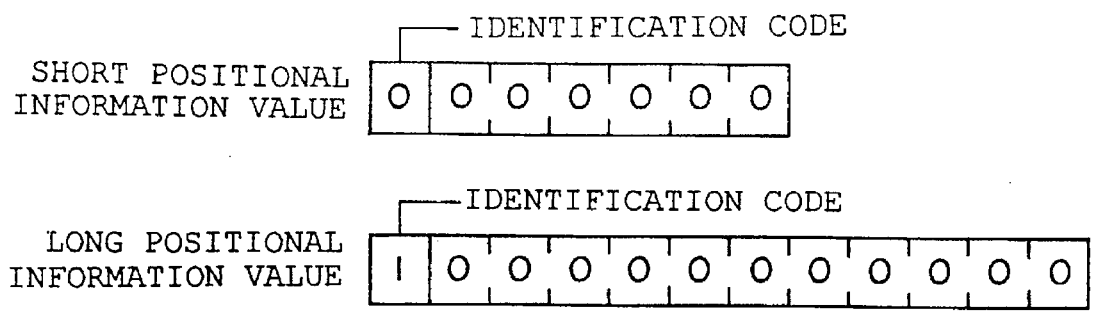
FIG.9(B)
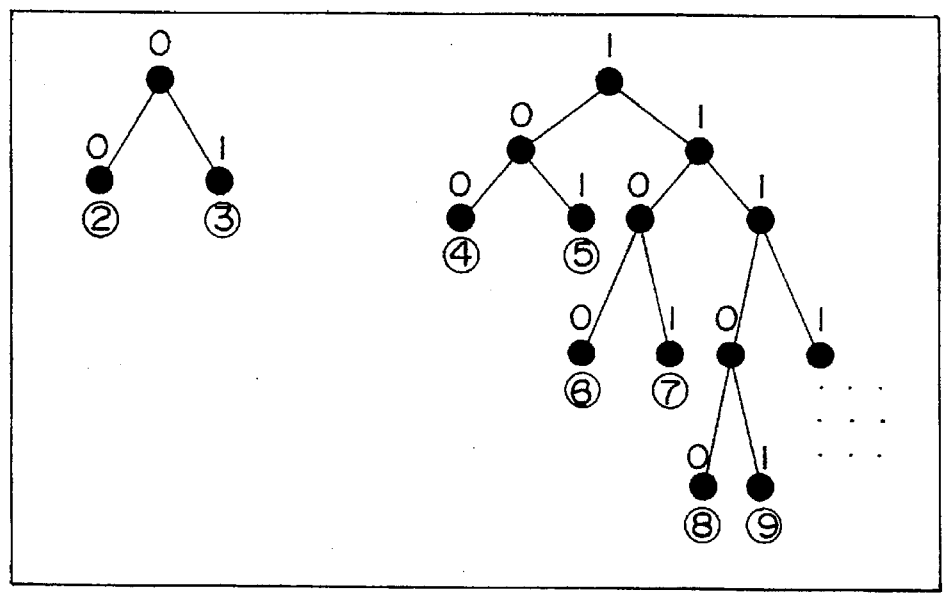
FIG.9(C)
```
0 0            2-BYTE AGREEMENT
0 1            3-BYTE AGREEMENT
1 0 0          4-BYTE AGREEMENT
1 0 1          5-BYTE AGREEMENT
1 1 0 0        6-BYTE AGREEMENT
1 1 0 1        7-BYTE AGREEMENT
1 1 1 0 0      8-BYTE AGREEMENT
1 1 1 0 1      9-BYTE AGREEMENT
. . . . . . . . . . . .
```

FIG.11(A)
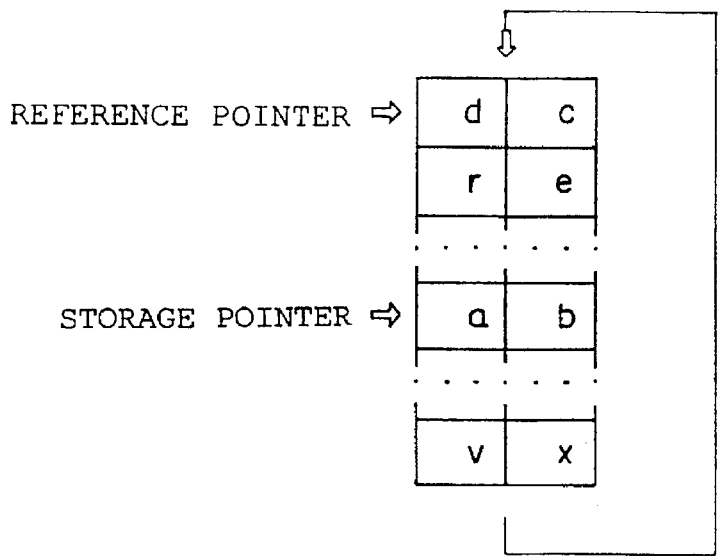
FIG.11(B)
LONG POSITIONAL INFORMATION VALUE — IDENTIFICATION CODE
| 1 | 000 0000 0000 | ⇨ FIRST LINE OF AGREEMENT DICTIONARY |
| " | 000 0000 0001 | ⇨ SECOND LINE OF AGREEMENT DICTIONARY |
| " | 000 0000 0010 | ⇨ THIRD LINE OF AGREEMENT DICTIONARY |
FIG.11(C)
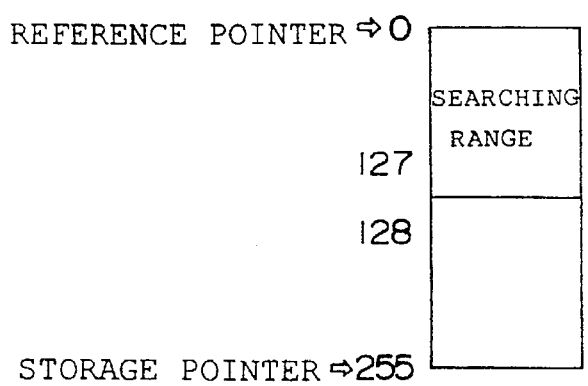

22B': EXTENDED DICTIONARY BUFFER

| RELATIVE POSITION | IDENTIFICATION CODE | POSITIONAL INFORMATION |
|---|---|---|
| 0 | 0 0 | 0 |
| 1 | 0 0 | 1 |
| 2 | 0 1 0 | 0 0 |
| 3 | 0 1 0 | 0 1 |
| 4 | 0 1 0 | 1 0 |
| 5 | 0 1 0 | 1 1 |
| 6 | 0 1 1 | 0 0 0 |
| 7 | 0 1 1 | 0 0 1 |
| 8 | 0 1 1 | 0 1 0 |
| 9 | 0 1 1 | 0 1 1 |
| 1 0 | 0 1 1 | 1 0 0 |
| 1 1 | 0 1 1 | 1 0 1 |
| 1 2 | 0 1 1 | 1 1 0 |
| 1 3 | 0 1 1 | 1 1 1 |
| 1 4 | 1 | 0 0 0 0 0 0 0 0 |
| 1 5 | 1 | 0 0 0 0 0 0 0 1 |

LEMPEL-ZIV COMPRESSION WITH EXPULSION OF DICTIONARY BUFFER MATCHES

BACKGROUND OF THE INVENTION

1. Field of the Invention

The present invention relates generally to a data processing apparatus and a data processing method, and more particularly to data processing method and apparatus in which pieces of input data are compared with pieces of dictionary data, a piece of dictionary data agreeing with a piece of input data is coded, and a piece of coded dictionary data agreeing with a piece of input data is decoded. Also, the present invention relates to data processing method and apparatus in which a piece of input is compressed according to a Huffman code method and a piece of compressed data is decoded according to the Huffman code method.

2. Description of the Prior Art

An information processing apparatus utilizing a storing apparatus such as a magnetic disk apparatus or the like in which a large volume of data is stored and a transmission apparatus for transmitting a large volume of data through a communication line have been recently in widespread use while the information processing apparatus is improved to have a high function and is used for various purposes. In an information processing field, a data compressing apparatus is therefore required to substantially increase a storage capacity of the storing apparatus in data storage and to substantially shorten a data transmission time in data transmission by processing a large volume of data in a high efficiency for the purpose of reducing an information processing cost required for a user.

A data compressing theory is first proposed by Mr. Claude Shannon, the Bell Telephone Laboratories in USA. He disclosed a concept "Entropy" of the data compressing in 1948. Also, the same theory is disclosed by Mr. R. M. Fano, the Massachusetts Institute of Technology in USA in the almost same period. Therefore, the data compressing theory is called a Shannon-Fano coding in general. In the Shannon-Fano coding, the higher an occurrence probability of a character, the smaller the number of bytes of a variable-length code allocated to the character. Therefore, each of pieces of data is compressed.

Thereafter, Mr. Huffman disclosed a variable-length code generating method in 1952 in a literature "A Method for the Construction of Minimum Redundancy Code", and a Huffman coding has been mainly utilized in place of the Shannon-Fano coding in a data compressing field. In the Huffman coding, the data compressing of pieces of data is performed by considering differences in occurrence frequency of characters.

Thereafter, another data compressing method in which a concept of a dictionary is used and a data compressing is performed by considering the repetition of each of character strings. The data compressing method is generally called a slide dictionary method or a Lempel-Ziv (LZ77) coding method. The data compressing method is disclosed in a literature: Lempel Abraham and Ziv Jacob, "A Universal Algorithm for Sequential Data Compression", IEEE Transaction on Information Theory, 1977. Therefore, a basic principle of a conventional compressing algorithm is classified into a data compressing represented by the Huffman coding method in which the data compressing is performed by considering the occurrence probability of each of characters and another data compressing represented by the Lempel-Ziv coding method in which the data compressing is performed by considering the repetition of each of character strings.

The Lempel-Ziv coding method is improved in a Lempel-Ziv-Storer-Szymanski (LZSS) coding method by adding two types of alternation to the Lempel-Ziv coding method. That is, Mr. Store and Mr. Szymanski disclosed in 1982 in a literature "Data Compression via Textual Substitution". In the LZSS coding method, functions in data search are improved.

2.1. First Previously Proposed Art

FIG. 1(A) is a constitutional view of a conventional data compressing apparatus according to a first previously proposed art, FIG. 1(B) explanatorily shows an arrangement view of pieces of dictionary data and pieces of input data in a data searching step, and FIG. 1(C) explanatorily shows another arrangement view of pieces of dictionary data and pieces of input data in a data expelling step. FIGS. 2(A), 2(B) and 2(C) explanatorily shows a coding processing in which the same piece of character string is undesirably duplicated in a dictionary buffer.

For example, as shown in FIG. 1(A), a data compressing apparatus to which the LZ77 coding method (or the sliding dictionary method) is applied is provided with an original data file 1, a data converting apparatus 2 and a compressed data file 3. The data converting apparatus 2 is provided with an input buffer 2A, a dictionary buffer 2B and a central processing apparatus (CPU) 2C.

As a data configuration according to the LZ77 coding method is shown in FIG. 1(B), a coded input data string is formed within a certain memory range and is stored in a dictionary buffer 2B. The dictionary data stored in the dictionary buffer 2B is transferred to the compressed data file 3 without remaining the stored dictionary data as dictionary contents obtained after the data compressing. To set the dictionary buffer 2B in an initial condition, there is a case that a piece of data matching with the data configuration are initially stored in the dictionary buffer 2B.

A functional operation of the data compressing apparatus is described.

A piece of original data read out from the original data file 1 is written in the input buffer 2A of the data converting apparatus 2 as an input data string Din. Thereafter, the input data string Din written in the input buffer 2A and a dictionary data string stored in the dictionary buffer 2B are compared with each other under the control of the CPU 2C to perform a data search. The dictionary data string is formed by storing pieces of input data transferred from the original data file 1. The data search is performed from a head position of the dictionary data string stored in the dictionary buffer 2B, and a longest agreement data string agreeing with a piece of input data is found out in the dictionary buffer 2B.

After the longest agreement data string agreeing with a piece of input data is found out as a result of the comparison under the control of the CPU 2C, the longest agreement data string is coded to compress the longest agreement data string and is stored in the compressed data file 3 as a piece of compressed data Dout.

Therefore, because an input data string previously coded is utilized as a dictionary data string, a longest agreement data string included in the dictionary data string and the input data string in common is found out, and the longest agreement data string can be coded according to the LZ77 coding method.

In detail, in the LZ77 coding method, a piece of input data which is included in the input data string stored in the input buffer 2A having a certain memory range and agrees with another piece of dictionary data included in the dictionary data string stored in the dictionary buffer 2B is found out and is called the longest agreement data string, and the input data is compressed. The longest agreement data string is specified by both an agreement starting position (that is, an agreement starting address or an offset) at which the agreement of the input data and the dictionary data is started in the dictionary buffer 2B and the input buffer 2A and a largest length (normally indicated by the number of bytes) from the agreement starting position to an agreement ending position at which the agreement of the input data and the dictionary data is ended. Thereafter, the input data of the input buffer 2A is transferred to the dictionary buffer 2B just after the input data agrees with the dictionary data.

For example, as shown in FIG. 1(B), a longest agreement data string "uimad" is specified by an agreement starting position indicated by "2" in the dictionary buffer 2B and a largest length equal to 5 bytes. In the input buffer 2A, a next character "f" subsequent to the longest agreement data string "uimad" exists. After the coding of a series of data string "uimad" is finished, as shown in FIG. 1(C), a piece of dictionary data "anuima" having 6 bytes which corresponds to a sum of 5 bytes in the longest agreement data string "uimad" and 1 byte in the next character "f" is expelled from a head portion of the dictionary buffer 2B in a next step. Thereafter, a piece of input data "uimadf" having 6 bytes in the input buffer 2A is transferred to the dictionary buffer 2B as a piece of dictionary data to store the data "uimadf" in the dictionary buffer 2B in place of the dictionary data "anuima" expelled. As a result, it seems that a window of the dictionary buffer 2B is outwardly moved to the right. Therefore, the LZ77 coding method is called the slide dictionary method.

2.2. Problems To Be Solved By The Invention

However, in the Lempel-Ziv coding method, after a data string is coded, a piece of dictionary data having the same byte number as that of the coded data string is expelled from a head portion of the dictionary buffer 2B in which many pieces of dictionary data are stored. Therefore, the same piece of dictionary data is undesirably stored in duplicate in the dictionary buffer 2B, and a piece of dictionary data which has previously agrees with a piece of input data is necessarily expelled from the dictionary buffer 2B. As a result, a data compressing efficiency is lowered.

Therefore, data processing method and apparatus in which a sliding method of a piece of dictionary data is modified not to merely expel a piece of dictionary data or a dictionary data string agreeing with a piece of input data or a piece of input data string from a head portion of the dictionary buffer 2B, the number of reference dictionaries is substantially increased, pieces of dictionary data are not stored in duplicate in the dictionary buffer 2B, the dictionary data or the dictionary data string expelled are efficiently utilized, and a data compressing efficiency is enhanced are desired.

In detail, as is described above, after the coding of a series of data string "uimad" is finished as shown in FIG. 1(B), a piece of dictionary data "anuima" having 6 bytes which corresponds to a sum of 5 bytes in the longest agreement data string "uimad" and 1 byte in the next character "f" is expelled from a head portion of the dictionary buffer 2B in a next step (the slide dictionary method of the LZ77 method). Therefore, there are following problems.

(1) There is a probability that the same piece of dictionary data is undesirably stored in duplicate in the dictionary buffer 2B and a data compressing efficiency is lowered. For example, as shown in FIG. 2(A), in case where a data string "abc" of the input buffer 2A agrees with that of the dictionary buffer 2B in a data searching condition in which the data string "abc" is not coded, as shown in FIG. 2(B), a piece of dictionary data "xyz" having 3 bytes which is equal to the number of bytes in the data string "abc" agreeing with that of the dictionary buffer 2B is unconditionally expelled from a head portion of the dictionary buffer 2B according to a modification type (that is, the slide dictionary method) of the LZ77 method. Therefore, as shown in FIG. 2(C), the data string "abc" remains in duplicate in the dictionary buffer 2B after the data string "abc" is coded.

(2) To increase a data compressing efficiency, it is applicable that a memory region of the dictionary buffer 2B be expanded to widen a searching range. However, when a size of the dictionary buffer 2B is increased, a searching time is considerably increased in general. Also, when a size of the dictionary buffer 2B is increased, it is required to lengthen a data length of a piece of positional information for a piece of data to be coded. In addition, even though a piece of dictionary data previously agreed with a piece of input data, the dictionary data is necessarily expelled from the dictionary buffer 2B.

2.3. Second Previously Proposed Art

FIG. 3(A) is a constitutional view of a first conventional data compressing apparatus according to a second previously proposed art, and FIG. 3(B) is a constitutional view of a second conventional data compressing apparatus according to the second previously proposed art. The first conventional data compressing apparatus shown in FIG. 3(A) is disclosed in a Published Unexamined Japanese Patent Application No. 123619 of 1992 (H2-123619), and the second conventional data compressing apparatus shown in FIG. 3(B) is disclosed in a Published Unexamined Japanese Patent Application No. 280517 of 1992 (H2-280517).

As shown in FIG. 3(A), a first conventional data compressing apparatus (hereinafter, called a first apparatus) obtained by modifying the Lempel-Ziv coding method is provided with a measuring means 11 for measuring an occurrence frequency of a piece of input data DIN, a converting means 12 for converting the input data DIN into a piece of converted data DT according to the occurrence frequency, and a coding means 13 for searching pieces of candidate data relating to the converted data DT one after another according to a dictionary searching list and outputting a reference numeral of a piece of candidate data as a piece of coded data DOUT.

An operation in the first apparatus is described. When an occurrence frequency of a piece of input data DIN is initially measured by the measuring means 11, the input data DIN is converted into a piece of converted data DT according to the occurrence frequency in the converting means 12. In this case, the higher the occurrence frequency of the input data DIN, the lower a value of a code indicating the converted data DT. Also, the lower the occurrence frequency of the input data DIN, the higher the value of the code indicating the converted data DT. Thereafter, pieces of candidate data relating to the converted data DT are searched one after another according to a dictionary searching list by the coding means 13, a piece of particular candidate data agreeing with the input data DIN is found out from the candidate data, and a reference numeral of the particular candidate data is output as a piece of coded data DOUT relating to the input data DIN. Therefore, the input data DIN can be coded to the coded data DOUT in the first apparatus.

Also, as shown in FIG. 3(B), a second conventional data compressing apparatus (hereinafter, called a second apparatus) obtained according to an arithmetic coding is provided with a self-organization coding section (hereinafter, called an SOR coding section) 14 having a searching and registering section 14A and a dictionary rearranging section 14B, a dictionary 15 for storing pieces of dictionary data(or character strings), a counter 16 for counting an occurrence frequency and an accumulated frequency of each of a plurality of character strings, and an arithmetic coding section 17 for arithmetic-coding an SOR code produced in the SOR coding section 14 and outputting a piece of multi-valued code data.

An operation in the second apparatus is described. The dictionary 15 is referred by the searching and registering section 14A of the SOR coding section 14 to recognize whether or not a character string to be compressed is registered in the dictionary 15. Thereafter, the character strings stored in the dictionary 15 are renewed according to a rule of a self-organization by the dictionary rearranging section 14B. That is, the character strings are rearranged on condition that a registration number of a character string is lowered as the occurrence frequency of the character string is increased. When a character string which is the same as that stored in the dictionary 15 is input to the SOR coding section 14, a registration number of the character string in the dictionary 15 is output to the arithmetic coding section 17 as an SOR code by the searching and registering section 14A. When a character string which is the same as that input to the SOR coding section 14 is not stored in the dictionary 15, the character string input to the SOR coding section 14 is registered in the dictionary 15 and is output to the arithmetic coding section 17 as an SOR code. In the arithmetic code section 17, the SOR code is arithmetic-coded to produce a piece of multi-valued code data. In this case, a value of a sign bit and other values of upper and lower bits in the multi-valued code data are determined according to count values of an occurrence frequency and an accumulated frequency of each of the character strings in the arithmetic coding section 17. Thereafter, the multi-valued code data obtained by coding the input character string is output.

2.4. Problems To Be Solved By The Invention

However, in the first apparatus, the pieces of candidate data relating to the converted data DT are searched one after another according to the dictionary searching list, the particular candidate data agreeing with the input data DIN is found out from the candidate data, and a reference numeral of the particular candidate data is output as a piece of coded data DOUT relating to the input data DIN. Therefore, even though the order of a plurality of input data strings is predicted to some extent, it is required to search the candidate data registered in a dictionary having a connected-list structure one after another according to the dictionary searching list.

For example, in case where a piece of input data indicating a sentence in which a word "and" is frequently used is input to the first apparatus, an alphabet "n" subsequent to an alphabet "a" occurs at a high probability. Also, an alphabet "u" subsequent to an alphabet "q" occurs at a high probability. However, even though the input data indicating the sentence in which the word "and" is frequently used is input to the first apparatus, it is required to search the pieces of candidate data relating to the converted data DT one after another. Therefore, there is a problem that a wasteful dictionary searching time and a wasteful data transmission time are required and the data processing cannot be performed at a high speed.

Also, in the second apparatus, when a character string which is the same as that stored in the dictionary 15 is input to the SOR coding section 14, a registration number of the character string in the dictionary 15 is output to the arithmetic coding section 17 as an SOR code, the SOR code is arithmetic-coded in the arithmetic coding section 17, and the multi-valued code data is output. Therefore, even though the order of a plurality of character strings input to the second apparatus is predicted, it is required to refer the dictionary 15 to recognize whether or not a character string which is the same as that input to the second apparatus is registered in the dictionary 15, and it is required to output a registration number of the character string to the arithmetic coding section 17 as an SOR code.

Therefore, there is a problem that the data processing cannot be performed at a high speed, in the same manner as in the first apparatus.

Here, in a data compressing apparatus disclosed in a Published Unexamined Japanese Patent Application No. 68219 of 1993 (H3-68219), the compressing is performed according to an occurrence frequency of each of pieces of input data by applying the Huffman coding. In this data compressing apparatus, an occurrence probability of each of single characters is calculated, and a variable-length code is allocated to each of the single characters. Therefore, because the ununiformity of occurrence frequencies of the single characters is used in this data compressing apparatus, even though the order of a plurality of character strings input to the second apparatus is predicted to some extent, it is required to calculate occurrence probabilities (or the occurrence frequencies) of the single characters. As a result, there is a problem that a compression efficiency for each of the data strings uniformly occurring cannot be heightened.

SUMMARY OF THE INVENTION

A first object of the present invention is to provide, with due consideration to the drawbacks of such a conventional data processing method and a conventional data processing apparatus, a data processing method and a data processing apparatus in which a sliding method of a piece of dictionary data is modified not to merely expel a piece of dictionary data or a dictionary data string agreeing with a piece of input data or a piece of input data string from a head position of a dictionary buffer, the number of reference dictionaries is substantially increased, pieces of dictionary data are not stored in duplicate in the dictionary buffer, the dictionary data or the dictionary data string expelled are efficiently utilized, and a data compressing efficiency is enhanced.

A second object of the present invention is to provide a data processing method and a data processing apparatus in which an occurrence probability of a piece of data subsequent to another piece of data to be compressed is predicted when the order of character strings can be predicted, the data processing is performed at a high speed, a piece of data occurring at a high probability is converted into a piece of compressed data having a small number of bytes, and the data compressing efficiency is enhanced.

As shown in FIG. 4, the first object is achieved by the provision of a data processing apparatus (called a first data processing apparatus), comprising:

a dictionary buffer 22B for storing one or more pieces of dictionary data or one or more dictionary data strings formed by utilizing pieces of input data to be compressed or a plurality of input data strings to be compressed; and a dictionary control means 24 for comparing the dictionary data or the dictionary data strings stored in the dictionary buffer 22B with the input data to be compressed or the input data strings to be compressed input one after another for the purpose of coding a piece of particular dictionary data or a particular dictionary data string which is included in the dictionary data or the dictionary data strings and agrees with one of the input data to be compressed or the input data strings to be compressed by comparing the dictionary data or the dictionary data strings with the input data to be compressed or the input data strings to be compressed or for the purpose of decoding a piece of particular coded compressed data, expelling the particular dictionary data or the particular dictionary data string from the dictionary buffer 22B in case where the particular dictionary data or the particular dictionary data string agrees with one of the input data to be compressed or the input data string to be compressed, placing the dictionary data or the dictionary data strings stored in a data writing range of the dictionary buffer 22B, from which the particular dictionary data or the particular dictionary data string is expelled, close together in a direction, and writing a piece of particular input data to be compressed or a particular input data string to be compressed agreeing with the particular dictionary data or the particular dictionary data string in the dictionary buffer 22B in which the dictionary data or the dictionary data strings of the data writing range are placed close together.

In the above configuration, an operation in the data processing apparatus is described with reference to FIG. 4.

In FIG. 4, a piece of input data to be compressed or an input data string is input to an input buffer 22A in a certain memory range, and one or more pieces of dictionary data or one or more dictionary data strings are written in the dictionary buffer 22B. Thereafter, the input data to be compressed or the input data string to be compressed is compared with the dictionary data or the dictionary data strings under the control of the dictionary control means 24. In case where the input data to be compressed or the input data string to be compressed agrees with one of the dictionary data or the dictionary data strings, a piece of particular dictionary data or a particular dictionary data string agreeing with the input data to be compressed or the input data string to be compressed is expelled from the dictionary buffer 22B under the control of the dictionary control means 24.

Thereafter, the dictionary data or the dictionary data strings stored in a data writing range of the dictionary buffer 22B, from which the particular dictionary data or the particular dictionary data string is expelled, are placed close together in a direction (for example, toward a heading position of the data writing range), and a piece of particular input data to be compressed or a particular input data string to be compressed agreeing with the particular dictionary data or the particular dictionary data string in the dictionary buffer 22B in which the dictionary data or the dictionary data strings of the data writing range are placed close together is written in the dictionary buffer 22B as a piece of new dictionary data or a dictionary data string (a first data processing method).

Therefore, because the particular dictionary data or the particular dictionary data string duplicating the particular input data to be compressed or the particular input data string is expelled from the data writing range of the dictionary buffer 22B to the outside, a piece of dictionary data or a dictionary data string not relating to the particular input data to be compressed or the particular input data string which is merely expelled from the head position of the dictionary buffer 2B in the first prior art is not merely expelled from the head position of the dictionary buffer 22B. That is, the duplicate storage of the particular dictionary data or the particular dictionary data string in the dictionary buffer 22B can be avoided.

Therefore, pieces of dictionary data or a plurality of dictionary data strings differing from each other can be always stored in the dictionary buffer 22B, the redundancy of the data storage in the dictionary buffer 22B is reduced as compared with the first prior art, and a data compressing efficiency can be heightened.

As shown in FIG. 4, it is preferred that the data processing apparatus (called a second data processing apparatus) further comprise an auxiliary dictionary buffer 22C for storing the particular dictionary data or the particular dictionary data string expelled from the dictionary buffer 22B.

According to the second data processing apparatus, because an auxiliary dictionary buffer 22C is additionally arranged and the particular dictionary data or the particular dictionary data string expelled from the dictionary buffer 22B is stored in the auxiliary dictionary buffer 22C, a piece of dictionary data or a dictionary data string which agreed with a piece of input data to be compressed or an input data string to be compressed in the past is stored in the auxiliary dictionary buffer 22C without changing a memory capacity of the dictionary buffer 22B. Therefore, the number of dictionary data or dictionary data strings to be referred can be substantially increased. In case where a piece of dictionary data or a dictionary data string required to be referred is not stored in the dictionary buffer 22B, the dictionary data or the dictionary data string stored in the auxiliary dictionary buffer 22C can be referred.

That is, as a processing flow chart is shown in FIG. 12, a piece of input data to be compressed or an input data string to be compressed can be compared with pieces of dictionary data or a plurality of dictionary data strings in the step P2 while referring one or more pieces of dictionary data or one or more dictionary data strings expelled from the dictionary buffer 22B. Therefore, a probability that a piece of input data or an input data string which is judged not to agree with any piece of dictionary data or any dictionary data string and is coded to a piece of no-compressed data having the same data length as that of the input data or the input data string originally filed without any compression is compressed can be enhanced (a second data processing method).

Therefore, the dictionary data or the dictionary data string expelled from the dictionary buffer 22B can be efficiently utilized, and a data compressing in a moving window utilizing the dictionary buffer 22B and the auxiliary dictionary buffer 22C together can be performed.

Also, as shown in FIG. 4, it is preferred that the data processing apparatus (called a third data processing apparatus) further comprise a fixed dictionary buffer 22D for storing one or more pieces of fixed data or one or more fixed data strings, which are selected from the input data to be compressed or the input data strings to be compressed and occur at a high occurring frequency as compared with the input data to be compressed or the input data strings to be compressed by examining the occurring frequency of each of the input data to be compressed or the input data strings to be compressed in advance, as pieces of dictionary data or a plurality of dictionary data strings.

According to the third data processing apparatus, because a fixed dictionary buffer 22D is additionally arranged and one or more pieces of fixed data or one or more fixed data strings, which are selected from the input data to be compressed or the input data strings to be compressed and occur at a high occurring frequency as compared with the input data to be compressed or the input data strings to be compressed by examining the occurring frequency of each of the input data to be compressed or the input data strings to be compressed in advance, are written in the fixed dictionary buffer 22D as pieces of dictionary data or a plurality of dictionary data strings, the dictionary data or the dictionary data strings registered in the fixed dictionary buffer 22D because of a high occurring frequency is compared with a piece of fixed data or a fixed data string among the input data to be compressed or the input data strings to be compressed. Therefore, a data searching speed can be heightened.

That is, as a processing flow chart is shown in FIG. 14(B), a piece of input data to be compressed or an input data string to be compressed can be compared with the dictionary data or the dictionary data strings while referring pieces of fixed data or a plurality of fixed data strings which are selected from pieces of input data to be compressed or pieces of input data strings to be compressed and occur at a high occurring frequency as compared with the input data to be compressed or the input data strings to be compressed by examining the occurring frequency of each of the input data to be compressed or the input data strings to be compressed in advance (a third data processing method according to the present invention).

Therefore, because a data search can be heightened as compared with the first prior art, a data compressing speed can be heightened.

Also, as shown in FIG. 15(A), it is preferred that the dictionary buffer 22B of the data processing apparatus (called a fourth data processing apparatus) comprise a memory region formed in a ring-shaped structure by connecting ends of the memory region in a non-ending loop shape, the particular input data to be compressed or the particular data string to be compressed being written in the memory region as a piece of dictionary data or a dictionary data string.

According to the fourth data processing apparatus, because a memory region of the dictionary buffer 22B is formed in a ring-shaped structure, the input data or the input data string previously coded can be written in the memory region connected in a non-ending loop shape as a piece of dictionary data or a dictionary data string. Therefore, the number of pieces of dictionary data or dictionary data strings to be referred can be substantially increased.

By using the memory region connected in a non-ending loop shape, a longest agreement portion with a successive portion of the input data or the input data string is found out from the dictionary data or the dictionary data strings, and a piece of agreement information indicating the longest agreement portion can be coded. Therefore, a piece of dictionary data or a dictionary data string corresponding to the longest agreement portion can be compressed by using a moving window in which the dictionary buffer 22B of the first data compressing apparatus is expanded.

The first object is also achieved by the provision of a data processing method (called a first data processing method), comprising the steps of:

comparing one or more pieces of dictionary data or one or more dictionary data strings with one or more pieces of input data to be compressed or one or more input data strings to be compressed input one after another in a step P3 of a processing flow chart shown in FIG. 8 for the purpose of coding a piece of particular dictionary data or a particular dictionary data string agreeing with one of the input data to be compressed or the input data strings to be compressed by comparing the dictionary data or the dictionary data strings with the input data to be compressed or the input data strings to be compressed or a piece of coded compressed data is decoded;

expelling the particular dictionary data or the particular dictionary data string from a data writing range of a dictionary in a step P8 in case where the particular dictionary data or the particular dictionary data string agrees with one of the input data to be compressed or the input data string to be compressed;

placing the dictionary data or the dictionary data strings stored in the data writing range of the dictionary, from which the particular dictionary data or the particular dictionary data string is expelled, close together in a direction; and writing a piece of particular input data to be compressed or a particular input data string to be compressed agreeing with the particular dictionary data or the particular dictionary data string in the dictionary in which the dictionary data or the dictionary data strings of the data writing range are placed close together.

It is preferred that the data processing method (called a second data processing method) further comprise the step of referring the particular dictionary data or the particular dictionary data string expelled from the dictionary in a step P2 of the processing flow chart shown in FIG. 12 in the step of comparing one or more pieces of dictionary data or one or more dictionary data strings with one or more pieces of input data to be compressed or one or more input data strings to be compressed.

Also, it is preferred that the data processing method (called a third data processing method) further comprise the step of referring one or more pieces of fixed data or one or more fixed data strings, which are selected from the input data to be compressed or the input data strings to be compressed and occur at a high occurring frequency as compared with the input data to be compressed or the input data strings to be compressed by examining the occurring frequency of each of the input data to be compressed or the input data strings to be compressed in advance, in a step P3 of a processing flow chart shown in FIG. 14(B) in the step of comparing one or more pieces of dictionary data or one or more dictionary data strings with one or more pieces of input data to be compressed or one or more input data strings to be compressed.

Also, as shown in FIG. 16(B), it is preferred that the data processing method (called a fourth data processing method) further comprise the step of regarding the particular input data to be compressed or the particular input data string to be compressed written in an input memory region subsequent to a dictionary memory region of the dictionary, in which the dictionary data or the dictionary data strings are written, as a piece of dictionary data or a dictionary data string in the step of comparing one or more pieces of dictionary data or one or more dictionary data strings with one or more pieces of input data to be compressed or one or more input data strings to be compressed.

According to the fourth data processing method, as shown in FIG. 16(B), the particular input data to be compressed or the particular input data string to be compressed written in an input memory region subsequent to a dictionary memory region of the dictionary is regarded as a piece of dictionary data or a dictionary data string. Therefore, the number of pieces of dictionary data or dictionary data strings to be referred can be substantially increased. That is, the dictionary data or the dictionary data strings are expanded to the input memory region, and a piece of input data or an input data string agreeing with a piece of dictionary data or a dictionary data string can be found out.

Therefore, pieces of input data to be compressed or a plurality of input data string to be compressed can be compared with each other, a data search can be performed in a higher speed as compared with the first prior art, and a data compressing can be performed in a high speed.

FIG. 5 is a block diagram showing a principle view of a data compressing apparatus according to the present invention.

The second object is, as shown in FIG. 5, achieved by the provision of a data compressing apparatus (called a sixth data compressing apparatus) comprises;

a data producing means 31 for counting an occurrence frequency of each of types of pieces of input data to be compressed and producing an occurrence frequency table formed of a plurality of occurrence frequencies of the types of the input data to be compressed;

a data predicting means 32 for predicting an occurrence of a piece of next input data input to the data producing means 31 subsequent to a piece of input data of which a type is just counted by the data producing means 31; and a data converting means 33 for converting the types of pieces of input data according to the occurrence prediction of the next input data in the data predicting means 32 on condition that a type of a piece of input data is converted into a piece of compressed data having a shorter bit length as an occurrence probability of the type of the input data is higher and on condition that a type of a piece of input data is converted into a piece of compressed data having a longer bit length as an occurrence probability of the type of the input data is lower.

In the above configuration, an operation of the sixth data processing apparatus according to the present invention is described with reference to FIG. 5.

As shown in FIG. 5, in the data producing means 31, an occurrence frequency of all pieces of input data DIN to be compressed or a piece of input data DIN to be compressed is initially measured for each of types of the input data DIN, and an occurrence frequency table formed of a plurality of occurrence frequencies of the types of the input data is produced. Thereafter, the occurrence frequency table produced in the data producing means 31 is referred by the data predicting means 32, and an occurrence of a piece of next input data subsequent to the input data DIN to be compressed is predicted by the data predicting means 32. To be concrete, each of the occurrence frequencies written in the occurrence frequency table is compared with the next data subsequent to the input data DIN to be compressed in the occurrence prediction.

In this case, according to the occurrence prediction of the next data in the data predicting means, the input data is converted into a piece of compressed data having a shorter bit length as an occurrence probability of the input data is higher, and the input data is converted into a piece of compressed data having a longer bit length as an occurrence probability of the input data is lower. For example, pieces of data of the occurrence frequencies arranged in the occurrence frequency table are rearranged in order of degree of occurrence frequency, a plurality of data positions ranging from a highest data position for a piece of data of a highest occurrence frequency to a lowest data position for a piece of data of a lowest occurrence frequency are defined in the occurrence frequency table, a piece of shorter positional information having a shorter bit length is allocated to a data position in which a piece of data of an occurrence frequency is arranged as the occurrence frequency is higher, a piece of longer positional information having a longer bit length is allocated to a data position in which a piece of data of an occurrence frequency is arranged as the occurrence frequency is lower, and a code table obtained by allocating the pieces of positional information to the data positions in the occurrence frequency table is referred by the data converting means 33.

Accordingly, because the code table is referred, in case where the order of a plurality of character strings which each correspond to one of the input data can be predicted, data compressing efficiencies for pieces of input data uniformly occurring can be enhanced as compared with the Huffman coding method in which an occurrence probability of each of characters is calculated. Therefore, a data compressing operation can be performed while predicting the occurrence of objective characters or objective character strings placed in the front and rear sides of a piece of input data to be compressed, a dictionary searching time and a data transmission time can be reduced, and a data processing operation can be performed at a high speed.

It is preferred that the occurrence frequency table be renewed by the data producing means 31 each time a piece of input data to be compressed is input to the data producing means 31 in the data processing apparatus (called a seventh data processing apparatus).

According to the seventh data processing apparatus, because the occurrence frequency table is renewed by the data producing means 31 each time a piece of input data to be compressed is input to the data producing means 31, one or more pieces of compressed data can be rewritten at a short time in the data converting means 33 after the occurrence frequency table is renewed by the data producing means 31, and the code table can be dynamically reconstructed (a sixth data processing method).

Also, the code table can be renewed by rearranging a part of the pieces of positional information and a part of identification codes without rearranging all of the compressed data even though the occurrence frequency table is renewed, it is not required to include the code table in the compressed data, and a data compressing efficiency can be improved. Therefore, in case where a data compressing function is given to an objective apparatus in which a memory capacity is limited, a piece of input data to be compressed can be dynamically coded to a piece of compressed data corresponding to one byte or one character.

Also, it is preferred that the data processing apparatus (called an eighth data processing apparatus) further comprise a level adjusting means 34 for adjusting a length of each of the compressed data converted by the data converting means 33.

According to the eighth data processing apparatus, after a piece of input data is converted into a piece of compressed data, a length of the compressed data is adjusted by the level adjusting means 34. Therefore, an offset coding for reconstructing pieces of compressed data can be performed by dynamically level-adjusting the lengths of the compressed data according to the types of the input data (an eighth data processing method).

That is, types of the input data to be compressed are one-sided in dependence on the types of the input data. Therefore, there is a case that the prediction of an occurrence of a piece of input data becomes difficult in case where the occurrence frequencies are closely distributed around an average occurrence frequency or in case where the number of occurrence frequencies for the input data is not sufficient.

However, in case where a tendency of the distribution of the occurrence frequencies is definite, each of the input data can be converted into a piece of compressed data having a shorter bit length by performing the offset coding. Also, in case where the distribution of the occurrence frequencies is one-sided, each of the input data can be converted into a piece of compressed data having a shorter bit length by increasing a level adjustment according to the offset coding.

Therefore, a data compressing efficiency can be enhanced.

In case where an occurrence probability of each type of pieces of input data is grasped in advance, when types of the input data having high occurrence frequencies are preset in upper portions of a memory to which pieces of shorter positional information are allocated, the input data having high occurrence frequencies can be converted into the pieces of shorter positional information at a high probability.

Also, it is preferred that the occurrence frequency table be produced by the data producing means 31 of each of the fifth, sixth and seventh data processing apparatuses by fetching all pieces of input data to be compressed or a piece of input data to be compressed.

Also, it is preferred that pieces of data of the occurrence frequencies arranged in the occurrence frequency table be rearranged in order of degree of occurrence frequency in the data producing means 31, a plurality of data positions ranging from a highest data position for a piece of data of a highest occurrence frequency to a lowest data position for a piece of data of a lowest occurrence frequency be defined in the occurrence frequency table, a piece of shorter positional information be allocated to a data position in which a piece of data of an occurrence frequency is arranged as the occurrence frequency is higher, a piece of longer positional information be allocated to a data position in which a piece of data of an occurrence frequency is arranged as the occurrence frequency is lower, and a code table obtained by allocating the pieces of positional information to the data positions in the occurrence frequency table be referred by the data converting means 33.

As a processing flow chart is shown in FIG. 6, the second object is also achieved by the provision of a data processing method (called a sixth data processing method), comprising the steps of:

counting an occurrence frequency of each of types of pieces of input data to be compressed in advance and producing an occurrence frequency table formed of a plurality of occurrence frequencies of the types of the input data to be compressed in a step P1;

predicting an occurrence of a piece of next input data subsequent to a piece of input data to be compressed in a step P2 while referring the occurrence frequency table produced; and converting the types of pieces of input data according to the occurrence prediction of the next input data in a step P3 on condition that a type of a piece of input data is converted into a piece of compressed data having a shorter bit length as an occurrence probability of the type of the input data is higher and on condition that a type of a piece of input data is converted into a piece of compressed data having a longer bit length as an occurrence probability of the type of the input data is lower.

In the above steps of the sixth data processing method, as shown in FIG. 6, because an occurrence frequency of each of types of pieces of input data to be compressed is counted in advance and an occurrence frequency table formed of a plurality of occurrence frequencies of the types of the input data to be compressed is produced in the step P1, a connecting condition of objective characters or objective character strings placed in the head and rear sides of a piece of input data can be grasped. For example, in case of a piece of input data in which a word "and" frequently occurs, a character "n" occurs at a high occurrence frequency as a next character subsequent to a character "a", and a character "u" occurs at a high occurrence frequency as a next character subsequent to a character "q". Therefore, the connecting condition of the objective characters "a" and "n" or "q" and "u" or the objective character strings in the input data can be grasped.

Also, because an occurrence of a piece of next input data subsequent to a piece of input data DIN to be compressed is predicted in the step P2 while referring the occurrence frequency table produced, a next character "n" occurring after the occurrence of a character "a" in the word "and" or a next character "u" occurring after the occurrence of a character "q" can be predicted.

Also, as an occurrence probability of a type of a piece of input data DIN is higher, the type of the input data DIN is converted into a piece of compressed data having a shorter bit length while referring the code table. Also, as an occurrence probability of a type of a piece of input data DIN is lower, the type of the input data DIN is converted into a piece of compressed data having a longer bit length while referring the code table. Therefore, a piece of compressed data DOUT composed of a piece of positional information and an identification code can be directly output from the code table.

Accordingly, a concept of a dictionary search disappears by predicting an occurrence of a character or a character string. In particular, in case of a piece of input data in which the order of characters or character strings can be predicted, a dictionary searching time and a data transmission time are reduced, and a data processing operation can be performed at a high speed. It is preferred that the step of converting the types of pieces of input data comprise the steps of:

rearranging pieces of data of the occurrence frequencies arranged in the occurrence frequency table in order of degree of occurrence frequency;

defining a plurality of data positions ranging from a highest data position for a piece of data of a highest occurrence frequency to a lowest data position for a piece of data of a lowest occurrence frequency in the occurrence frequency table;

allocating a pieces of shorter positional information to a data position in which a piece of data of an occurrence frequency is arranged as the occurrence frequency is higher;

allocating a piece of longer positional information to a data position in which a piece of data of an occurrence frequency is arranged as the occurrence frequency is lower; and referring a code table obtained by allocating the pieces of positional information to the data positions in the occurrence frequency table.

Also, it is preferred that the step of counting an occurrence frequency comprise the step of renewing the occurrence frequency table and the code table each time a piece of input data to be compressed is input (called a seventh data processing method).

Also, it is preferred that the step of converting the types of pieces of input data comprise the step of adjusting a bit length of the compressed data in a step P4 of a processing flow chart shown in FIG. 6 after the input data to be compressed is converted into the compressed data (called an eighth data processing method).

Also, it is preferred in the sixth, seventh and eighth data processing methods that the step of counting an occurrence frequency comprise the step of producing the occurrence frequency table according to all pieces of input data to be compressed or a piece of input data to be compressed.

Also, it is preferred in the sixth, seventh and eighth data processing methods that the step of predicting an occurrence of a piece of next input data comprise the step of comparing pieces of data of the occurrence frequencies written in the occurrence frequency table with a piece of next input data subsequent to a piece of input data to be compressed to predict the occurrence of the next input data subsequent to the input data.

Also, it is preferred in the sixth, seventh and eighth data processing methods that the step of converting the types of pieces of input data comprise the steps of:

defining pieces of positional information indicating a plurality of data positions ranging from a highest data position for a piece of data of a highest occurrence frequency to a lowest data position for a piece of data of a lowest occurrence frequency in the occurrence frequency table;

defining an identification code for identifying the pieces of positional information; and making each of the compressed data by combining one of the pieces of positional information and the identification code.

BRIEF DESCRIPTION OF THE DRAWINGS

FIG. 9(A) shows two data formats of two pieces of compressed data in which a piece of positional information is added;

FIG. 9(B) shows a coding tree utilized to form the compressed data;

FIG. 9(C) shows a relationship between a length of the compressed data and a bit string;

FIG. 11(A) is an explanatory view of an agreement dictionary buffer arranged in a second data processing apparatus according to a second embodiment of the present invention;

FIG. 11(B) shows a plurality of data formats of pieces of compressed data in which a piece of positional information is added to each of the compressed data in case where a memory capacity of the agreement dictionary buffer is 2 KB;

FIG. 11(C) is an explanatory view showing a searching range of the agreement data in an agreement dictionary buffer;

FIG. 14(C) is a flow chart showing the reference of the fixed dictionary in a data reproducing (or decoding) operation performed according to a third data processing method;

DETAILED DESCRIPTION OF THE EMBODIMENTS

A data processing apparatus and a data processing method according to each of a plurality of embodiments of the present invention is described with reference to drawings. FIGS. 4, and 7 to 16 are respectively an explanatory view of a data processing apparatus or method in which the first object is solved, and FIGS. 17 to 25 are respectively an explanatory view of a data processing apparatus or method in which the second object is solved.

Figure 4:
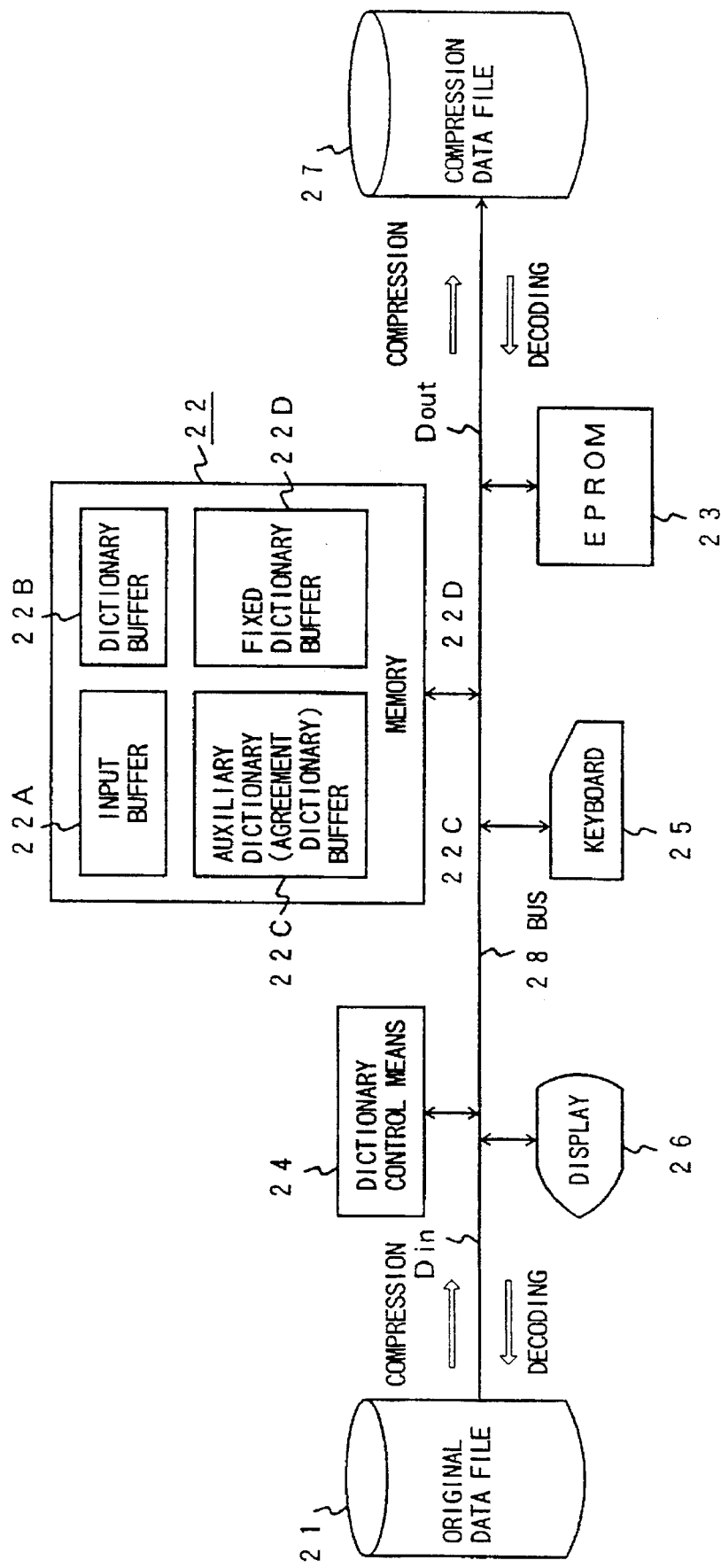
FIG. 4 is a constitutional view of a data processing apparatus representing a data compressing apparatus and a data reproducing apparatus according to a plurality of embodiments of the present invention.
Figure 5:
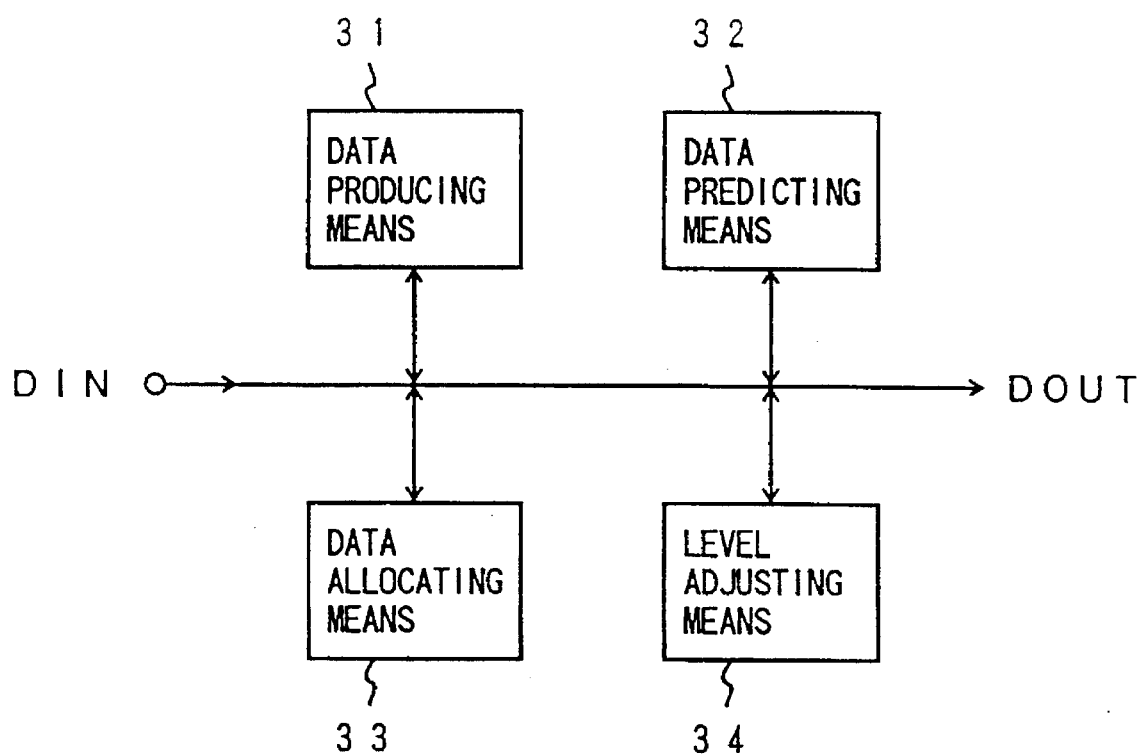
FIG. 5 is a block diagram showing a principle view of another data processing apparatus representing a data compressing apparatus and a data reproducing apparatus according to the present invention.
Figure 6:
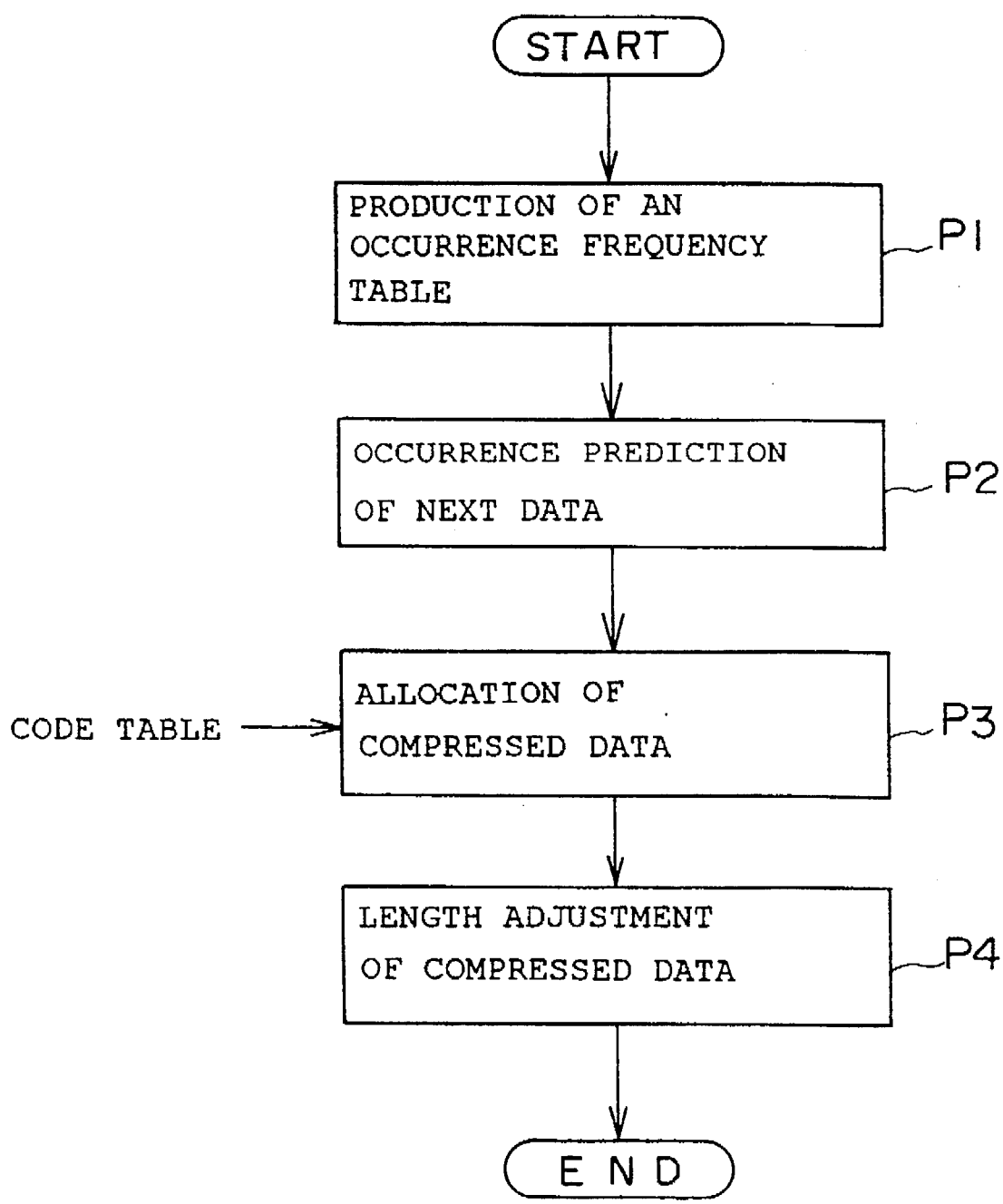
FIG. 6 is a flow chart showing a principle of a data compressing method according to the present invention.
Figure 7A:
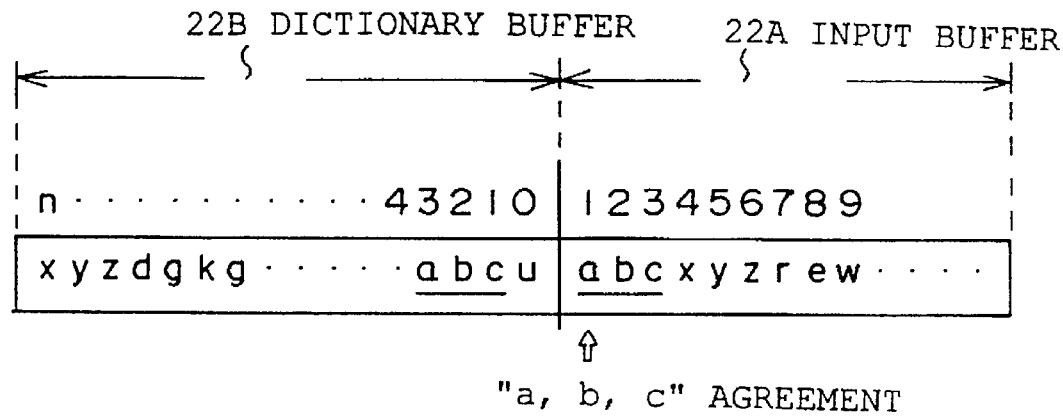
FIG. 7(A) is an explanatory view of the data search of pieces of data in a dictionary buffer and an input buffer performed for a data compression according to a first embodiment of the present invention.
Figure 7B:
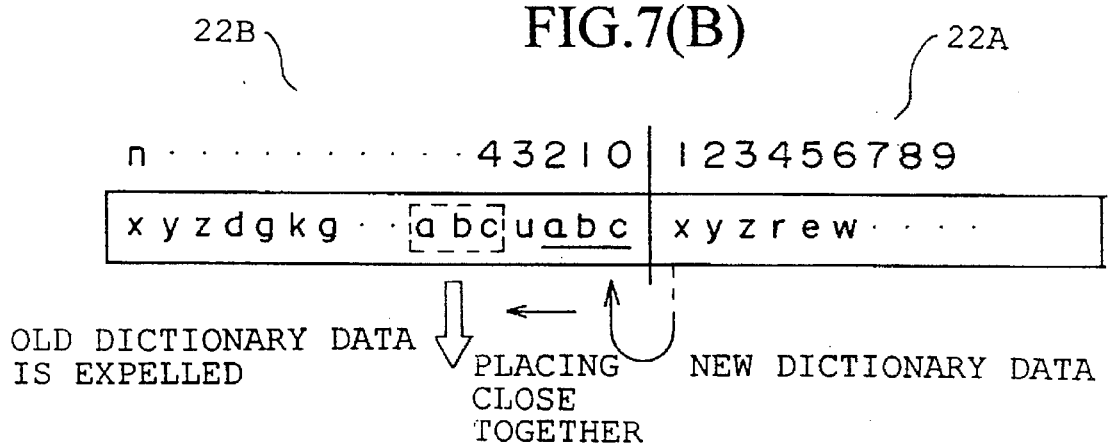
FIG. 7(B) is an explanatory view showing a piece of particular dictionary data expelled and a piece of particular input data written in the dictionary buffer.
Figure 7C:
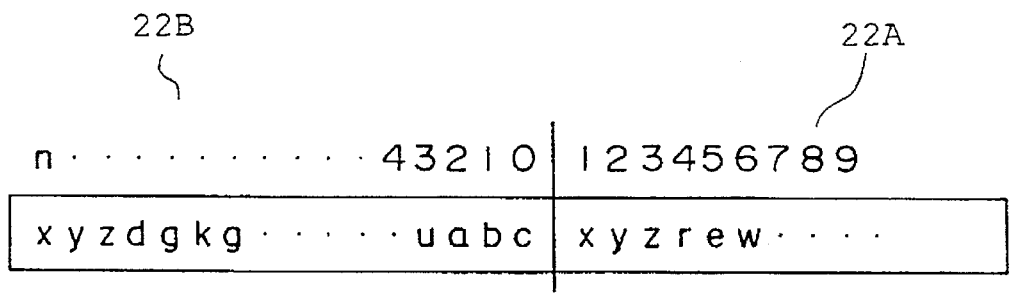
FIG. 7(C) is an explanatory view of the dictionary buffer and the input buffer after the data search.
Figure 8:
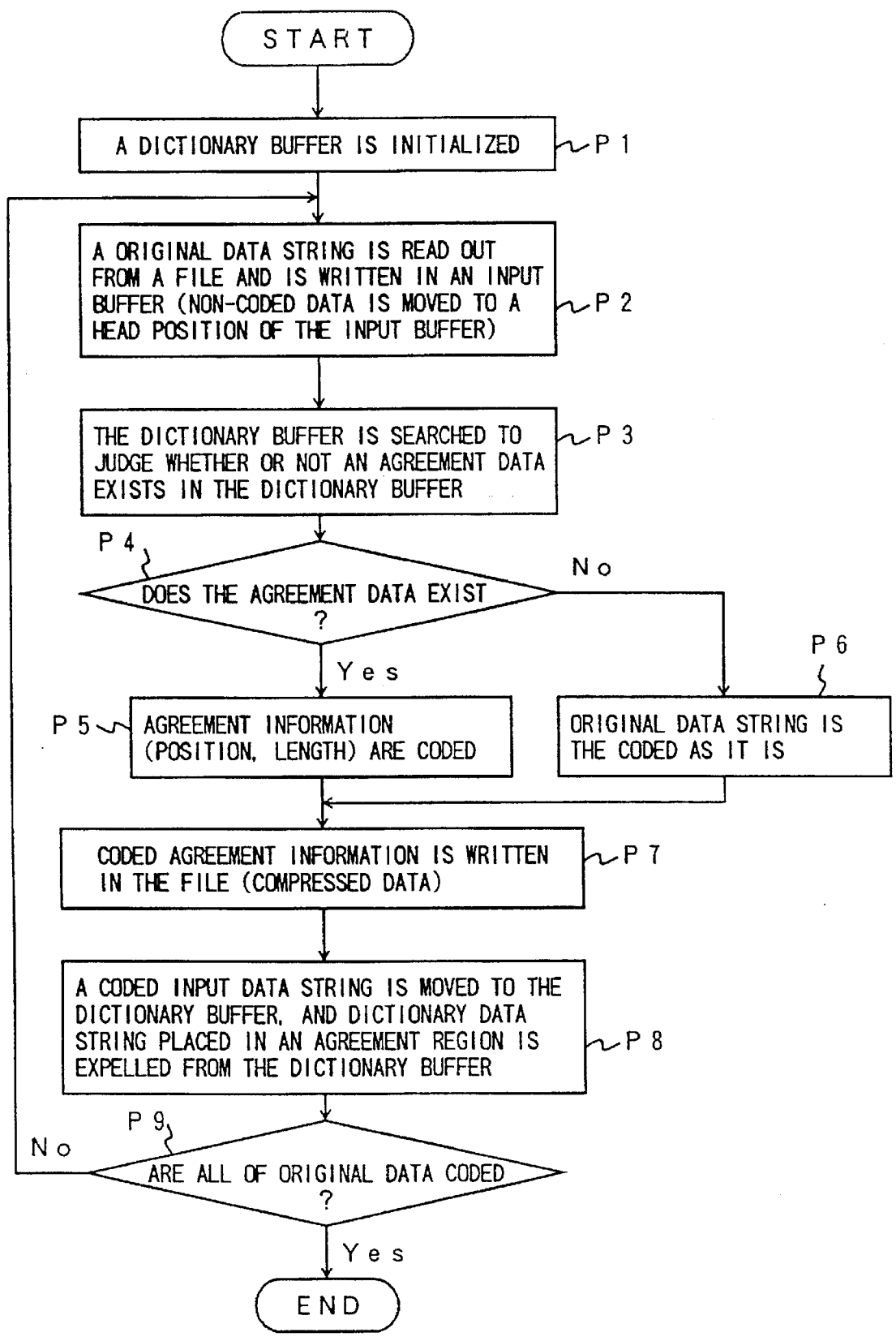
FIG. 8 is a flow chart showing the data compression according to the first embodiment of the present invention.
Figure 10:
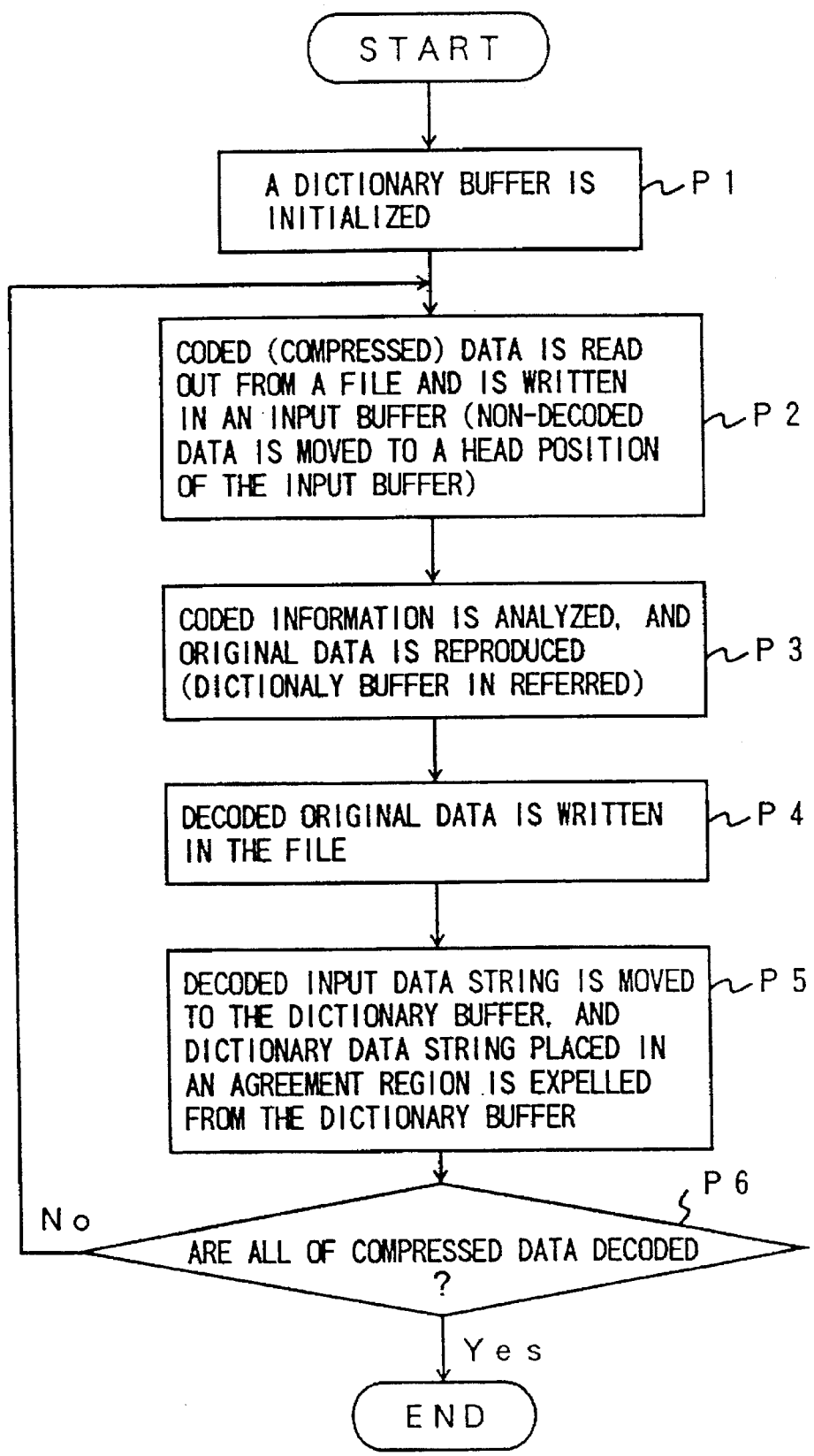
FIG. 10 is a flow chart showing a data reproduction performed according to the first embodiment.

FIG. 4 is a constitutional view of a data processing apparatus representing a data compressing apparatus and a data reproducing apparatus according to a plurality of embodiments of the present invention. FIGS. 7(A) to 7(C) are explanatory views of a dictionary buffer and an input buffer shown in FIG. 4 in case of a data compression according to a first embodiment of the present invention. FIG. 8 is a flow chart showing the data compression according to a first embodiment of the present invention. FIGS. 9(A) to 9(C) are explanatory views of a coding processing performed for a piece of agreement data in case of a data compression according to each of the embodiments. FIG. 10 is a flow chart showing a data reproduction.

For example, as shown in FIG. 4, a data processing apparatus corresponding to first, second and third data processing apparatuses according to the present invention comprises an original data file 21, a memory 22, an electrically programmable read only memory (EPROM) 23, a dictionary control means (hereinafter, called a CPU) 24, a keyboard 25, a display 26, and a compressed data file 27. The original data file 21 a memory for storing pieces of original data in case of a data compression or a data reproduction. A magnetic disk apparatus or a semiconductor memory apparatus is used for the original data file 21. The memory 22 is used to temporarily store pieces of dictionary data and pieces of input data to be compressed in case of the data compression. For example, the memory 22 is composed of an input buffer 22A, a dictionary buffer 22B, an auxiliary dictionary buffer 22C and a fixed dictionary buffer 22D. A random access writable and readable memory is used for the memory 22.

In the input buffer 22A, pieces of input data to be compressed are temporarily stored. In the dictionary buffer 22B, pieces of dictionary data formed by using the input data to be compressed are stored. In the auxiliary dictionary buffer (hereinafter, also called an agreement dictionary buffer) 22C, one or more pieces of dictionary data or one or more dictionary data strings expelled from the dictionary buffer 22B are stored. The agreement dictionary buffer 22C is used in a second embodiment of the present invention (the second data processing apparatus). In the fixed dictionary buffer 22D, one or more pieces of fixed data or one or more fixed data strings respectively having a high occurrence frequency are written as pieces of dictionary data. The fixed data or the fixed data string are selected from the input data to be compressed by examining occurrence frequencies of the input data in advance. The fixed dictionary buffer 22D is used in a third embodiment of the present invention (the third data processing apparatus). In case of the data reproduction, the dictionary data or the dictionary data string and one or more pieces of data to be reproduced or one or more data strings to be reproduced are temporarily stored in the memory 22.

The EPROM 23 is a programmable read only memory for storing a control algorithm used in each of the embodiments. For example, in the first embodiment, a data compressing algorithm shown in FIG. 8 and a data reproducing algorithm shown in FIG. 10 are stored. In the second embodiment, an agreement dictionary producing algorithm shown in FIG. 12 and a data reproducing algorithm shown in FIG. 13 are stored. In the third embodiment, a data compressing algorithm shown in FIG. 14(B) and a data reproducing algorithm shown in FIG. 14(C) are stored. Concrete contents of each of the control algorithms are described in each of the embodiments.

The CPU 24 is an example of the dictionary control means, and input and output operations in the input buffer 22A, the dictionary buffer 22A, the auxiliary dictionary buffer 22C and the fixed dictionary buffer 22D are performed under the control of the CPU 24. For example, the dictionary data or the dictionary data strings stored in the dictionary buffer 22B are compared with pieces of input data to be compressed or a plurality of input data strings to be compressed input to the input buffer 22A one after another under the control of the CPU 24. Thereafter, as a result of the comparison, when a piece of particular dictionary data or a particular dictionary data string among the dictionary data or the dictionary data strings agrees with a piece of particular input data to be compressed or a particular input data string to be compressed among the input data to be compressed or the input data strings to be compressed, the particular dictionary data or the particular dictionary data string is expelled from the dictionary buffer 22B. Thereafter, the dictionary data or the dictionary data strings stored in a data writing range of the dictionary buffer 22B from which the particular dictionary data or the particular dictionary data string is expelled are placed close together in a direction under the control of the CPU 24, and the particular input data to be compressed or the particular input data string is written in the dictionary buffer 22B as a piece of new dictionary data or a new dictionary data string under the control of the CPU 24.

The keyboard 25 is a tool for inputting a piece of fixed data occurring at a high frequency while changing the fixed data to a control sentence. The display 16 is a tool for helping the keyboard 25 and the CPU 24 to perform the input/output operations. The compressed data file 27 is a memory for storing pieces of compressed data in case of the data compression and the data reproduction. A magnetic disk apparatus or a semiconductor memory apparatus is used for the compressed data file 27 in the same manner as in the original data file 21.

In the above configuration of the data processing apparatus representing a data compressing apparatus and a data reproducing apparatus, in case of a coding operation in the data compressing apparatus, pieces of dictionary data or a plurality of dictionary data strings formed by utilizing pieces of input data to be compressed are compared with pieces of input data to be compressed or a plurality of input data strings to be compressed input one after another, and a piece of particular dictionary data or a particular dictionary data string agreeing with a piece of particular input data to be compressed or a particular input data string to be compressed is expelled and coded to produce a piece of compressed data. In contrast, in case of a decoding operation in the data reproducing apparatus, pieces of dictionary data or a plurality of dictionary data strings formed by utilizing pieces of input data (that is, pieces of compressed data) to be decoded are compared with pieces of input data to be decoded or a plurality of input data strings to be decoded input one after another, and a piece of coded compressed data is decoded.

(1) Description of a first embodiment

Next, a first data compressing method performed in a first data processing apparatus representing a first data compressing apparatus and a first data reproducing (or decoding) apparatus according to a first embodiment of the present invention is described with reference to a processing flow chart shown in FIG. 8 to describe an operation performed in the first data compressing apparatus or the first data reproducing apparatus.

A first data compressing method shown in FIG. 8 is performed according to the control algorithm stored in the EPROM 23. For example, in case where the dictionary data or the dictionary data strings formed by utilizing the input data to be compressed are compared with pieces of input data to be compressed or a plurality of input data strings to be compressed input one after another and a piece of particular dictionary data or a particular dictionary data string agreeing with a piece of particular input data to be compressed or a particular input data string to be compressed is coded, the dictionary buffer 22B is initialized in a step P1 in the flow chart shown in FIG. 8. Therefore, pieces of data stored in the dictionary buffer 22B are set to zero.

Thereafter, an original data string is read out from the original data file 21 and is stored in the input buffer 22A in a step P2. In this case, a piece of non-coded data is moved to a head position of the input buffer 22A. For example, as shown in FIG. 7(A), a piece of input data to be compressed DIN {a,b,c,x,y,z,r,e,w, - - - } is input to the input buffer 22A. The input data DIN has a several byte length. Thereafter, the input data DIN is shifted from the input buffer 22A to the dictionary buffer 22B. As a result, a piece of dictionary data {x,y,z,d,g,k,g, - - - ,a,b,c,u} is written in the dictionary buffer 22B. The dictionary data has an n byte length.

Thereafter, the dictionary buffer 22B is searched in a step P3 to judge whether or not a dictionary data string agreeing with an input data string to be compressed exists in the dictionary buffer 22B. For example, a dictionary data string {a,b,c} stored in the dictionary buffer 22B is compared with an input data string to be compressed {a,b,c} stored in the input buffer 22A under the control of the CPU 24. Thereafter, it is judged in a step P4 whether or not the dictionary data string agrees with the input data string to be compressed. In this case, when an agreement data string exists (YES), the procedure proceeds to a step P5. Also, when any agreement data string does not exist (NO), the procedure proceeds to a step P6, the original data string is coded as it is, and the procedure proceeds to a step P7.

In the step P4, because the dictionary data string {a,b,c} agrees with the input data string to be compressed (a,b,c), it is judged that an agreement data string exists, and a piece of agreement information is coded in a step P5. To be concrete, a piece of positional information of the agreement data string and a piece of length information of the agreement data string are coded to produce a positional code and a length code. The coding operation is described later with reference to FIG. 9 in detail. Thereafter, the coded compressed data obtained by coding the dictionary data string is stored in the compressed data file 27 in a step P7.

Thereafter, a piece of coded input data string is moved to the dictionary buffer 22B in a step P8. In this case, under the control of the CPU 24, the dictionary data string {a,b,c} placed in an agreement region (or a duplication region) is expelled from the data writing range of the dictionary buffer 22B, and a dictionary data string still stored in the data writing range of the dictionary buffer 22B from which the dictionary data string {a,b,c} is expelled are placed close together in a heading direction. To be concrete, as shown in FIG. 7(A), a dictionary data string placed at the right side of a storing position "0" is shifted to the left.

Thereafter, as shown in FIG. 7(B), the input data string to be compressed {a,b,c} agreeing with the dictionary data string {a,b,c} is read out from the input buffer 22A and is written in the dictionary buffer 22B in which the dictionary data string of the data writing range is placed close together. In this case, as shown in FIG. 7(C), characters {x,y,z} stored in a had position of the dictionary buffer 22B remains as it is as a piece of dictionary data, and the input data string to be compressed {a,b,c} read out from the input buffer 22A is stored in the most rear position of the dictionary buffer 22B as a piece of new dictionary data. The remaining of the characters {x,y,z} differs from the first prior art. As a result, the head data string {x,y,z} is not expelled and is used as a piece of dictionary data in a following data compression.

Thereafter, it is judged in a step P9 whether or not all of a plurality of original data strings stored in the original data file 21 are compressed. In case where all of the original data strings are compressed (YES), the control algorithm according to the first embodiment is finished. Also, in case where all of the original data strings are not compressed (NO), the procedure returns to the step P2, another original data string is read out from the original data file 21 and is written in the input buffer 22A, and the steps P3 to P9 are repeatedly performed.

Accordingly, an agreement data string obtained by comparing the dictionary data string formed by using the input data to be compressed with pieces of input data to be compressed input one after another can be coded.

A coding method is concretely described. In the first embodiment of the present invention, the LZSS coding method is improved to increase a data compression efficiency. Here, the data compression efficiency is defined as a ratio of an original data capacity to a compressed data capacity and is expressed by (original data capacity)/(compressed data capacity) v 100%.

When the agreement data found out according to the first embodiment of the present invention is converted into a piece of compressed data, a piece of positional information of the agreement data found out and a piece of length information of the agreement data found out are used. In general, a piece of dictionary data placed at the most rear position of the dictionary buffer 22B often agrees with a piece of input data placed at a head position of the input buffer 22A (the agreement is called a neighborhood agreement). Therefore, an identification code is arranged at a head position of the compressed data to add the position information of the agreement data found out. In this case, a code "0" indicating a short positional information value is written in the head position of the compressed data as the positional information, and a code "1" indicating a long positional information value is written in the head position of the compressed data as the positional information.

For example, FIG. 9(A) shows a data format in which a piece of positional information is added to a piece of compressed data in case where a memory size of the dictionary buffer 22B is 2 KB. In FIG. 9(A), in case where a data length of the compressed data is 7 bits (0 to 63), the code "0" indicating the short positional information value is written in the head position of the compressed data. In case where a data length of the compressed data is 12 bits (0 to 2047), the code "1" indicating the long positional information value is written in the head position of the compressed data. In practice, to appropriately adjust the data compression by considering a type of the compressed data, it is required to set a range of the neighborhood agreement, or it is required to use properly a plurality of types of positional information.

Also, in case where a byte number in the agreement data is coded, a byte number occurring at a high frequency is indicated by a short length code having a short bit length. The reason is as follows. In general, the agreement data having a short bit length is often found out. Therefore, a short length code is allocated to the agreement data having a short bit length, so that the coding of the length of the agreement data can be considered.

Therefore, a code tree shown in FIG. 9(B) is considered. In the code tree shown in FIG. 9(B), the code "0" indicating a short positional information value is written in the head position of the compressed data in case of a bit string "0,0" corresponding to a second circle and a bit string "0,1" corresponding to a third circle. FIG. 9(C) shows a relationship between a length of the compressed data composed of a code tree and a corresponding bit string. As shown in FIG. 9(C), the bit string "0,0" denotes that a byte number in the agreement data is two (2-byte agreement), the bit string "0,1" denotes that a byte number in the agreement data is three (3-byte agreement). Also, the code "1" indicating a long positional information value is written in the head position of the compressed data in case of a bit string "1,0,0" corresponding to a fourth circle, a bit string "1,0,1" corresponding to a fifth circle, a bit string "1,1,0,0" corresponding to a sixth circle, a bit string "1,1,0,1" corresponding to a seventh circle, a bit string "1,1,1,0,0" corresponding to an eighth circle, and a bit string "1,1,1,0,1" corresponding to a ninth circle. As shown in FIG. 9(C), these bit strings denote 4-byte agreement, 5-byte agreement, 6-byte agreement, 7-byte agreement, 8-byte agreement and 9-byte agreement.

This coding method is well-known as a Shannon-Fano coding method or a Huffman coding method in which a piece of data can be uniquely coded by allocating a plurality of codes having low bit numbers to pieces of data respectively having a high occurrence probability even though a plurality of codes having different bit numbers are allocated to pieces of data respectively having a low occurrence probability. Here, because a high and low relationship in frequency among the byte agreements depends on a type of the compressed data, the adjustment for the high and low relationship is required.

Next, a reproducing (or decoding) processing according to the first embodiment of the present invention is described.

For example, in case where pieces of dictionary data or a plurality of dictionary data strings formed by using pieces of compressed data are compared with a plurality of input data strings to be decoded input one after another from the compressed data file 27 to the input buffer 22A and a piece of agreement data or an agreement data string is decoded, as a decoding flow chart is shown in FIG. 10, the dictionary buffer 22B is first initialized in a step P1. Thereafter, a piece of compressed data is read out from the compressed data file 27 and is written in the input buffer 22A. In this case, a piece of data not decoded is moved to a head position of the input buffer 22A. Thereafter, in a step P3, pieces of coded information corresponding to an identification code and a positional information value of the compressed data are analyzed, and the compressed data is decoded. Therefore, a piece of original data is reproduced by the compressed data decoded. For example, a plurality of dictionary data stored in the dictionary buffer 22B are compared with pieces of input data to be decoded written in the input buffer 22A one after another under the control of the CPU 24. Thereafter, a particular dictionary data string agreeing with a particular input data string to be decoded is found out, and the particular dictionary data string is decoded. Thereafter, in a step P4, the particular dictionary data string decoded is regarded as a piece of decoded original data, and the decoded original data is written in the original data file 21.

Thereafter, in a step P5, the particular input data string to be decoded which agrees with the particular dictionary data string is decoded, and the particular decoded input data string is moved to the dictionary buffer 22B. In this case, the particular dictionary data string having a duplicate relationship with the particular decoded input data is expelled from the data writing range of the dictionary buffer 22B, and a plurality of dictionary data strings still stored in the dictionary buffer 22B from which the particular dictionary data is expelled are placed close together in a heading direction under the control of the CPU 24. Thereafter, the particular decoded input data string is written as a piece of dictionary data in the data writing range of the dictionary buffer 22B, in which a plurality of dictionary data strings are placed close together in a heading direction, under the control of the CPU 24. Thereafter, in a step P6, it is judged whether or not all of pieces of compressed data stored in the compressed data file 27 are decoded. In case where all of the compressed data are decoded (YES), the control algorithm is finished. In case where all of the compressed data are not decoded (NO), the control algorithm returns to the step P2, and another piece of compressed data is read out from the compressed data file 27 and is written in the input buffer 22A. Thereafter, the steps P3 to P6 are repeatedly performed.

Accordingly, a plurality of dictionary data strings formed by using pieces of compressed data are compared with a plurality of input data strings to be decoded input one after another and an agreement data string representing the particular dictionary data and the particular input data can be decoded.

As is described above, in the first data processing apparatus according to the first embodiment of the present invention, as shown in FIG. 4, a plurality of dictionary data strings formed by using pieces of compressed data are compared with a plurality of input data strings to be decoded, in case where a particular dictionary data string agrees with a particular input data string to be decoded, the particular dictionary data string is expelled from the dictionary buffer 22B, the particular input data to be decoded is written as a piece of new dictionary data in the dictionary buffer 22B in which a plurality of dictionary data strings still stored are placed close together in a direction.

Therefore, the particular dictionary data string of the dictionary buffer 22B having a duplicate relationship with the particular input data to be decoded is expelled from the data writing range of the dictionary buffer 22B. That is, as shown in FIG. 7(A), in a searching condition prior to a coding operation, when a data string "abc" corresponds to an agreement data string, as shown in FIG. 7(B), a piece of dictionary data "abc" having three bytes is expelled from the dictionary writing range of the dictionary buffer 22B according to the first embodiment of the present invention.

As a result, a piece of dictionary data "xyz" which is stored in the head position of the dictionary buffer 22B and has no connection with the agreement data string is not expelled. In the first prior art, the dictionary data "xyz" is merely expelled from the dictionary buffer 2B. Therefore, in a condition after the coding operation, as shown in FIG. 7(C), the agreement data string "abc" does not remain in duplicate in the dictionary buffer 22B. In general, the number of the dictionary data is increased, a memory capacity of a dictionary buffer itself is increased, and a data compression efficiency is lowered. However, in the first embodiment of the present invention, there are following effects. That is, even though the number of the dictionary data is increased, a memory capacity of the dictionary buffer 22B itself is not increased, and the number of coded bits obtained after the data compression is not increased.

Also, pieces of dictionary data differing from each other can be always stored in the dictionary buffer 22B according to the first embodiment of the present invention. Therefore, the redundancy of the dictionary data in the dictionary buffer 22B is reduced as compared with that in the first prior art, and the data compression efficiency can be enhanced.

(2) Description of a second embodiment

FIGS. 11(A) to 11(C) are explanatory views of a data processing apparatus representing a data compressing apparatus and a data reproducing (or decoding) apparatus according to a second embodiment of the present invention, FIG. 11(A) is an explanatory view of the agreement dictionary buffer 22C, FIG. 11(B) is an explanatory view showing a coding operation for a piece of agreement data, and FIG. 11(C) is an explanatory view showing a searching range of the agreement data in the agreement dictionary buffer 22C.

A different point in the second embodiment from that in the first embodiment is that a particular dictionary data string expelled from the dictionary buffer 22B is referred when a plurality of dictionary data strings are compared with a plurality of input data strings to be compressed. That is, in a second data processing apparatus according to the second embodiment of the present invention, as shown in FIG. 4, the agreement dictionary buffer 22C is used to store one or more pieces of dictionary data or one or more dictionary data strings expelled from the dictionary buffer 22B. As shown in FIG. 11(A), a ring-shaped structure type of buffer having a certain memory capacity is, for example, used for the agreement dictionary buffer 22C. The ring-shaped structure type of buffer is described in detail in a fourth embodiment of the present invention.

In the agreement dictionary buffer 22C, a dictionary data string currently expelled from the dictionary buffer 22B is written to replace another dictionary data string which is stored in the agreement dictionary buffer 22C and was previously expelled from the dictionary buffer 22B. Therefore, a plurality of updated dictionary data strings are written one after another in the agreement dictionary buffer 22C. The second embodiment is not limited to this renewal of the dictionary data. For example, it is applicable that a reference frequency of each of the dictionary data string be counted each time a dictionary data string is referred and a dictionary data string referred at a low reference frequency is written in the agreement dictionary buffer 22C to replace another dictionary data string stored. In this case, though a processing speed is lowered, a data compression efficiency can be heightened.

A reference pointer and a storage pointer are used in the agreement dictionary buffer 22C. The reference pointer points at a position for referring the agreement dictionary buffer 22C. The storage pointer points at a position for storing a piece of dictionary data or a dictionary data string currently expelled from the dictionary buffer 22B. The reference pointer is placed at a forward position of the storage pointer to search for a piece of updated dictionary data or an updated dictionary data string currently expelled from the dictionary buffer 22B.

A memory capacity of the agreement dictionary buffer 22C is larger than that of the dictionary buffer 22B not to store a piece of dictionary data of the agreement dictionary buffer 22C and another piece of dictionary data of the dictionary buffer 22B in a duplicate relationship. The reason is that an agreement data string is not immediately gone from the dictionary buffer 22B because the agreement data string expelled from the dictionary buffer 22B is moved from the input buffer 22A to the dictionary buffer 22B.

In FIG. 11(A), a shaded portion indicates a searching range for searching the dictionary data of the agreement dictionary buffer 22C. The searching range is limited by the coding of the input data to be compressed. In the second embodiment of the present invention, a data file for storing pieces of data to be compressed on condition that the 2-byte agreement occurs at the most occurrence frequency is assumed. Therefore, the agreement dictionary buffer 22C is structured to store pieces of agreement data obtained according to the 2 byte agreement.

FIG. 11(B) shows a plurality of data formats in which a piece of positional information is added to each of pieces of compressed data in case where a memory capacity of the agreement dictionary buffer 22C is 2KB. In FIG. 11(B), in case where a data length of the agreement data string is 12 bits (0 to 2047), a code "1" is written in the agreement dictionary buffer 22C as a long positional information value in the same manner as in the first embodiment. In practice, to appropriately adjust the data compression by considering a type of the compressed data, it is required to set a range of the neighborhood agreement, or it is required to use properly a plurality of types of positional information. The feature of the second embodiment is that the correspondence of the agreement data to the agreement dictionary buffer 22C is made up without increasing the number of coded bits on condition that the above requirement is satisfied.

To be concrete, as shown in FIG. 11(B), a portion of the long positional information which has a duplicate relationship with a value (0 to 127) of the short positional information is allocated. That is, when a piece of input data of a value ranging from 0 to 127 is coded to a piece of compressed data, the short positional information is added to the compressed data. Therefore, the long positional information is not added. For example, an identification code "1" having one bit and a coded word "000 0000 0000" having eleven bits are written in a first line of an agreement dictionary of the agreement dictionary buffer 22C, an identification code "1" having one bit and a coded word "000 0000 0001" having eleven bits are written in a second line of the agreement dictionary, and an identification code "1" having one bit and a coded word "000 0000 0010" having eleven bits are written in a third line of the agreement dictionary, in the same manner.

Figure 1A:
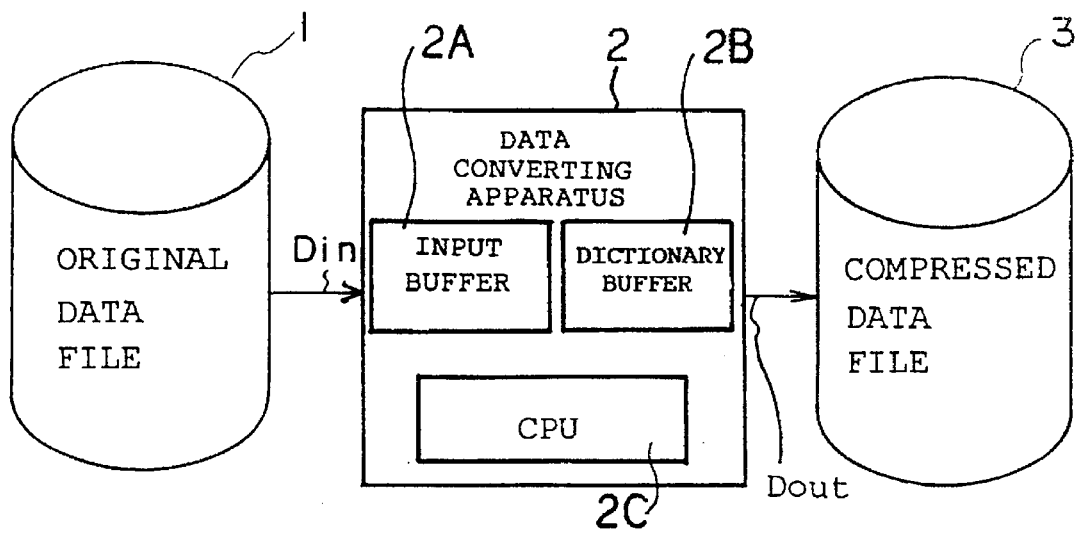
FIG. 1(A) is a constitutional view of a conventional data compressing apparatus according to a first previously proposed art.
Figure 1B:
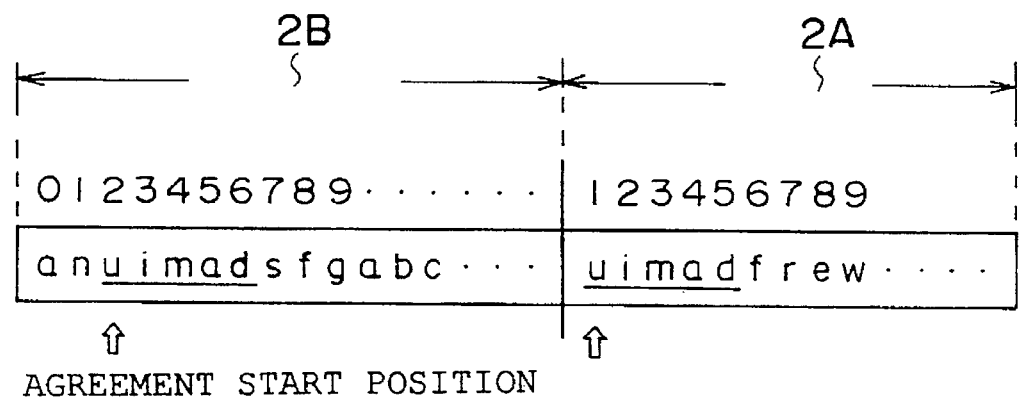
FIG. 1(B) explanatorily shows an arrangement view of pieces of dictionary data and pieces of input data in a data searching step.
Figure 1C:
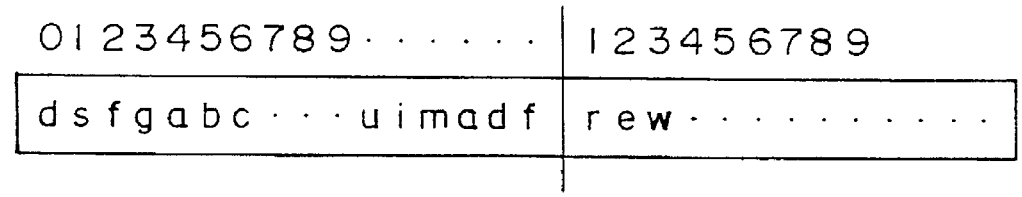
FIG. 1(C) explanatorily shows another arrangement view of pieces of dictionary data and pieces of input data in a data expelling step.
Figure 2A:
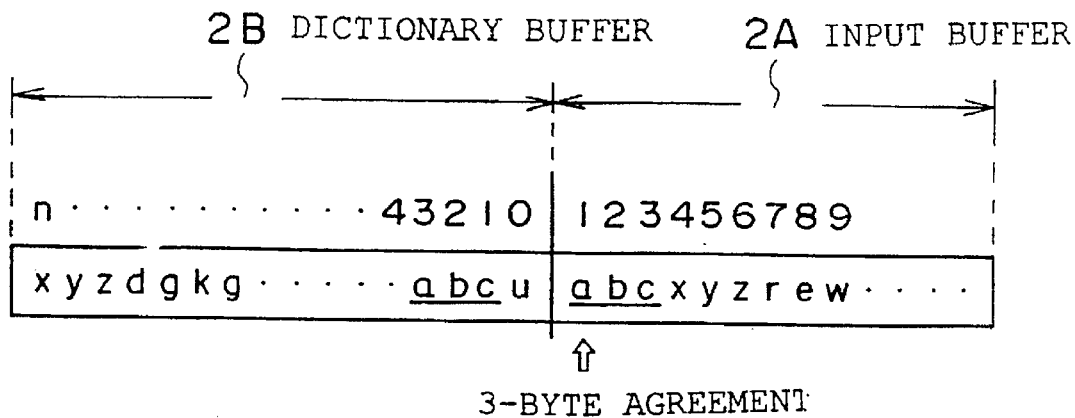
FIGS. 2(A), 2(B) and 2(C) explanatorily shows a coding processing in which the same piece of character string is undesirably duplicated in a dictionary buffer.
Figure 2B:
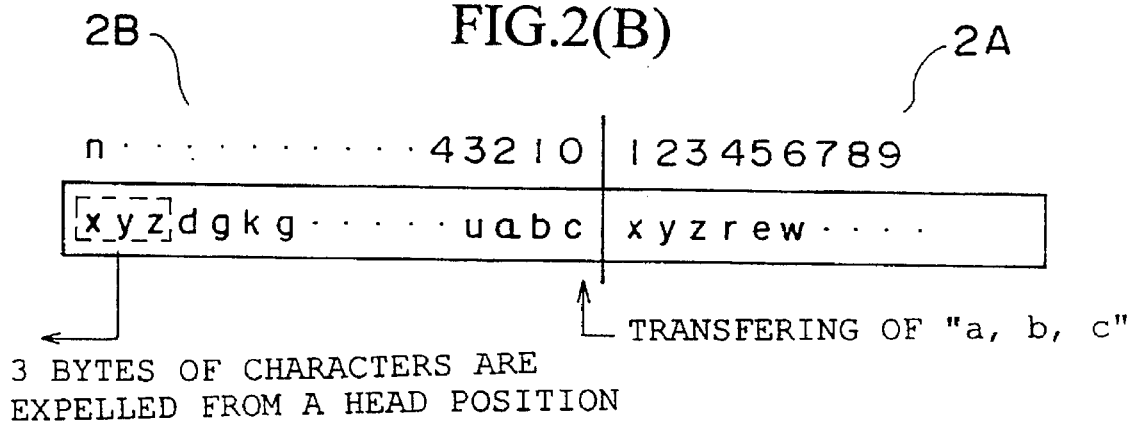
Figure 2C:
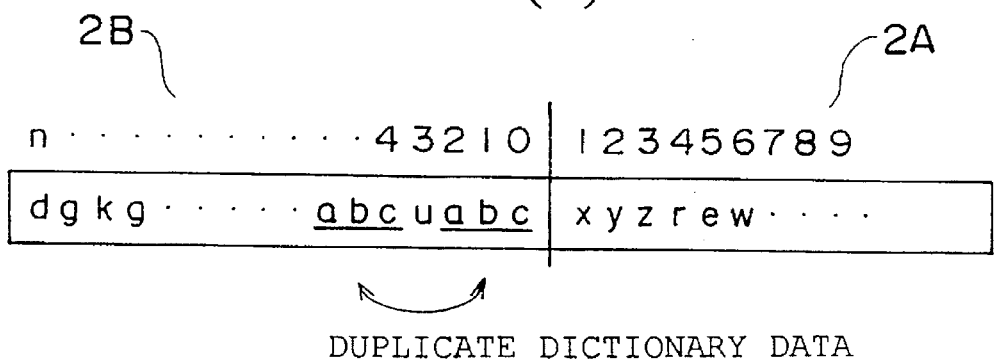

As an example, when a piece of input data "r,e" of the input buffer 2A obtained after a coding operation shown in FIG. 1(C) agrees with a piece of dictionary data "r,e" placed in a second line of the agreement dictionary buffer 22C, a bit string of a coded word "1 000 0000 0001" is generated. In this case, because the length of the bit string is fixed, a code indicating the length of the bit string is not generated. Therefore, 13 bits including a bit for the identification code "1" are required. Because 2 bytes (that is, 16 bits) are required when the input data "r,e" does not agree with any piece of dictionary data, the agreement data "r,e" is compressed by 3 bits (16 bits–13 bits).

In an example shown in FIG. 11(B), 128 pieces of dictionary data are stored in the agreement dictionary buffer 22C. To search pieces of dictionary data of the agreement dictionary buffer 22C expelled from the dictionary buffer 22B as many as possible, as shown in FIG. 11(C), a memory capacity of the agreement dictionary buffer 22C is, for example, set to 256 bits. When a searching operation is performed, a position placed 128 bits behind the storage pointer currently placed is searched.

Accordingly, the number of dictionary data is substantially increased, and a data compression utilizing a moving window while using the dictionary buffer 22B and the agreement dictionary buffer 22C together can be performed.

Next, a second data processing method according to the second embodiment of the present invention is described with reference to a processing flow chart shown in FIG. 12 to describe the operation of the second data processing apparatus.

Figure 12:
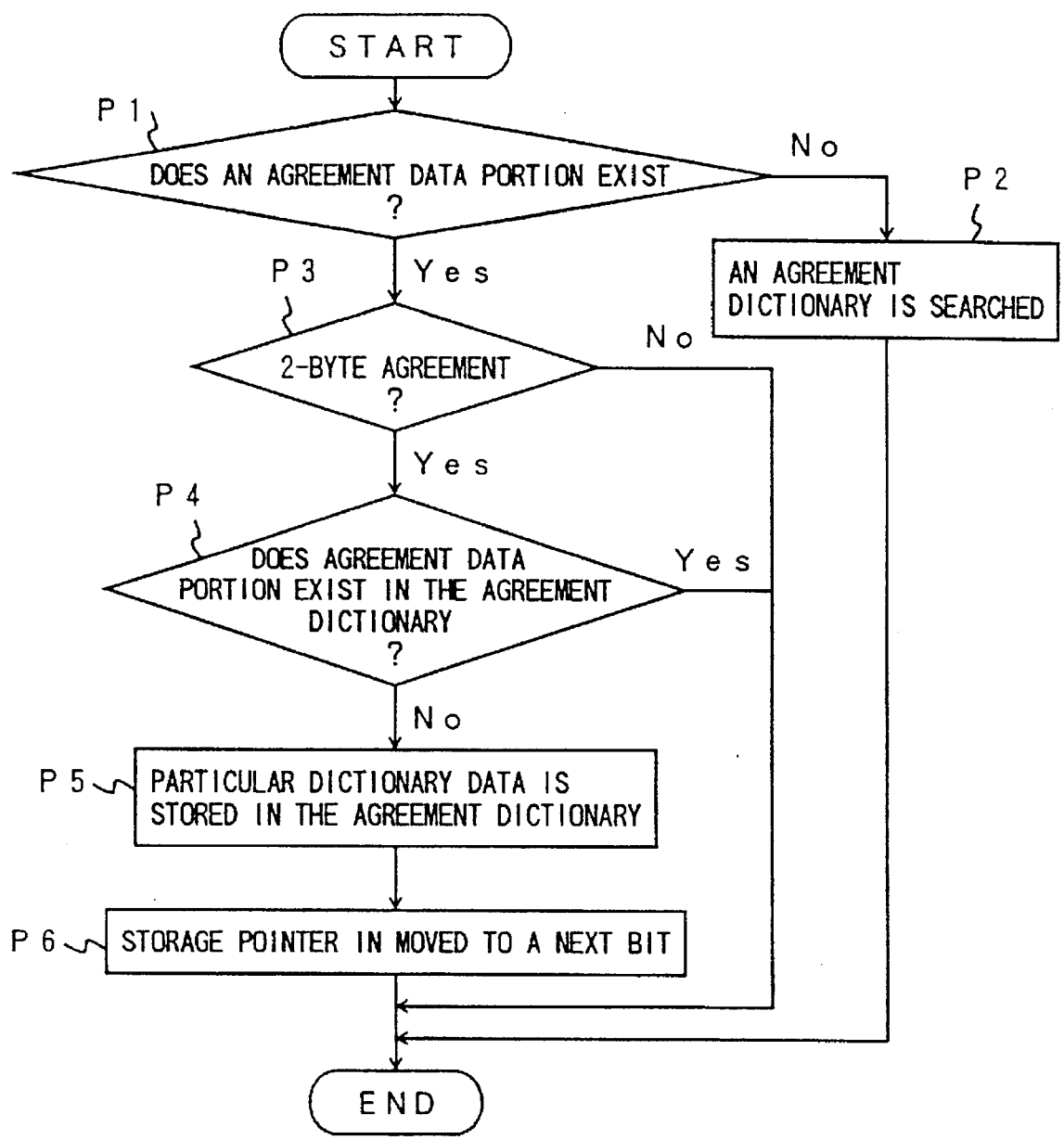
FIG. 12 is a flow chart showing the generation of an agreement dictionary according to the second embodiment of the present invention.
Figure 13:
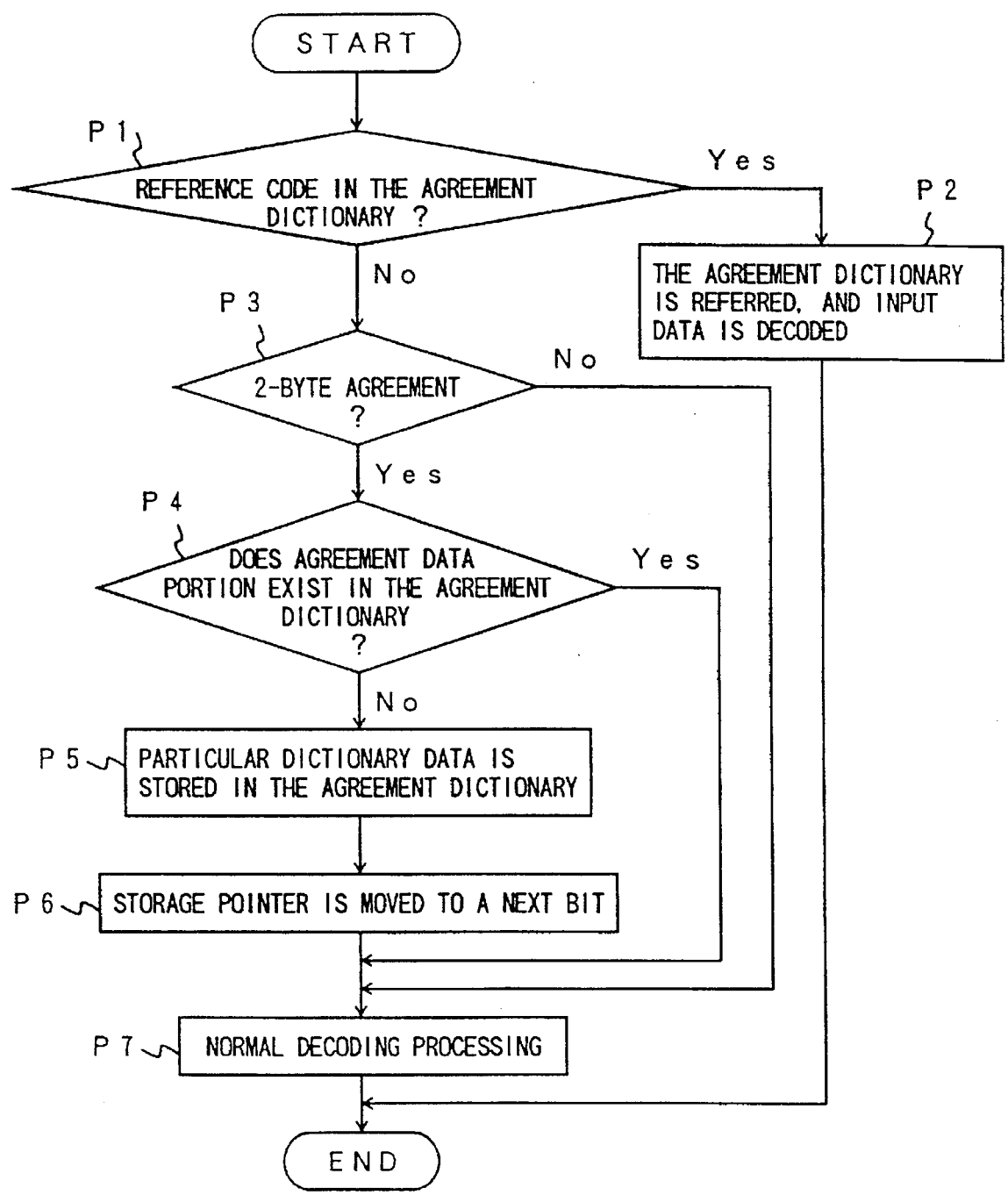
FIG. 13 is a flow chart showing a reproducing (or decoding) processing of a piece of compressed data according to the second embodiment of the present invention.

FIG. 12 is a flow chart showing the generation of the agreement dictionary according to the second embodiment of the present invention, and the second data processing method is performed according to a control algorithm stored in the EPROM 23 shown in FIG. 4.

For example, in case where an agreement dictionary is generated by using one or more pieces of dictionary data expelled from the dictionary buffer 22B, in the flow chart shown in FIG. 12, it is judged in a step P1 whether or not an agreement data portion exists in the dictionary buffer 22B. In case where the agreement data portion exists (YES), the control algorithm proceeds to a step P3. Also, in case where any agreement data portion does not exist (NO), the control algorithm proceeds to a step P2, pieces of dictionary data of the agreement dictionary buffer 22C are searched. When a piece of particular dictionary data of the agreement dictionary buffer 22C agrees with a piece of particular input data to be coded, the particular dictionary data is coded and stored in the compressed data file 27. Thereafter, the control algorithm is finished without any generation of the agreement dictionary.

In case where the agreement data portion exists (YES), it is judged in a step P3 whether or not the agreement of the data portion is the 2-byte agreement. In case of the 2-byte agreement (YES), the control algorithm proceeds to a step P4. Also, in case where the agreement of the data portion is not the 2-byte agreement, the control algorithm is finished without any generation of the agreement dictionary.

In case where the agreement of the data portion is the 2-byte agreement in the step P3, it is judged in the step P4 whether or not a piece of dictionary data agreeing with the agreement data portion exists in the agreement dictionary buffer 22C. In case where the dictionary data agreeing with the agreement data portion exists (YES), the control algorithm is finished without any generation of the agreement dictionary.

In case where any piece of dictionary data does agreeing with the agreement data portion does not exist in the agreement dictionary buffer 22C in the step P4 (NO), the control algorithm proceeds to a step P5, and a piece of particular dictionary data expelled from the dictionary buffer 22B is stored in the agreement dictionary buffer 22C to generate the agreement dictionary. Thereafter, the control algorithm proceeds to a step P6, the storage pointer is moved to a next bit, and the control algorithm is finished.

Therefore, the agreement dictionary can be generated by using pieces of dictionary data or a plurality of dictionary data strings expelled from the dictionary buffer 22B, and the dictionary data or the dictionary data strings expelled from the dictionary buffer 22B can be referred when the dictionary data or the dictionary data strings stored in the dictionary buffer 22B are compared with the input data to be compressed.

Next, a reproducing (or decoding) processing of the compressed data according to the second embodiment of the present invention is described.

FIG. 13 is a flow chart showing a reproducing (or decoding) processing of the compressed data according to the second embodiment of the present invention, and the reproducing processing is performed according to a control algorithm stored in the EPROM 23 shown in FIG. 4.

For example, in case where a piece of input data to be decoded is decoded while referring one or more pieces of dictionary data of the agreement dictionary buffer 22C, it is judged in a step P1 whether or not a reference code exists in the agreement dictionary buffer 22C. In case where the reference code exists (YES), the control algorithm proceeds to a step P2, one or more pieces of dictionary data of the agreement dictionary buffer 22C are referred, and a piece of input data to be decoded is decoded. Thereafter, the control algorithm is finished without any generation of the agreement dictionary.

In case where any reference code does not exist in the step P1 (NO), it is judged in a step P3 whether or not the agreement of a piece of particular input data to be decoded with a piece of particular dictionary data of the dictionary buffer 22B is the 2-byte agreement. In case of the 2-byte agreement (YES), the control algorithm proceeds to a step P4. Also, in case where the judgement is not the 2-byte agreement (NO), the control algorithm proceeds to a step P7, a normal decoding processing is performed without any generation of the agreement dictionary, and the control algorithm is finished.

In case of the 2-byte agreement (YES) in the step P3, it is judged in the step P4 whether or not a piece of dictionary data agreeing with a piece of agreement data which represents the particular input data and the particular dictionary data exists in the agreement dictionary buffer 22C. In case where the dictionary data agreeing with the agreement data exists (YES), the control algorithm proceeds to the step P7, the normal decoding processing is performed without any generation of the agreement dictionary, and the control algorithm is finished.

In case where the dictionary data agreeing with the agreement data does not exist in the agreement dictionary buffer 22C in the step P4, the control algorithm proceeds to a step P5, the particular dictionary data expelled from the dictionary buffer 22B is stored in the agreement dictionary buffer 22C to generate the agreement dictionary. Thereafter, the control algorithm proceeds to a step P6, the storage pointer is moved to a next bit, the control algorithm proceeds to the step P7, and the normal decoding processing is performed without any generation of the agreement dictionary, and the control algorithm is finished.

Therefore, the agreement dictionary can be generated by using pieces of dictionary data or a plurality of dictionary data strings expelled from the dictionary buffer 22B, and a piece of input data to be decoded can be decoded while referring the dictionary data of the agreement dictionary buffer 22C.

As described above, in the second data processing apparatus according to the second embodiment of the present invention, the agreement dictionary buffer 22C shown in FIG. 4 is arranged, and the dictionary data strings expelled from the dictionary buffer 22B are stored in the agreement dictionary buffer 22C.

Accordingly, because one or more pieces of dictionary data or one or more dictionary data strings which each agreed with a piece of input data to be compressed or an input data string to be compressed in the past is stored in the agreement dictionary buffer 22C without changing a memory capacity of the dictionary buffer 22B, the number of dictionaries representing the dictionary data or the dictionary data strings to be referred can be substantially increased. Also, in the second embodiment of the present invention, even though the number of dictionaries is substantially increased, the capacity of the dictionaries remaining by coding the dictionary data or the dictionary data strings is not increased, and the number of coded bits obtained after the coding is not increased.

The agreement data strings expelled from the dictionary buffer 22B are stored in the agreement dictionary buffer 22C as a plurality of auxiliary dictionaries, and the agreement data strings of the agreement dictionary buffer 22C can be referred. That is, as the flow chart is shown in FIG. 12, the dictionary data strings can be compared with the input data strings to be compressed while referring the dictionary data strings expelled from the dictionary buffer 22B in the step P2. Therefore, even though a piece of input data obtained by inputting a piece of original data does not agree with any piece of dictionary data of the dictionary buffer 22B, there is a probability that the input data agrees with a piece of dictionary data stored in the agreement dictionary buffer 22C. As a result, a data compression efficiency for the original data coded as it is (step P6 in FIG. 8) can be enhanced.

Accordingly, the dictionary data expelled from the dictionary buffer 22B can be efficiently used, and a data compressing operation in which a moving window utilizing the dictionary buffer 22B and the agreement dictionary buffer 22C together is used can be performed. Also, the data compressing operation can be performed by using the dictionary data which each agreed with a piece of input data to be compressed in the past, and the data compressing efficiency can be enhanced as compared with the first prior art.

(3) Description of a third embodiment

Figure 14A:
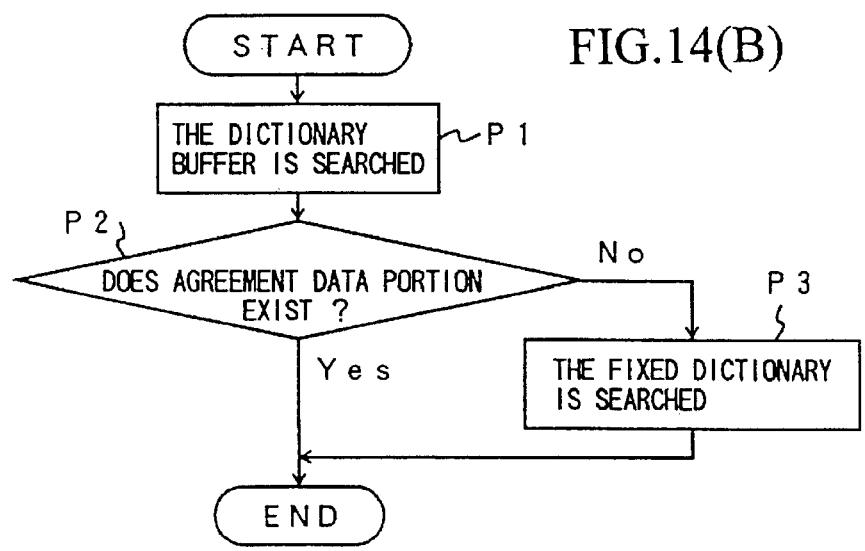
FIG. 14(A) shows a fixed dictionary of a fixed dictionary buffer according to a third embodiment of the present invention.
Figure 14B:
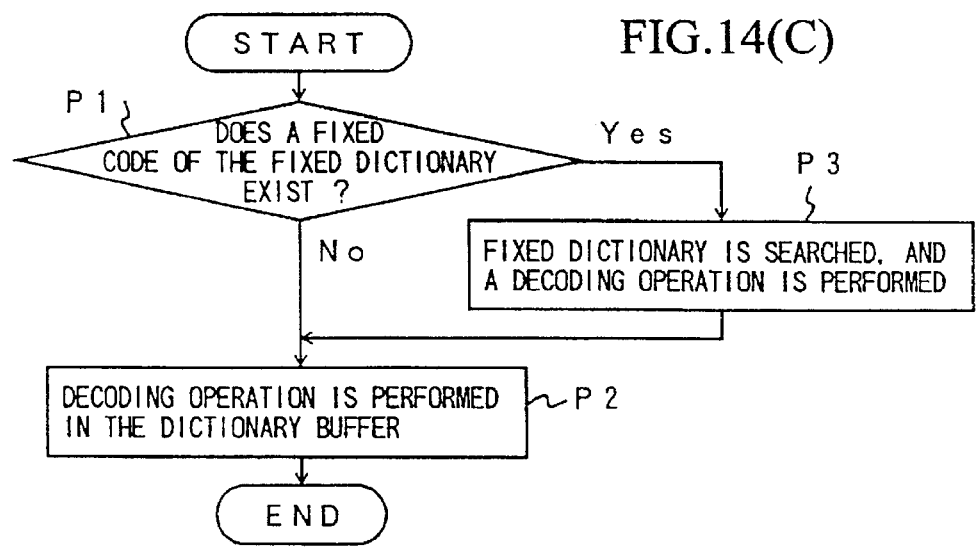
FIG. 14(B) is a flow chart showing the reference of the fixed dictionary in a data compressing operation performed according to a third data processing method.

FIGS. 14(A) to 14(C) are explanatory views of a third data processing method utilizing a fixed dictionary according to a third embodiment of the present invention. FIG. 14(A) shows a fixed dictionary of a fixed dictionary buffer, FIG. 14(B) is a flow chart showing the reference of the fixed dictionary in a data compressing operation, and FIG. 14(C) is a flow chart showing the reference of the fixed dictionary in a data reproducing (or decoding) operation.

A different point of a third embodiment from the first and second embodiments is that an occurrence frequency of each of pieces of input data to be compressed is examined in advance and one or more pieces of fixed data or one or more fixed data strings, which each are formed by using the input data to be compressed and have a high occurrence frequency, are referred when the dictionary data strings stored in the dictionary buffer 22B are compared with the input data to be compressed.

In detail, in a third data processing apparatus representing a third data compressing apparatus and a third data reproducing (or decoding) apparatus of the present invention, as shown in FIG. 4, an occurrence frequency of each of pieces of input data to be compressed is examined in advance, and the fixed dictionary buffer 22D is arranged to store one or more pieces of fixed data or one or more fixed data strings which each are formed by using the input data to be compressed and have a high occurrence frequency. In the fixed dictionary buffer 22D, as shown in FIG. 14A, pieces of fixed dictionary data such as alphabets "i", "f" arithmetical signs "+", "=" and description signs ")"," ("are, for example, registered to form a fixed dictionary.

The fixed dictionary is placed in a compression and expansion control program of the EPROM 23 and is added to the compressed data coded. To form the fixed dictionary in advance, it is required to examine types of the fixed data strings and the fixed data strings respectively having a high occurrence frequency. When types of the fixed data strings are judged, a method for judging from an expanding code of a file or another method in which an operator indicates types of the fixed data with the keyboard 25 is adopted.

As for the fixed data strings respectively having a high occurrence frequency, for example, it is examined in advance with an auxiliary tool which of the fixed data strings occurs at a high or low occurrence frequency in the 2-byte agreement. In this case, as compared with a method in which the fixed data are stored in the fixed dictionary buffer 22D regardless of the occurrence frequency of the fixed data, a method in which the agreement data respectively occurring at a high occurrence frequency are selectively stored in the fixed dictionary buffer 22D as pieces of fixed data is useful by considering a memory capacity of the fixed dictionary buffer 22D and a processing speed in the third data processing apparatus. It is applicable that this fixed dictionary generating tool is connected to the third data processing apparatus as a pre-processor of a data compression tool.

Next, a third data processing method representing a third data compressing method and a third data reproducing (or decoding) method according to the third embodiment of the present invention is described with reference to FIG. 14(B).

In case where a data compressing method is, for example, performed by using pieces of fixed dictionary data of the fixed dictionary buffer 22D, as shown in FIG. 14(B), the dictionary data of the dictionary buffer 22B are searched in a step P1. Thereafter, it is judged in a step P2 whether or not an agreement data portion exists in the dictionary buffer 22B. In case where the agreement data portion exists (YES), a data compressing operation is performed by using the dictionary data of the dictionary buffer 22B without referring the fixed dictionary data of the fixed dictionary buffer 22D. In case where the agreement data portion does not exist in the step P2 (NO), the procedure proceeds to a step P3, and the fixed dictionary data of the fixed dictionary buffer 22D are searched. When a piece of particular fixed dictionary data agrees with a piece of particular input data to be coded, the particular fixed dictionary data is coded and stored in the compressed data file 27. Therefore, the data compressing operation is performed by using the fixed dictionary data of the fixed dictionary buffer 22D.

Next, a reproducing (or decoding) processing for the compressed data according to the third embodiment of the present invention is described with reference to FIG. 14(C).

In case where a piece of particular input data to be decoded is, for example, decoded by referring pieces of fixed dictionary data of the fixed dictionary buffer 22D, as shown in FIG. 14(C), it is judged in a step P1 whether or not a fixed code of the fixed dictionary buffer 22D exists in the input buffer 22A. In case where the fixed code exists in the input buffer 22A (YES), the procedure proceeds to a step P3, and the fixed dictionary data of the fixed dictionary buffer 22D are searched. When a piece of particular fixed dictionary data agrees with the particular input data to be decoded, the particular input data to be decoded is decoded, the particular fixed dictionary data is decoded and stored in the original data file 21, and the procedure is finished.

In case where the fixed code does not exist in the input buffer 22A in the step P1, a decoding operation is performed in the dictionary buffer 22B in a step P2, and the procedure is finished. Therefore, pieces of input data to be decoded can be decoded while referring the fixed dictionary data of the fixed dictionary buffer 22D.

As is described above, in the third data processing apparatus according to the third embodiment of the present invention, the fixed dictionary buffer 22D shown in FIG. 14(A) is arranged, an occurrence frequency of each of pieces of input data to be compressed is examined in advance, and one or more pieces of fixed data or one or more fixed data strings, which each are formed by using the input data to be compressed and have a high occurrence frequency are written in the fixed dictionary buffer 22D as pieces of dictionary data. Therefore, because the dictionary data registered in the fixed dictionary buffer 22D as pieces of data respectively having a high occurrence frequency are compared with pieces of input data adopted as pieces of fixed data, a data searching speed can be heightened. Also, though the number of dictionaries is substantially increased by using the fixed dictionary buffer 22D and the dictionary buffer 22B together, the capacity of the dictionaries remaining by coding the dictionary data or the dictionary data strings is not increased, and the number of coded bits obtained after the coding is not increased.

That is, as the processing flow chart is shown in FIG. 14(B), the dictionary data stored in the dictionary buffer 22B can be compared with the input data to be compressed while referring the fixed dictionary data which are examined in advance in the input data to be compressed and respectively have a high occurrence frequency.

Accordingly, the data searching speed can be heightened as compared with that in the first prior art, the data compression processing can be performed at a high speed. Here, because a generating process of the agreement dictionary buffer 22C is not required in the third embodiment as compared with that in the second embodiment, the data processing speed can be heightened. The third embodiment of the present invention is appropriate to uses in which types of the input data to be compressed are specified.

(4) Description of a fourth embodiment

Figure 15A:
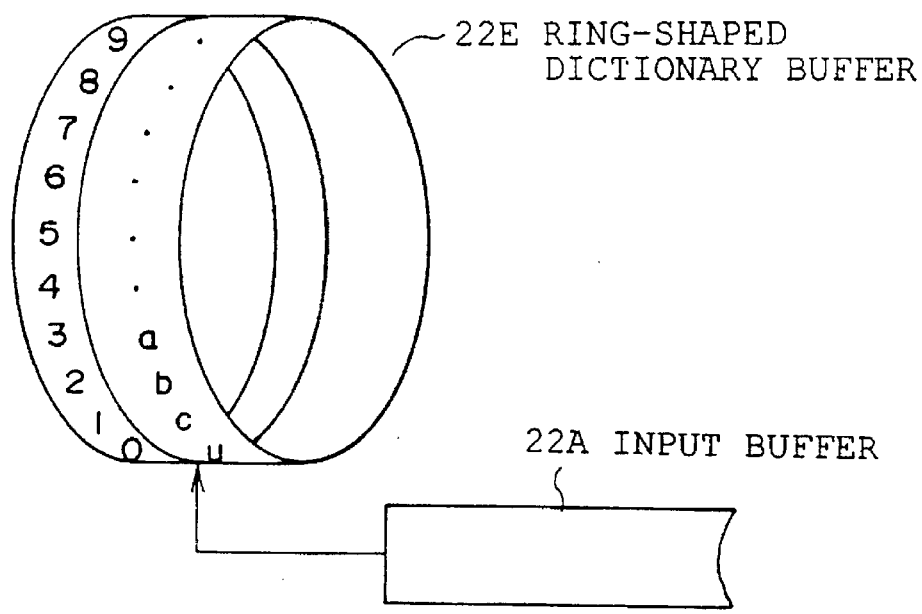
FIG. 15(A) is a constitutional view of a ring-shaped dictionary buffer of a fourth data processing apparatus according to a fourth embodiment of the present invention.
Figure 15B:
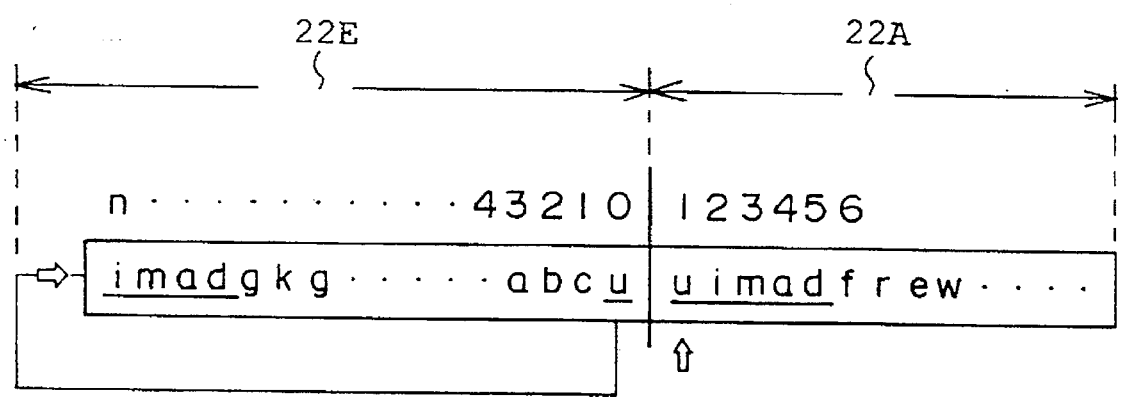
FIGS. 15(B) and 15(C) respectively show a searching condition view of the ring-shaped dictionary buffer.
Figure 15C:
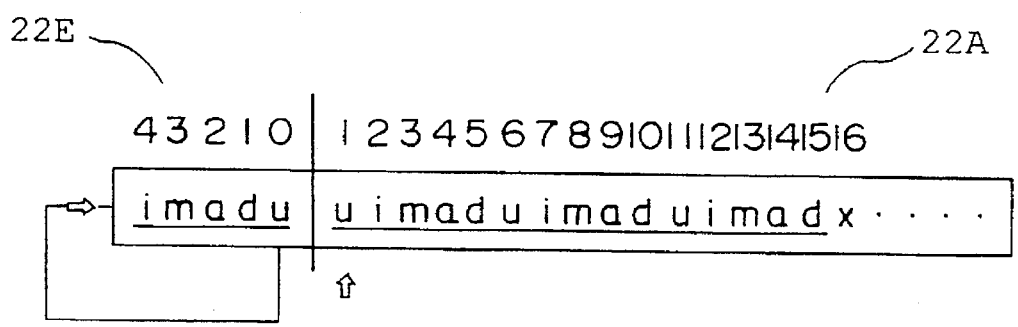

FIGS. 15(A) to 15(C) are explanatory views of a fourth data processing apparatus representing a fourth data compressing apparatus and a fourth data reproducing (or decoding) apparatus according to a fourth embodiment of the present invention. FIG. 15(A) is a constitutional view of a ring-shaped dictionary buffer of the fourth data processing apparatus, FIGS. 15(B) and 15(C) respectively show a searching condition view of the ring-shaped dictionary buffer. A different point of the fourth embodiment from the first and third embodiments is that the dictionary buffer 22B is formed in a ring-shaped structure.

In the fourth data processing apparatus according to the present invention, as shown in FIG. 15(A), a ring-shaped dictionary buffer 22E is arranged. A different point of the ring-shaped dictionary buffer 22E according to the fourth embodiment from the dictionary buffer 22B according to the first embodiment is that both ends of a memory region in which pieces of input data to be compressed are written as pieces of dictionary data are connected in a no-ended loop shape. Therefore, the number of dictionary data can be substantially increased, and the agreement of a successive input data string of the input buffer 22A with a successive dictionary data string of the ring-shaped dictionary buffer 22E can be found out by utilizing the ring-shaped dictionary buffer 22E formed in a no-ended loop shape. Accordingly, a fourth data compressing method can be performed by using a moving window in which the dictionary buffer 22B of the first embodiment is expanded.

That is, in case where a piece of input data to be compressed input to the input buffer 22A is coded by using pieces of dictionary data of the ring-shaped dictionary buffer 22E shown in FIG. 15(B), an original data string is read out from the original data file 21 shown in FIG. 4 and is written in the input buffer 22A. In this case, a piece of non-coded data is moved to a head position of the input buffer 22A. For example, as shown in FIG. 15(C), a piece of input data to be compressed DIN {u,i,m,a,d,f,r,e,w, - -} having several bytes is input to the input buffer 22A. Thereafter, the input data to be compressed DIN is shifted from the input buffer 22A to the ring-shaped dictionary buffer 22E. As a result, a piece of dictionary data {i,m,a,d,g, k,g, - - - ,a,b,c,u} having n bytes is written in the ring-shaped dictionary buffer 22E.

Thereafter, the ring-shaped dictionary buffer 22E is searched to judge whether or not an agreement data string exists in the ring-shaped dictionary buffer 22E. For example, a particular dictionary data string {u,i,m,a,d} stored in the ring-shaped dictionary buffer 22E is compared with a particular input data string {u,i,m,a,d} to be compressed of the input buffer 22A. Because the particular dictionary data string agrees with the particular input data string, an agreement data string representing the particular dictionary data string and the particular input data string is coded. For example, in the agreement data string shown in FIG. 15(B), an identification code "1" indicating a long positional information value is added because the agreement data string is long, a positional information code "0" is added because a searching position is placed at a head position of the ring-shaped dictionary buffer 22E by viewing the ring-shaped dictionary buffer 22E from the input buffer 22A, the agreement data string has 5 bytes because of a longest agreement data string {u,i,m,a,d}.

Also, as shown in FIG. 15(C), a piece of input data DIN {u,i,m,a,d,u,i,m,a,d,u,i,m,a,d,x, - - - } (several bytes) to be compressed is input to the input buffer 22A. When the input data DIN to be compressed is shifted from the input buffer 22A to the ring-shaped dictionary buffer 22E, as a result, a piece of dictionary data {i,m,a,d,u} having 5 bytes is written in the ring-shaped dictionary buffer 22E. Thereafter, the ring-shaped dictionary buffer 22E is searched to judge whether or not an agreement data string exists in the ring-shaped dictionary buffer 22E. For example, a dictionary data string {i,m,a,d,u} stored in the ring-shaped dictionary buffer 22E is compared with an input data string {u,i,m,a, d,u,i,m,a,d,u,i,m,a,d} to be compressed of the input buffer 22A. Because three data strings {u,i,m,a,d} of the input data string to be compressed agree with the dictionary data string {i,m,a,d,u}, the three data strings {u,i,m,a,d} ranging from the head position to the fifteenth position in the input buffer 22A are coded at one time, and the compressed data coded is stored in the compressed data file 27.

To be concrete, a piece of positional information and a piece of length information of the agreement data string are coded. In the agreement data string shown in FIG. 15(C), an identification code "1" indicating a long positional information value is added because the agreement data string is long, a positional information code "0" is added because a searching position is placed at a head position of the ring-shaped dictionary buffer 22E by viewing the ring-shaped dictionary buffer 22E from the input buffer 22A, the agreement data string has 5 bytes because of a longest agreement data string {u,i,m,a,d}. The coding operation was described hereinbefore with reference to FIG. 9.

In case where the compressed data is reproduced (or decoded), the compressed data is compressed by using the ring-shaped dictionary buffer 22E according to the same decoding flow chart as the decoding flow chart shown in FIG. 10 in the first embodiment. Therefore, the description of the decoding operation is omitted.

Accordingly, because the ring-shaped dictionary buffer 22E shown in FIG. 15A is arranged in the fourth data processing apparatus according to the fourth embodiment of the present invention, an input data string previously coded can be written in the memory region connected in a no-ended loop shape as a piece of dictionary data, and the number of dictionaries to be referred can be substantially increased.

Therefore, though one or more pieces of dictionary data arranged on a line in the dictionary buffer 22B are merely searched along a line direction in the first embodiment, one or more pieces of dictionary data stored in the ring-shaped dictionary buffer 22E can be cyclically searched along a ring-shaped path in the fourth embodiment. By using the cyclic search of the dictionary data, a longest agreement of the dictionary data with a successive data portion of the input data strings to be compressed can be found out, and a piece of agreement information of the longest agreement can be coded.

Therefore, even though an agreement data portion is not found out in an input data string according to the first embodiment, a probability that an agreement data portion is found out in the input data string according to the fourth embodiment is increased, and a data compressing operation can be performed by using a moving window in which the dictionary buffer 22E is expanded.

(5) Description of a fifth embodiment

Figure 16A:
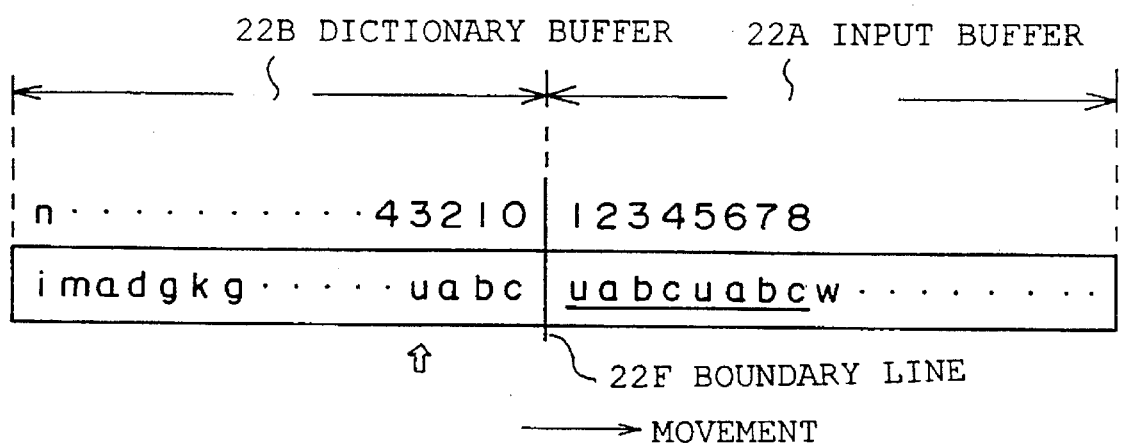
FIG. 16(A) shows a memory region divided into the dictionary buffer and the input buffer by a boundary line.
Figure 16B:
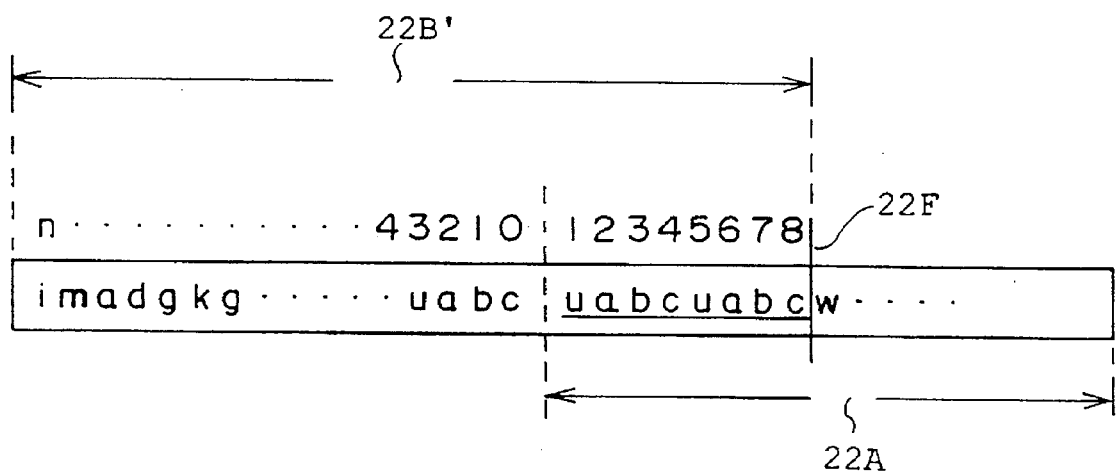
FIG. 16(B) shows an extended dictionary buffer and the input buffer overlapping with the extended dictionary buffer obtained by moving the boundary line toward the input buffer in a data compressing method according to a fifth embodiment of the present invention.

FIGS. 16(A) and 16(B) are explanatory views of a fifth data compressing method according to a fifth embodiment of the present invention. FIG. 16(A) shows a memory region divided into the dictionary buffer 22B and the input buffer 22A by a boundary line 22F, and FIG. 16(B) shows an extended dictionary buffer 22B' and the input buffer 22A overlapping with the extended dictionary buffer 22B' obtained by moving the boundary line 22F toward the input buffer 22A.

A different point of the fifth embodiment from the first to fourth embodiments is that an input data string to be compressed written in an input memory region successively connected to a dictionary memory region is regarded as a dictionary data string. In detail, in a fifth data processing apparatus representing a fifth data compressing apparatus and a fifth data reproducing (or decoding) apparatus according to the fifth embodiment of the present invention, as shown in FIG. 16(A), a function for moving a boundary line (a cursor) 22F dividing a memory region into the dictionary buffer 22B and the input buffer 22A toward the input buffer 22A is added. When a piece of control data is stored in the EPROM 13 as a control algorithm and the control algorithm is read out under the control of the CPU 24, the dictionary memory region and the input memory region are controlled by moving the boundary line 22F (a dictionary control).

In this case, as shown in FIGS. 16(A) and 16(B), the dictionary control is performed by moving the boundary line 22F toward the input memory region when the dictionary data string is compared with the input data string to be compressed. Therefore, the dictionary buffer 22B is extended toward the input memory region to form an extended dictionary buffer 22B'. Therefore, the agreement between the extended dictionary buffer 22B' and the input buffer 22A can be searched. That is, one or more input data strings of the input memory region successively connected to the dictionary memory region in which the dictionary data string are written are regarded as one or more dictionary data strings, and the agreement data string can be found out.

To be concrete, in the agreement data string {u,a,b,c,u,a,b,c} shown in FIG. 16(A), an identification code "1" indicating a long positional information value is added because the agreement data string is long, a positional information code "3" is added because a searching position is placed at a third position of the dictionary buffer 22B by viewing the dictionary buffer 22B from the input buffer 22A, the agreement data string has 8 bytes because of a longest agreement data string {u,a,b,c,u,a,b,c}. Contrivances performed to increase a data compression efficiency in a coding stage are the same as those in the first embodiment. Therefore, the description of the contrivances are omitted.

Also, in case where the compressed data stored in the compressed data file 27 are reproduced (or decoded), pieces of compressed data placed in a common region in which the input buffer 22A and the extended dictionary buffer 22B' are overlapped with each other are decoded one after another.

As is described above, as shown in FIG. 16(B), the input data string to be compressed written in the input memory region successively connected to the dictionary memory region is regarded as the dictionary data string. Therefore, the number of pieces of dictionary data to be referred can be substantially increased, the dictionary data or the dictionary data strings are extended to the input memory region, and the agreement data or the agreement data string can be found out.

Therefore, pieces of input data to be compressed of the input memory region can be compared with each other, and a probability that an agreement data portion is found out in the input data is increased even though the agreement data portion is not found out in the input data according to the first embodiment. In particular, in case where a piece of input data {u,a,b,c} to be compressed which is the same as a piece of dictionary data {u,a,b,c} of the dictionary buffer 22B placed in the neighborhood of the boundary line 22F repeatedly occurs in the input buffer 22A, the data compressing efficiency can be maximized.

Accordingly, though the number of dictionaries representing the dictionary data or the dictionary data strings stored in the extended dictionary buffer 22B' is substantially increased, a memory capacity of the memory region divided into the dictionary buffer 22B or the extended dictionary buffer 22B' and the input buffer 22A is not increased, and a capacity of the coded information is not increased. Therefore, a data searching time can be shortened as compared with that in the first embodiment, and a data compression processing can be performed at a high speed.

Table 1 shows a relationship among pieces of compressed data obtained by compressing pieces of binary data and pieces of text data according to three types of data compressing methods of the first, fourth and fifth embodiments.

A piece of binary data having 6339 bytes and a piece of text data having 3177 bytes are adopted as pieces of original data and are compressed in the first, fourth and fifth data processing apparatuses according to three types of data compressing methods of the first, fourth and fifth embodiments to form six pieces of compressed data, and the number of bytes in each of the compressed data is listed in the Table 1.

TABLE 1

| original data | binary data (6339 bytes) | text data (3177 bytes) |
| --- | --- | --- |
| dictionary data of dictionary buffer 22B are linearly searched. (first embodiment) | 4524 bytes | 1373 bytes |
| dictionary data of ring-shaped dictionary buffer 22E are cyclically searched. (fourth embodiment) | 4522 bytes | 1373 bytes |
| dictionary data of extended dictionary buffer 22B' are searched. (fifth embodiment) | 4495 bytes | 1369 bytes |

In Table 1, because the dictionary data of the dictionary buffer 22B are linearly searched in the first embodiment, the number of bytes in the compressed data obtained by compressing the binary data is 4524 bytes, and the number of bytes in the compressed data obtained by compressing the text data is 1373 bytes. Also, because the dictionary data of the ring-shaped dictionary buffer 22E are cyclically searched in the fourth embodiment, the number of bytes in the compressed data obtained by compressing the binary data is 4522 bytes, and the number of bytes in the compressed data obtained by compressing the text data is 1373 bytes. Also, because the dictionary data of the extended dictionary buffer 22E obtained by extending the dictionary data 22B are searched in the fifth embodiment, the number of bytes in the compressed data obtained by compressing the binary data is 4495 bytes, and the number of bytes in the compressed data obtained by compressing the text data is 1369 bytes.

Accordingly, the data compressing efficiency in the fifth embodiment is definitely enhanced as compared with those in the first and fourth embodiments. Therefore, in case where the original data having a large capacity is compressed and coded, a significant effect of the data compressing efficiency can be expected in the fifth embodiment.

As is described above, in the first data processing apparatus according to the present invention, a following operation is performed under the control of the dictionary control means 24. That is, the dictionary data or the dictionary data strings are compared with the input data to be compressed or the input data strings to be compressed. When the particular dictionary data or the particular dictionary data string agrees with the particular input data or the particular input data string, the particular dictionary data or the particular dictionary data string is expelled from the dictionary buffer 22B and is compressed, the dictionary data or the dictionary data strings still stored in the data writing range of the dictionary buffer 22B are placed close together in a direction, and the particular input data or the particular input data string are written in the dictionary buffer 22B as a piece of new dictionary data or a new dictionary data string.

Therefore, because the particular dictionary data or the particular dictionary data string which has a duplication relationship with the particular input data or the particular input data string is expelled from the data writing range of the dictionary buffer 22B to the outside, a piece of dictionary data having no connection with the particular input data or the particular input data string is prevented from being merely expelled from the head position of the dictionary buffer 22B. Accordingly, the dictionary data or the dictionary data strings differing from each other can be always stored in the dictionary buffer 22B, and the redundancy of the dictionary data or the dictionary data strings of the dictionary buffer 22B can be reduced.

In the second data processing apparatus according to the present invention, the auxiliary (or agreement) dictionary buffer 22C is additionally arranged for storing the dictionary data or the dictionary data strings expelled from the dictionary buffer 22B. Therefore, the number of dictionaries (that is, the number of dictionary data or dictionary data strings) can be substantially increased, the data compressing operation can be performed while referring the dictionary data or the dictionary data strings of the auxiliary dictionary buffer 22C, and a data compression efficiency for a piece of input data or an input data string which is judged not to agree with any piece of dictionary data or any dictionary data string and is coded to a piece of no-compressed data having the same data length as that of the original data of the input data or the input data string without any compression can be enhanced.

In the third data processing apparatus according to the present invention, the fixed dictionary buffer 22D is additionally arranged for storing the fixed data or the fixed data strings formed by using the input data to be compressed which respectively have a high occurrence frequency known by examining in advance the occurrence frequency of each of the input data. Therefore, the data compressing operation can be performed while referring the dictionary data of the fixed dictionary buffer 22D, and the data searching speed can be heightened.

In the fourth data processing apparatus according to the present invention, the dictionary buffer 22B is formed in a ring-shaped structure. Therefore, the data compressing operation can be performed while referring the dictionary data written in the memory region formed in a no-end loop shape and while sliding an extended moving window in the dictionary buffer 22B to search the dictionary data or the dictionary data strings.

In the data processing method according to the present invention, the input data to be compressed or the input data strings to be compressed stored in the input memory region successively connected to the dictionary memory region are utilized as the dictionary data or the dictionary data strings. Therefore, the number of dictionary data to be referred can be substantially increased. Also, the agreement data or the agreement data string can be found out by extending the dictionary data or the dictionary data strings to the input memory region.

Accordingly, the data compressing or reproducing (or decoding) apparatus in which the dictionary data can be efficiently searched at a high speed can be manufactured. Also, an allowable storage capacity of a magnetic disk apparatus or the like can be substantially increased, and the apparatus considerably contributes to shorten the transmission time required for the data transmission.

Next, a data processing apparatus and a data processing method according to sixth to eighth embodiments of the present invention are described with reference to FIGS. 17 to 25 to achieve the second object.

Figure 17:
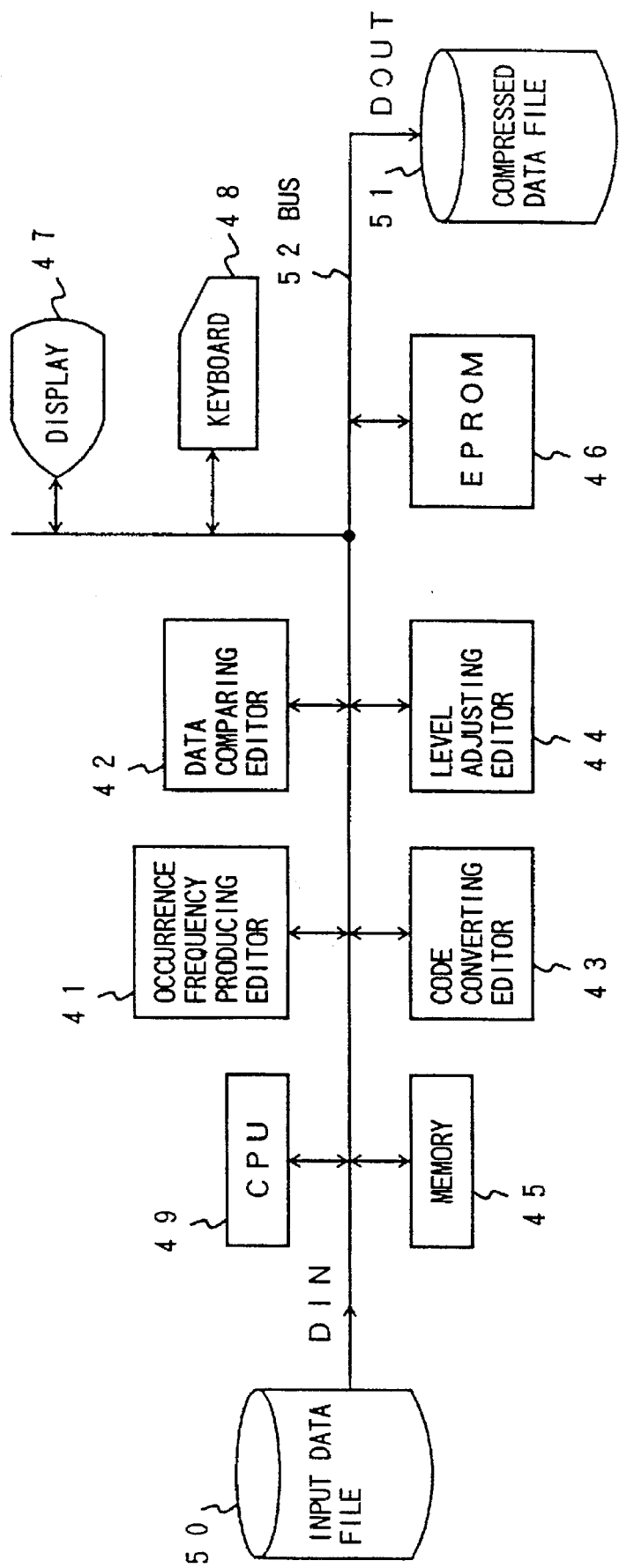
FIG. 17 is a constitutional view of a data compressing and reproducing (or decoding) apparatus according to sixth, seventh and eighth embodiments of the present invention.
Figure 18A:
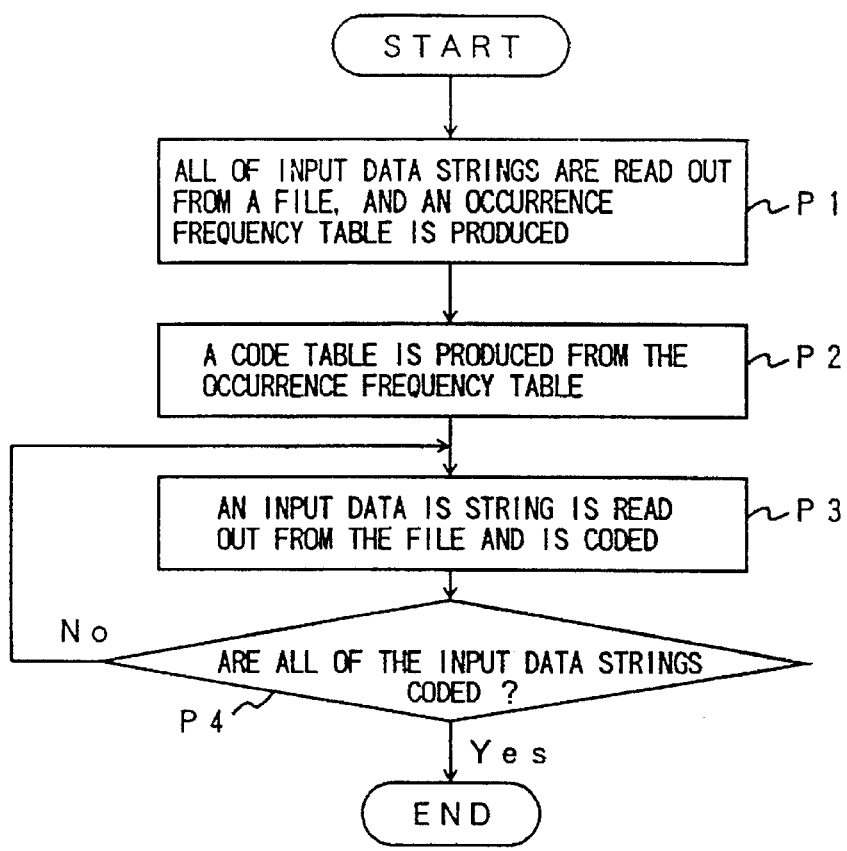
FIG. 18(A) is a flow chart of a data compressing operation according to the sixth embodiment.
Figure 18B:
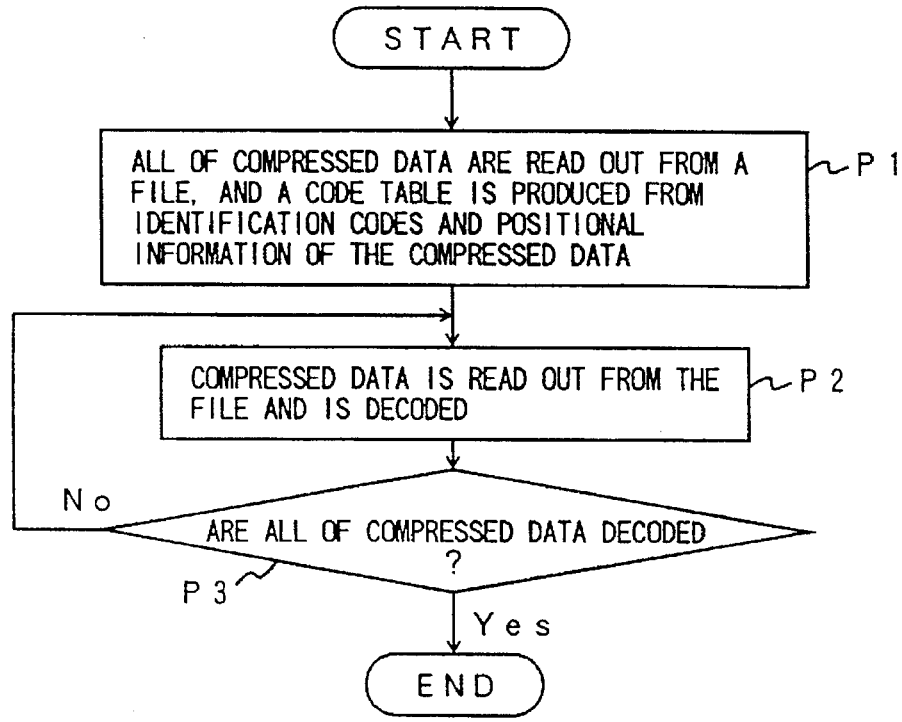
FIG. 18(B) is a flow chart of a data reproducing (or decoding) operation according to the sixth embodiment.
Figures 19A, 19B:
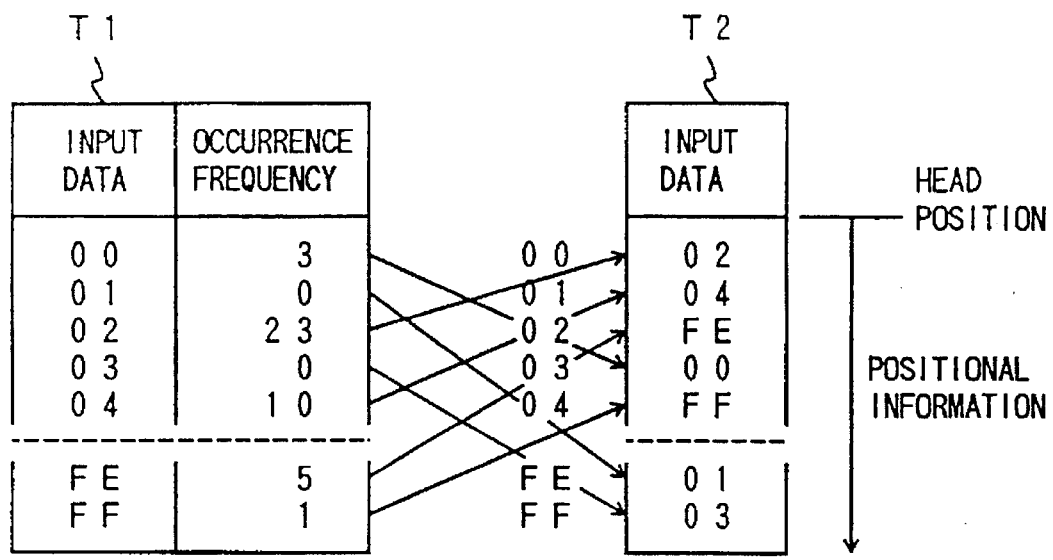
FIGS. 19(A) and 19(B) are respectively an explanatory view of a code converting editor used in a data compressing operation.
Figure 20A:
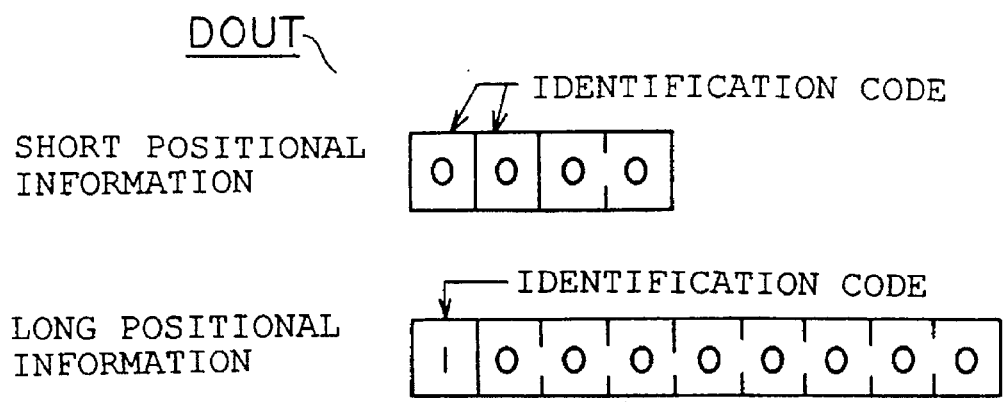
FIG. 20(A) is an explanatory view of two types of compressed data format in which a piece of positional information is added.
Figure 20B:
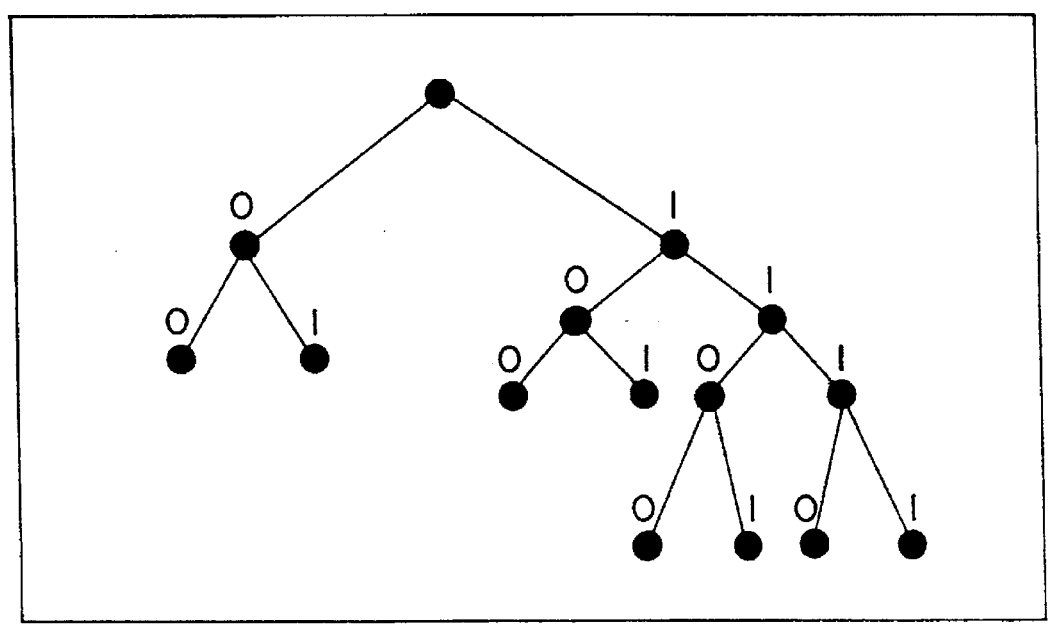
FIG. 20(B) is an explanatory view of a code tree used to determine a series of code bits composing the compressed data.

FIG. 17 is a constitutional view of another data processing apparatus representing a data compressing apparatus and a data reproducing (or decoding) apparatus according to sixth, seventh and eighth embodiments of the present invention, FIG. 18(A) is a flow chart of a sixth data compressing method according to the sixth embodiment, FIG. 18(B) is a flow chart of a sixth data reproducing (or decoding) method according to the sixth embodiment, FIGS. 19(A) and 19(B) are respectively an explanatory view of a code converting editor used in a data compressing operation, FIG. 20(A) is an explanatory view of two types of compressed data format in which a piece of positional information is added, and FIG. 20(B) is an explanatory view of a code tree used to determine a series of code bits composing the compressed data.

As shown in FIG. 17, a data processing apparatus corresponding to sixth, seventh and eighth data processing apparatus of the present invention comprises an occurrence frequency producing editor 41, a data comparing editor 42, a code converting editor 43, a level adjusting editor 44, a memory 45, an EPROM 46, a display 47, a keyboard 48, a central processing unit (CPU) 49, an input data file 50, a compressed data file 51 and a bus 52.

The occurrence frequency producing editor 41 is an example of the data producing means 31. Pieces of input data DIN to be compressed are input to the occurrence frequency producing editor 41, and an occurrence frequency table in which the relationship between the input data DIN and occurrence frequencies of the input data DIN is listed is produced. In the occurrence frequency producing editor 41, all of the input data DIN to be compressed or a piece of input data DIN to be compressed are fetched, and the occurrence frequency table is produced. The occurrence frequency of each of the input data DIN is determined according to an addition or an accumulation.

For example, as shown in Table 2, 256 pieces of input data "00" to "FF" respectively indicated by two hexadecimal codes and occurrence frequencies indicated by a decimal notation are comparatively listed by the editor 21.

TABLE 2

| input data | occurrence frequencies |
|---|---|
| 00 | 75 |
| 01 | 50 |
| 02 | 100 |
| 03 | 75 |
| 04 | 50 |
| — | — |
| FD | 100 |
| FE | 50 |
| FF | 50 |

In Table 2, for example, an occurrence frequency for the input data "00" is 75, an occurrence frequency for the input data "01" is 50, an occurrence frequency for the input data "02" is 100, and an occurrence frequency for the input data "FF" is 50. Also, the occurrence frequency table is renewed in the occurrence frequency producing editor 41 of a seventh data processing apparatus each time a piece of input data DIN to be compressed is input, according to a seventh embodiment.

The data comparing editor 42 is an example of the data predicting means 32, and the occurrence of a piece of next input data subsequent to a piece of input data DIN to be compressed is predicted while referring the occurrence frequency table produced in the occurrence frequency producing editor 41. In detail, pieces of input data respectively having an occurrence frequency written in the occurrence frequency table are compared with a piece of next input data subsequent to a piece of input data DIN to be compressed in the data comparing editor 42, and the occurrence of the next input data is predicted according to the comparison result.

The code converting editor 43 is an example of the data allocating means 33, and a piece of input data DIN is converted into a piece of positional information according to the occurrence prediction of the input data DIN obtained in the data comparing editor 22. In detail, the higher an occurrence frequency of the input data DIN, the shorter the length of a piece of positional information into which the input data DIN is converted by the code converting editor 43. Therefore, a code table shown in Table 3 is obtained by converting the input data listed in the Table 2 into pieces of positional information coded.

TABLE 3

| input data | occurrence frequencies | positional information |
|---|---|---|
| 02 | 100 | 00 |
| FD | 100 | 01 |
| 00 | 75 | 100 |
| 03 | 75 | 101 |
| 01 | 50 | 1100 |
| 04 | 50 | 1101 |
| FE | 50 | 1110 |
| FF | 50 | 1111 |
| — | — | — |

In Table 3, the input data "02" and "FD" respectively having a high occurrence frequency are converted into pieces of positional information "00" and "01" having the shortest bit length, the input data "00" and "03" respectively having a second high occurrence frequency are converted into pieces of positional information "100" and "101" having 3-bit length, and the input data "01 ", "04", "FE" and "FF" respectively having a third high occurrence frequency are converted into pieces of positional information "1100 ", "1101 ", "1110" and "1111" having 3-bit length. It is applicable that the occurrence frequency producing editor 41 have a code table producing function of the code converting editor 43.

A compressed data format in each of the embodiments is shown in FIG. 20(A). In FIG. 20(A), a piece of compressed data DOUT is composed of a piece of positional information coded and an identification code added to a head of the positional information. An example of the combination of the positional information and the identification code is shown in Table 4.

TABLE 4

| identification code | position (decimal) | bit width of positional information | contents of positional information |
|---|---|---|---|
| 00 | 0, 1 | 1 bit | 0, 1 |
| 010 | 0 to 2 | 2 bits | 00, 01, 10, 11 |
| 011 | 6 to 13 | 3 bits | 000, 001, 010, 011, 100, 101, 110, 111, |
| 1 | 14 to 255 | 8 bits | 00000000 to 11111111 |

In Table 4, four types of identification codes are used to allocate one of the identification codes to each of 256 data samples for the purpose of identifying the positional information. To be concrete, an identification code "00" is allocated to identify pieces of positional information placed at a head position or a first position, an identification code "010" is allocated to identify pieces of positional information placed positions ranging from a second position to a fifth position, an identification code "011" is allocated to identify pieces of positional information placed positions ranging from an eighth position to a thirteenth position, and an identification code "1" is allocated to identify pieces of positional information placed positions ranging from an fourteenth position to a twenty-fifth position.

Also, a bit width (or the number of coded bits) of the positional information having the identification code "00" is set to one bit, and the positional information having the identification code "00" is expressed by "0" or "1". A bit width of the positional information having the identification code "010" is set to two bits, and the positional information having the identification code "010" is expressed by "00 ", "01 ", "10" or "11". A bit width of the positional information having the identification code "011" is set to three bits, and the positional information having the identification code "011" is expressed by "000 ", "001", "0 10 ", "011 ", "100 ", "101 ", "110 " or "111". A bit width of the positional information having the identification code "1" is set to eight bits, and the positional information having the identification code "1" is expressed by a plurality of coded bit strings "00000000" to "11111111". Functions of the code converting editor 23 are described later with reference to FIGS. 19(A) and 19(B).

The level adjusting editor 44 is an example of the level adjusting means 34, and a length of the compressed data into which the input data DIN to be compressed is converted by the code converting editor 43 is adjusted in an eighth data processing apparatus of the present invention. Functions of the level adjusting editor 44 are described later in detail with reference to FIGS. 24 and 25.

In the memory 45, one or more pieces of input data DIN to be compressed are temporarily stored when the input data DIN is compressed. A random access writable and readable memory is, for example, used for the memory 45. Also, one or more pieces of input data DIN to be decoded are temporarily stored when the input data DIN is decoded.

Figure 21A:
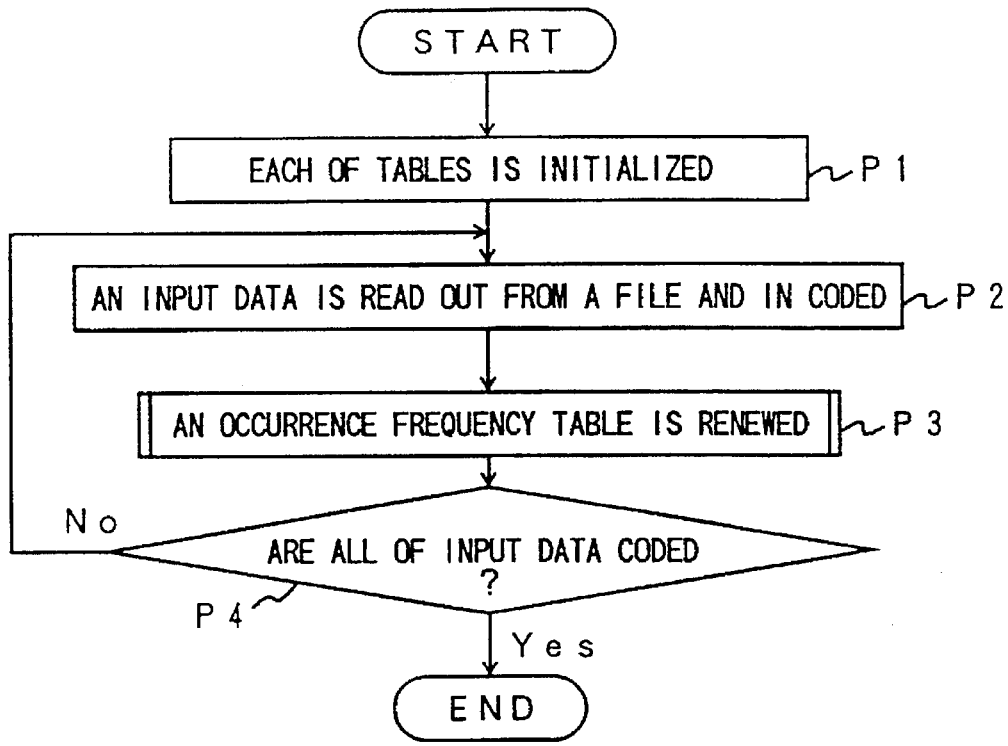
FIG. 21(A) is a flow chart of a data compressing operation according to the seventh embodiment.
Figure 21B:
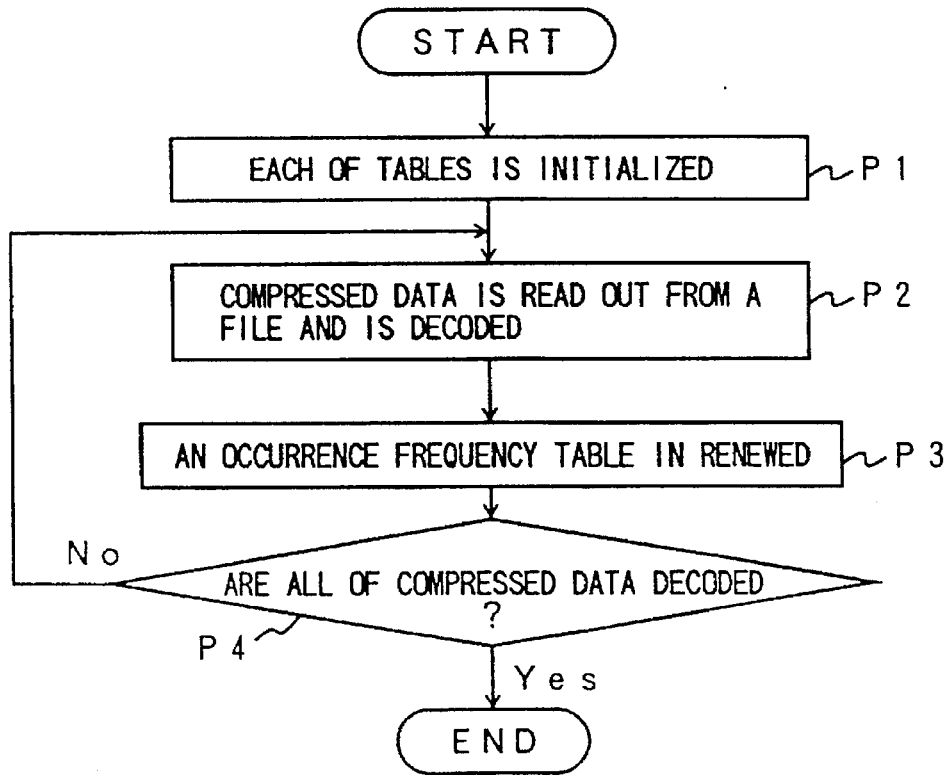
FIG. 21(B) is a flow chart of a data reproducing (or decoding) operation according to the seventh embodiment.
Figure 24A:
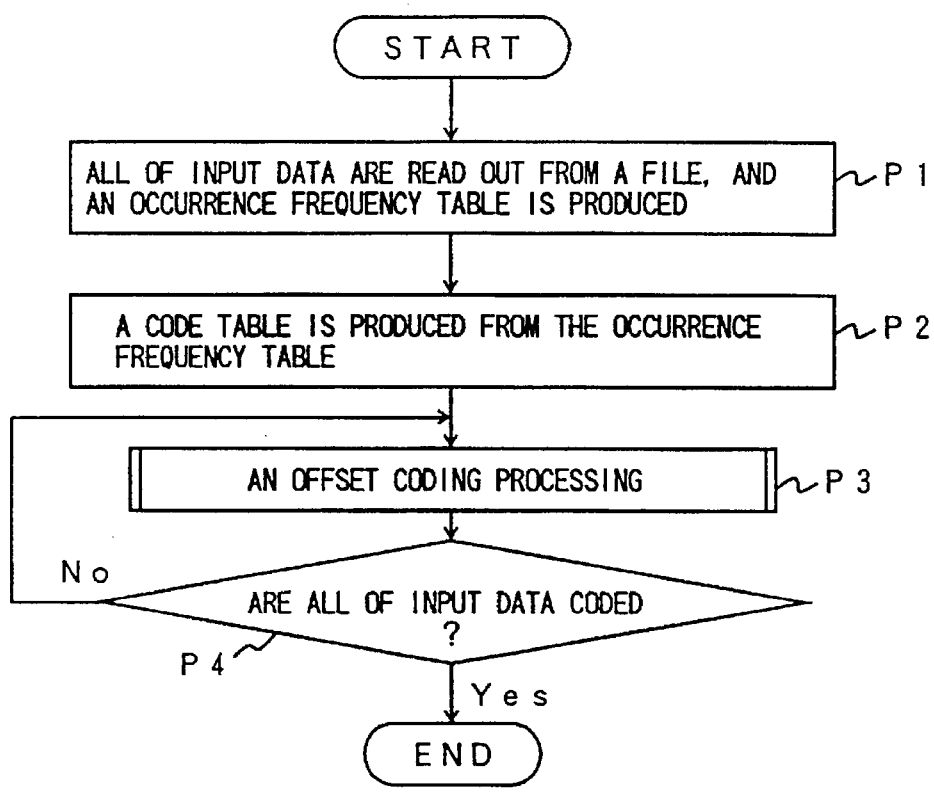
FIG. 24(A) is a flow chart of a data compressing operation according to the eighth embodiment.

The EPROM 46 is made of a programmable read only memory to store a plurality of control algorithms used in the embodiments. For example, a data compressing algorithm shown in FIG. 18(A) or a data reproducing algorithm shown in FIG. 18(B) is stored in the EPROM 46 in the sixth embodiment. In the seventh embodiment, a data compressing algorithm (or a main routine) shown in FIG. 21(A) or a data reproducing algorithm shown in FIG. 21(B) is stored in the EPROM 46, and a renewal algorithm (or a sub-routine) of the occurrence frequency table shown in FIG. 22 which is used in the main routine shown in FIG. 21(A) is stored in the EPROM 46. In the eighth embodiment, a data compressing algorithm shown in FIG. 24 (A) or a data reproducing algorithm shown in FIG. 24 (B) is stored in the EPROM 46, and a level adjusting algorithm (or a sub-routine) of the positional information shown in FIG. 25 which is used in the main routine shown in FIG. 24(A) is stored in the EPROM 46. The detail of the above control algorithms is described in the embodiments. The display 47 is used as an auxiliary tool for assisting the input and output of the keyboard 48 and the CPU 49. The keyboard 48 is used as an input tool for inputting pieces of initial setting data and a starting instruction for the editors 41 to 44 as a plurality of control sentences. The CPU 49 is used to control the input and output of the editors 41 to 44, the memory 45, the EPROM 46, the display 47, the keyboard 48, the input data file 50 and the compressed data file 51. The input data file 50 is used to store pieces of input data DIN to be compressed in case of the data compressing operation and to store pieces of decoded data in case of the data reproducing operation. The compressed data file 51 is a memory for storing pieces of compressed data in case of the data compressing and reproducing operations and is made of the same memory unit as that in the input data file 50. Therefore, the data compressing apparatus and the data reproducing apparatus applied for the sixth to eighth embodiments are composed of the above elements, the input data to be compressed can be coded, and the compressed data coded can be decoded.

(6) Description of the sixth embodiment

A sixth data compressing method according to the sixth embodiment of the present invention is described with reference to FIG. 18(A) to describe a sixth data processing apparatus. The data compressing flow chart shown in FIG. 18(A) corresponds to a control algorithm stored in the EPROM 46 shown in FIG. 17.

For example, in case where a piece of input data DIN to be compressed is coded while predicting the occurrence of a piece of next input data subsequent to the input data DIN and a piece of compressed data DOUT is output, as the data compressing flow chart is shown in FIG. 18(A), a series of pieces of input data is read out from the input data file 50 in a step P1, and the occurrence frequency table is produced in the occurrence frequency producing editor 41 by counting the input data each time a type of input data is input to the occurrence frequency producing editor 41.

In detail, as shown in FIG. 19(A), the occurrence frequency table in which 256 pieces of input data "00" to "FF" respectively indicated by two hexadecimal codes and occurrence frequencies of the input data indicated by a decimal notation are listed in a table is produced by the editor 41. In an occurrence frequency table T1 according to the sixth embodiment, an occurrence frequency of the input data "00" is set to 3, an occurrence frequency of the input data "01" is set to 0, an occurrence frequency of the input data "02" is set to 23, an occurrence frequency of the input data "03" is set to 0, an occurrence frequency of the input data "04" is set to 10, an occurrence frequency of the input data "FE" is set to 5, and an occurrence frequency of the input data "FF" is set to 1.

In the example of the occurrence frequency table T1 shown in FIG. 19(A), in case where pieces of input data DIN in which a word "and" frequently occurs are input to the occurrence frequency producing editor 41, a piece of data (or a character) "n" expressed by "6E " in a hexadecimal notation subsequent to a piece of data "a" expressed by "61" in the hexadecimal notation frequently occurs. Also, a word "u" subsequent to a word "q" frequently occurs. Therefore, a connection relationship between an objective character and a front or rear character of the objective character and another connection relationship between a front character and a rear character in a word can be grasped by obtaining those pieces of statistical information. In this embodiment, the occurrence frequency table is produced after all of the input data DIN are input to the occurrence frequency producing editor 41. However, it is applicable that the occurrence frequency table be produced each time one of the input data DIN to be compressed is input to the occurrence frequency producing editor 41.

Thereafter, a code table is produced from the occurrence frequency table in a step P2. In detail, as shown in FIG. 19(A), the input data DIN listed in the occurrence frequency table T1 are rearranged in order of degree of the occurrence frequency. As a result, the input data "02" is written in a top position of a rearranged data table T2, and the input data "04", "FE", "00", "FF", - - - ,"01" and "03" are arranged in that order.

Thereafter, a piece of input data DIN to be compressed is read out from the input data file 50 and is coded in the code converting editor 43 in a step P3. In this case, the occurrence of a piece of next input data subsequent to the input data DIN to be compressed is predicted while referring the occurrence frequency table produced in the occurrence frequency producing editor 41. For example, pieces of input data respectively having an occurrence frequency written in the occurrence frequency table are compared with the next input data subsequent to the input data DIN to be compressed in the data comparing editor 42. Therefore, the occurrence of the character "n" subsequent to the character "a" in the word "and" and the occurrence of the character "u" subsequent to the character "q" are predicted.

In addition, as shown in FIG. 19(B), the input data DIN are converted into pieces of positional information in the code converting editor 43, and the positional information are placed in a plurality of relative positions 0 to 15, - - corresponding to the input data DIN rearranged in the order from the input data "02" having the highest occurrence frequency to the input data "03" having the lowest occurrence frequency. That is, in case where the input data DIN listed in the rearranged data table T2 shown in FIG. 19(A) are converted into pieces of positional information while adding an identification code to each of the positional information, a table shown in FIG. 19(B) is obtained. The input data placed in the relative positions "0" and "1" are converted into the positional information "0" and "1" while adding the identification code "00", the input data placed in the relative positions "2" to "5" are converted into the positional information "00 ", "01," 10" and "11" while adding the identification code "010", the input data placed in the relative positions "6" to "13" are converted into the positional information "000 ", "001,"010","011","100", "101", "110" and "111" while adding the identification code "011 ".

Thereafter, it is judged in a step P4 whether or not all of the input data DIN stored in the input data file 50 are compressed. In case where all of the input data DIN are compressed (YES), the control algorithm is finished. In case where all of the input data DIN are not compressed (NO), the control algorithm returns to the step P3, and the coding processing is repeatedly performed.

Therefore, the input data DIN to be compressed can be coded while predicting the occurrence of the next input data subsequent to the input data DIN, and the compressed data DOUT obtained can be stored in the compressed data file 51.

Next, a sixth compressed data reproducing (or decoding) method according to the sixth embodiment of the present invention is described. In the decoding flow chart shown in FIG. 18(B), a piece of compressed data to be decoded is read out from the compressed data file 51 and a code table is composed of an identification code and a piece of positional information relating to the compressed data in a step P1. Therefore, the code table described in FIGS. 19(A) and 19(B) is, for example, reproduced. Next, the compressed data to be decoded is again read out from the compressed data file 51 and is decoded while referring the code table in a step P2. The decoding operation is performed according to the configuration of a code tree used in general and shown in FIG. 20(B).

Thereafter, it is judged in a step P3 whether or not all of pieces of compressed data stored in the compressed data file 51 are decoded. In case where all of the compressed data are decoded (YES), the control algorithm is finished. In case where all of the compressed data are not decoded (NO), the control algorithm returns to the step P2, and the decoding processing of the compressed data is continued. Therefore, all of the compressed data are decoded to produce pieces of original data, and the original data are stored in the input data file 50.

As is described above, in the data processing apparatus according to sixth, seventh and eighth embodiments of the present invention, as shown in FIG. 17, because the data processing apparatus comprises the occurrence frequency producing editor 41, the data comparing editor 42, the code converting editor 43 and the level adjusting editor 44, when the occurrence frequency table is produced by the occurrence frequency producing editor 41, the occurrence of a character or a series of characters occurring subsequent to the input data to be compressed can be predicted by comparing the character or the series of characters with the input data listed in the occurrence frequency table by the data comparing editor 42 while referring the occurrence frequency table. The character or the series of characters of which the occurrence frequency is predicted is converted into a piece of positional information by the code converting editor 43 on condition that a bit length of the positional information converted is shortened as the occurrence frequency of the character or the series of characters becomes high and the bit length of the positional information converted is lengthened as the occurrence frequency of the character or the series of characters becomes low.

Accordingly, as the occurrence frequency of the input data to be compressed is higher, the input data is placed in an upper position of the occurrence frequency table, and the input data placed in each of the relative positions from the highest position can be decoded (a provisional call: an offset coding). In particular, in case where a series of input data in which the order of characters is predicted by the data comparing editor 42 is input, a data compression efficiency of a plurality of input data uniformly occurring can be enhanced and a data processing speed can be heightened, as compared with the Huffman coding method in which an occurrence probability of a single character is calculated according to the configuration of a conventional code tree.

Also, because the lengths of the compressed data converted by the code converting editor 43 are adjusted by the level adjusting editor 44 according to the types of the input data to be compressed in the data processing apparatus of the present invention, the compressed data of which the lengths are dynamically level-adjusted according to the types of the input data can be obtained.

Also, as the data compressing flow chart is shown in FIG. 18(A), in the sixth data compressing method according to the sixth embodiment of the present invention, the occurrence frequency for each type of input data to be compressed is counted, and the occurrence frequency table is produced in the step P1. Therefore, a connection relationship between an objective character and a front or rear character of the objective character in the input data DIN read out from the input data file 50 and another connection relationship between a front character and a rear character in the input data DIN can be grasped.

Also, in case where pieces of input data DIN in which a word "and" frequently occurs are input to the occurrence frequency producing editor 41, the regularity that a piece of data (or a character) "n" subsequent to a piece of data "a" frequently occurs and a word "u" subsequent to a word "q" frequently occurs can be reliably grasped.

Also, because the occurrence of a piece of next input data subsequent to the input data DIN to be compressed is predicted in the step P3 while referring the occurrence frequency table in the step P3, the occurrence of the character "n" subsequent to the character "a" in the word "and" and the occurrence of the character "u" subsequent to the character "q" can be predicted.

In addition, while referring the code table, a bit length of a piece of positional information obtained by converting a piece of input data DIN to be compressed is shortened in the step P3 as the occurrence frequency of the input data DIN becomes high and a bit length of a piece of positional information obtained by converting a piece of input data DIN to be compressed is lengthened in the step P3 as the occurrence frequency of the input data DIN becomes low. Therefore, a piece of compressed data DOUT having the positional information and an identification code can be directly output from the code table.

Figure 3A:
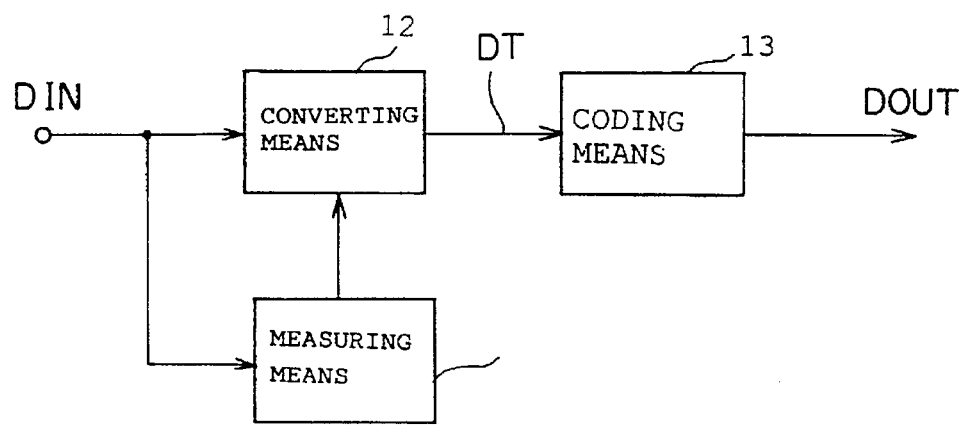
FIG. 3(A) is a constitutional view of a first conventional data compressing apparatus according to a second previously proposed art.
Figure 3B:
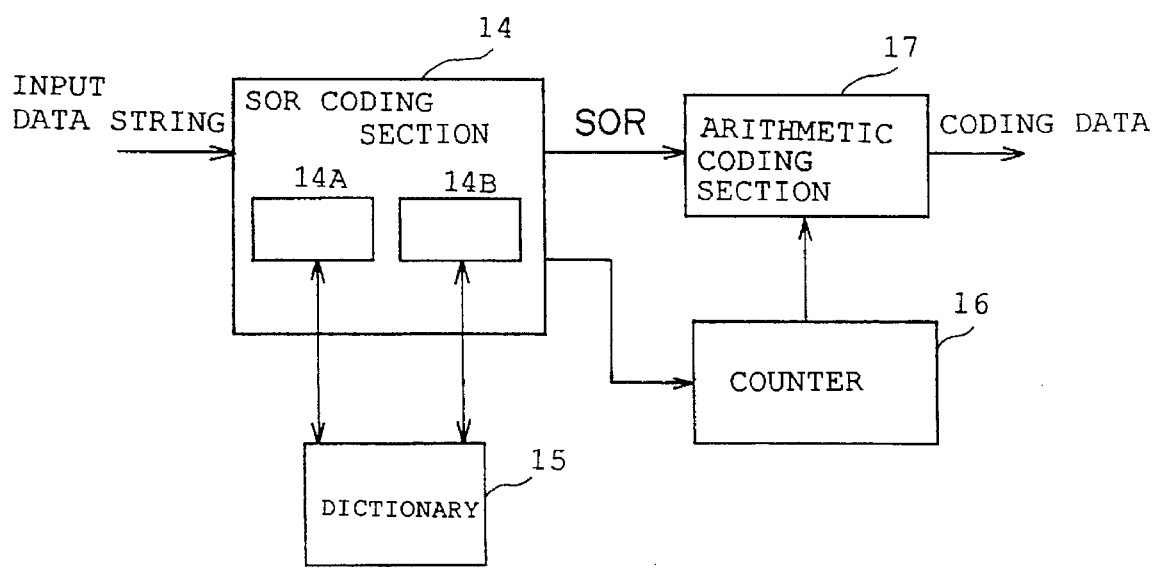
FIG. 3(B) is a constitutional view of a second conventional data compressing apparatus according to the second previously proposed art.

Therefore, because the occurrence of a series of characters or a character is predicted, a concept of the dictionary search disappears. In particular, in case where a series of input data in which the order of characters is predicted by the data comparing editor 42 is input, the dictionary search for searching the same series of characters in the second apparatus shown in FIG. 3(B) is not required, and the dictionary searching time and the data transmission time are reduced.

To shorten the coding processing time and the decoding processing time more over, it is applicable that each of the input data DIN having 8 bits be coded to have the same 8 bits without converting the input data DIN into the positional information when the identification code "1" is added as shown in Table 4 and FIG. 19(B). In this case, a data compressing efficiency defined as a ratio of an input data capacity to a compressed data capacity: (input data capacity) /(compressed data capacity) v 100%.

Also, to enhance the data compressing efficiency, it is preferred that a connection between the input data DIN and a series of characters subsequent to the input data DIN be judged without merely judging a connection between the input data DIN and a single character subsequent to the input data DIN. In this case, though the data processing speed is limited and the memory capacity required is enlarged, the data compressing efficiency can be heightened.

(7) Description of a seventh embodiment

Figure 22:
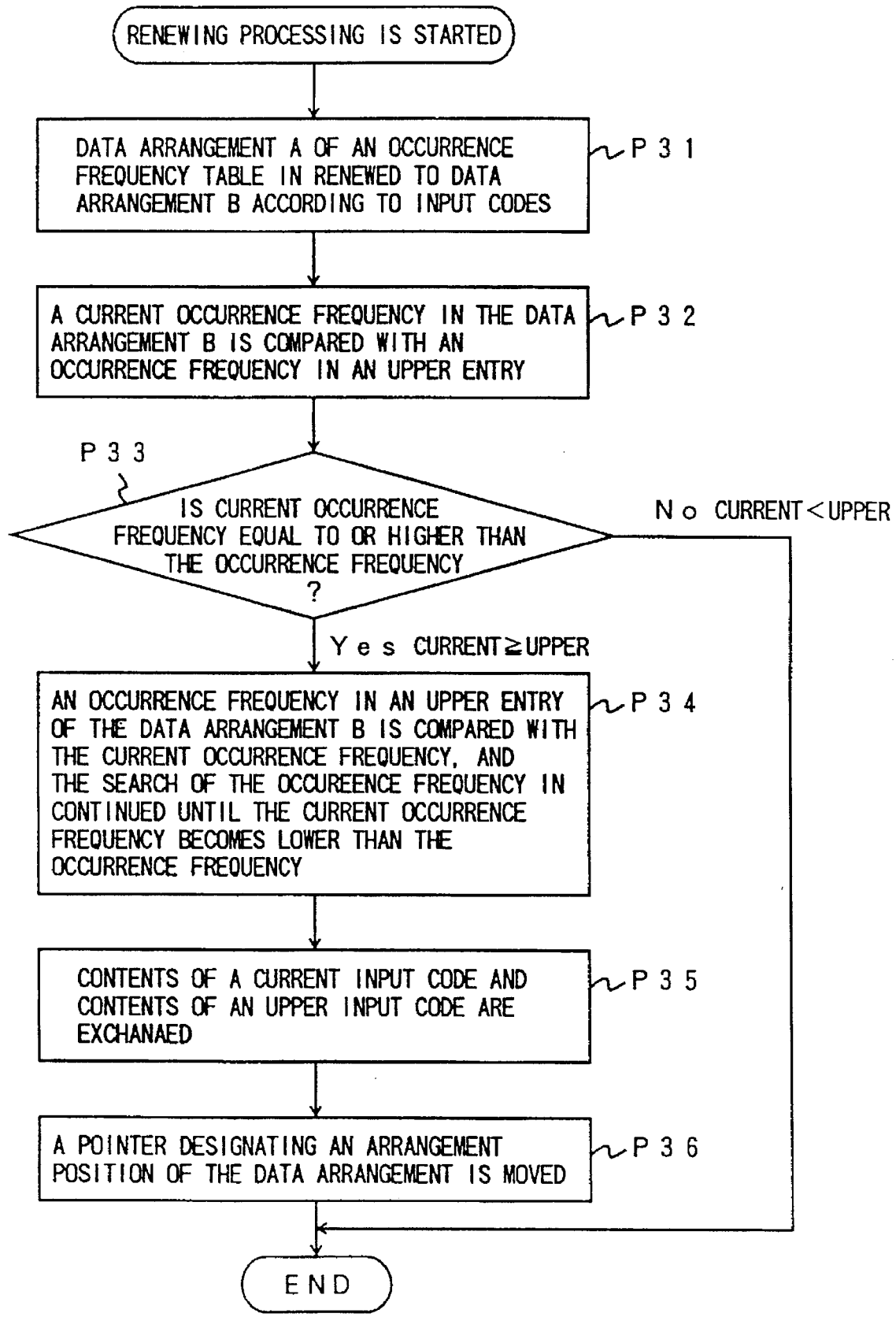
FIG. 22 is a flow chart of the renewal of an occurrence frequency table.
Figure 23A:
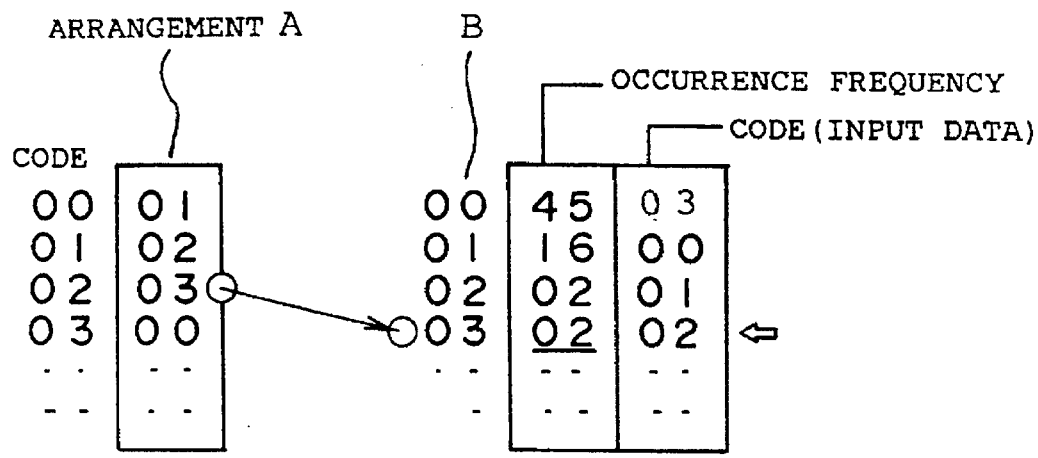
FIGS. 23(A) to 23(C) are explanatory views respectively showing the exchange of pieces of input data listed in the occurrence frequency table in case of the renewal of the occurrence frequency table.
Figure 23B:
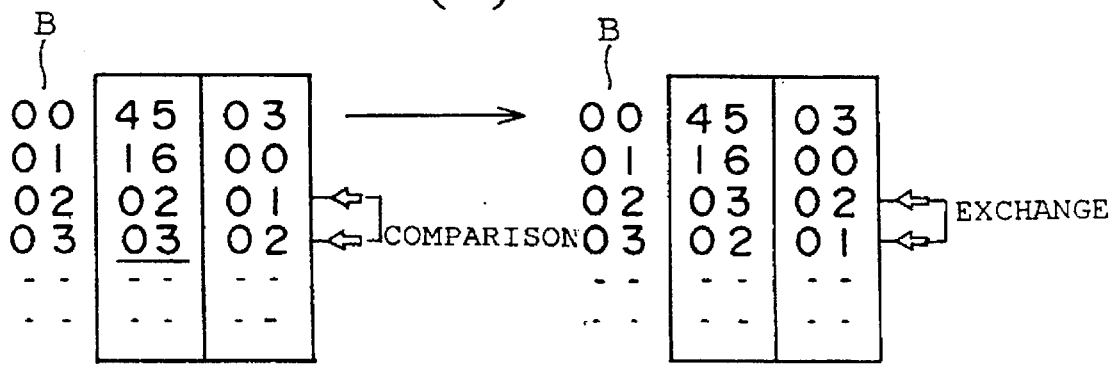
Figure 23C:
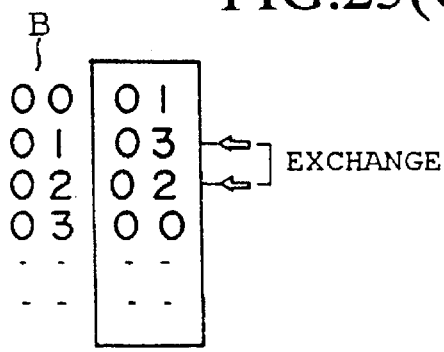

FIG. 21(A) is a flow chart of a seventh data compressing method according to a seventh embodiment, FIG. 21(B) is a flow chart of a seventh data reproducing (or decoding) method according to the seventh embodiment, FIG. 22 is a flow chart of the renewal of the occurrence frequency table, and FIGS. 23(A) to 23(C) are explanatory views respectively showing the exchange of the input data listed in the occurrence frequency table in case of the renewal of the occurrence frequency table. Control algorithms corresponding to the flow charts shown in FIGS. 21 and 22 are stored in the EPROM 46 shown in FIG. 17.

A different point of seventh data processing apparatus and method according to the seventh embodiment from the sixth data processing apparatus and method according to the sixth embodiment is that the occurrence frequency table and the code table are dynamically renewed each time a piece of input data DIN to be decoded is input to the occurrence frequency producing editor 41.

In case where a data arrangement A of the input data DIN in the occurrence frequency table shown in FIG. 23(A) is renewed, as shown in FIG. 21(A), the occurrence frequency table and the code table are initialized in a step P1. In FIG. 23(A), the data arrangement A of the input data DIN in the occurrence frequency table in a pre-renewal condition is, for example, set to pieces of input data "00", "01", "02", "03", - - - in that order. Thereafter, in a step P2, a piece of input data DIN to be compressed is read out from the input data file 50 and is coded. As is described in the sixth embodiment, the coding of the input data DIN is performed in the code converting editor 43 for each of bytes or characters in the input data DIN.

Thereafter, the occurrence frequency table is renewed in a step P3. In detail, the occurrence frequency table is renewed each time a piece of input data DIN (or an input code) is input to the occurrence frequency producing editor 41, and the renewal of the occurrence frequency table is performed according to a sub-routine shown in FIG. 22. As shown in FIG. 22, the data arrangement A of the occurrence frequency table is renewed to a data arrangement B according to a plurality of input codes (or pieces of input data DIN) input to the editor 41 one after another in a step P31. In this example, as shown in FIG. 23(A), a plurality of input codes (or the input data DIN) "03" (occurrence frequency 45),"00" (occurrence frequency 16),"01" (occurrence frequency 2),"02" (occurrence frequency 2) is input one after another to the occurrence frequency table, and an arrangement position "03" of the data arrangement B corresponding to the input code "02" is designated by a pointer to currently receive the input code "02".

Thereafter, in a step P32, a current occurrence frequency of a current input code currently input in the data arrangement B is compared with a compared occurrence frequency of an upper code placed in an upper arrangement position (or an upper entry) than that of the current input code, for the purpose of moving the current input code having a higher occurrence frequency than that of the compared input code to the upper entry. Thereafter, in a step P33, as a result of the comparison of the occurrence frequencies, in case where the current occurrence frequency of the current input code placed in a current entry is equal to or higher than the compared occurrence frequency placed in the upper entry (YES), the control algorithm proceeds to a step P34. In contrast, as a result of the comparison of the occurrence frequencies, in case where the current occurrence frequency of the current input code is lower than the compared occurrence frequency placed in the upper entry (NO), the renewal of the occurrence frequency table is not performed, and the control algorithm returns to the main routine shown in FIG. 21(A).

In case where the current occurrence frequency is equal to or higher than the compared occurrence frequency (YES), in the step P34, the compared occurrence frequency placed in the upper entry in the data arrangement B is searched. This search is continued until the current occurrence frequency of the current input code becomes lower than a compared occurrence frequency placed in another upper entry while replacing the upper entry to another one placed in an upper position moreover. Thereafter, the arrangement positions of the current input code and the upper entry are exchanged in a step P35. In other words, contents (the input code and the occurrence frequency) of the current input code and contents (the input code and the occurrence frequency) of an upper input code placed in the upper entry are exchanged. In FIG. 23(B), the current input code "02" placed in the arrangement position "03" and the upper input code "01" placed in an arrangement position (or the upper entry) "02" are exchanged. Therefore, the data arrangement A of the pre-renewing condition shown in FIG. 23(A) is renewed to the data arrangement B shown in FIG. 23(C) because the entries "02" and "03" are exchanged. Also, the positional information of the input codes relating to the above renewal of the data arrangement A are rewritten by the code converting editor 43.

Thereafter, the pointer designating an arrangement position of the data arrangement is moved to another arrangement position in a step P36, and the control algorithm is returned to the main routine shown in FIG. 21(A). Thereafter, in a step P4 of the main routine, it is judged whether or not all of pieces of input data to be compressed stored in the input data file 50 are coded. In case where all of the input data DIN to be compressed are coded (YES), the control algorithm is finished. In contrast, in case where all of the input data DIN to be compressed are not coded (NO), the control algorithm returns to the step P2, and the coding processing of the input data DIN is continued.

Accordingly, the input data DIN can be coded while dynamically renewing the code table produced from the occurrence frequency table, and the compressed data obtained by coding the input data DIN can be stored in the compressed data file 51.

Next, a seventh compressed data reproducing (or decoding) method according to the seventh embodiment of the present invention is described.

As a flow chart of a seventh data reproducing (or decoding) method according to the seventh embodiment is shown in FIG. 21(B), in case where a piece of compressed data is decoded while dynamically renewing the occurrence frequency table and the code table, the occurrence frequency table and the code table are renewed in a step P1. Thereafter, in a step P2, a piece of compressed data is read out from the compressed data file 51 and is decoded. Thereafter, the occurrence frequency table is renewed each time a piece of compressed data is input to the occurrence frequency producing editor 41. Therefore, pieces of compressed data are reproduced to pieces of original data.

As is described above, in the seventh data compressing method according to the seventh embodiment of the present invention, as shown in FIG. 21(A), the occurrence frequency table is renewed each time a piece of input data to be compressed is input to the editor 41. Therefore, the positional information can be rewritten at a short time by the code converting editor 43 while renewing of the occurrence frequency table in the occurrence frequency producing editor 41, and the code table can be dynamically reconstructed. Also, the renewal of the occurrence frequency table can be performed by merely exchanging a part of the input data, and it is not requited to exchange all of the input data listed in the occurrence frequency table.

Accordingly, it is not required to include the code table in the compressed data, and the data compressing efficiency can be enhanced. Also, the input data can be dynamically coded for each of bytes or characters of the input data. Therefore, in case where the data compressing function according to the seventh embodiment is used for an objective apparatus in which a memory capacity is limited, a memory region of the objective apparatus can be efficiently utilized.

(8) Description of an eighth embodiment

Figure 24B:
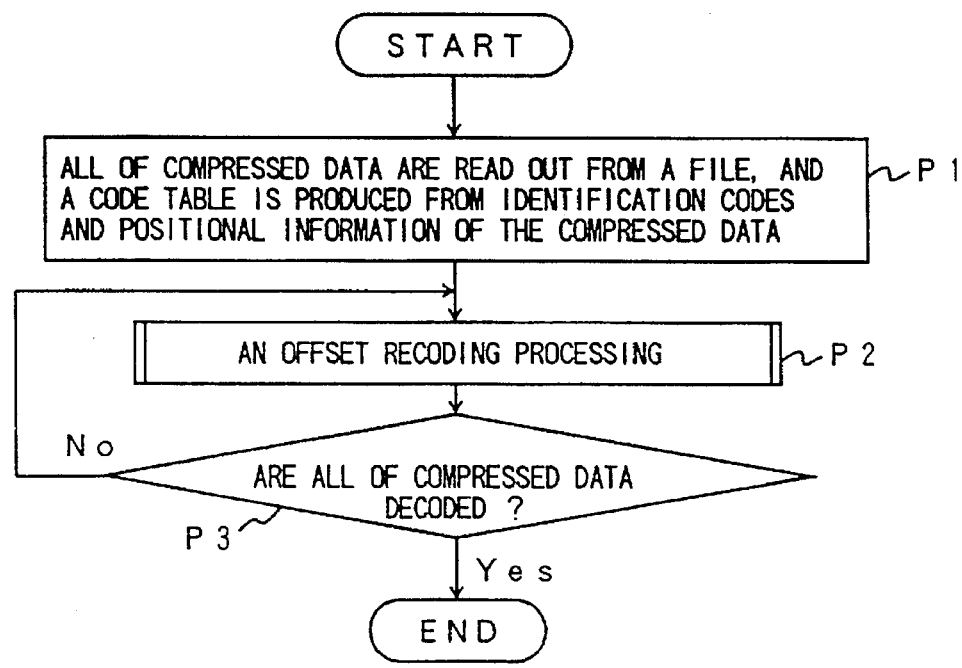
FIG. 24(B) is a flow chart of a data reproducing (or decoding) operation according to the eighth embodiment.
Figure 25:
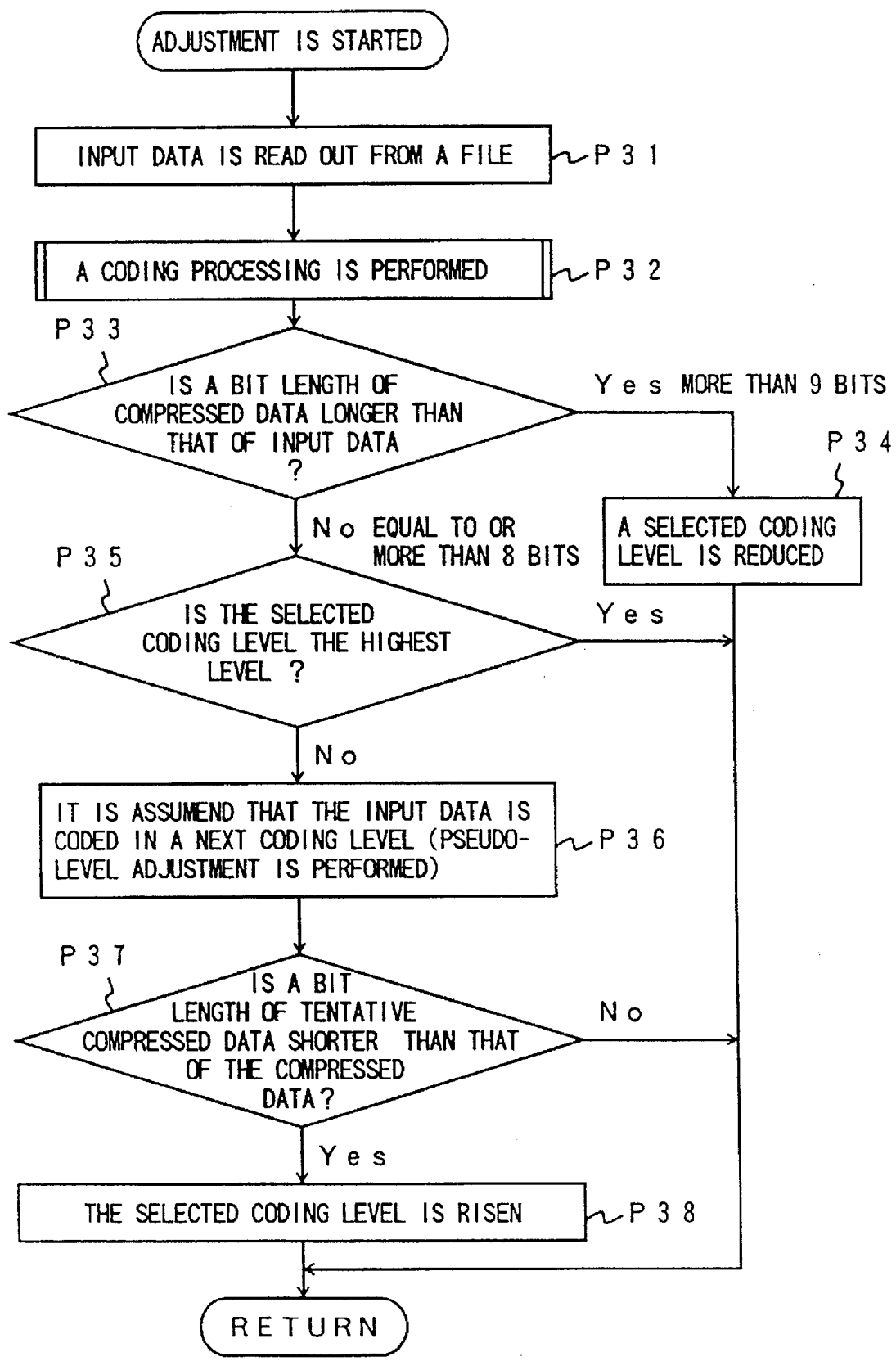
FIG. 25 is a flow chart showing a level adjustment of a piece of positional information in case of the data compressing operation.

FIG. 24(A) is a flow chart of an eighth data compressing method according to an eighth embodiment, FIG. 24(B) is a flow chart of an eighth data reproducing (or decoding) method according to the eighth embodiment, and FIG. 25 is a flow chart showing a level adjustment of a piece of positional information in case of a data compressing operation. Control algorithms corresponding to the flow charts shown in FIGS. 24 and 25 are stored in the EPROM 46 shown in FIG. 17.

A different point of eighth data processing apparatus and method according to the eight embodiment from the sixth and seventh data processing apparatuses and methods according to the sixth and seventh embodiments is that a length of a piece of compressed data is adjusted after a piece of input data to be compressed is converted into a piece of positional information composing the compressed data. In the sixth and seventh data processing methods, when a plurality of occurrence frequencies of pieces of next characters occurring subsequent to pieces of input data DIN to be compressed are almost the same around an average value or when the number of input data to be compressed are not sufficiently input to the occurrence frequency producing editor 41, the occurrence of the next data cannot be accurately predicted.

Therefore, features of the eighth embodiment of the present invention are that the length of the compressed data is adjusted and the degradation of the data compressing efficiency is prevented. For example, in case where the input data to be compressed is a piece of program data, a plurality of transferring instructions written according to a machine language are distributed one-sidedly. For example, in case where a piece of next input data subsequent to an operation code is a jump instruction having an address, an occurrence probability of a next byte is averaged.

A type of a piece of data is judged from an extending code of a file. In general, pieces of data in an operation system are determined according to a regularity. For example, in an MS-DOS of a personal computer, in case of an extending code=EXE, it is judged that a piece of input data is a file of an execution form (a machine language). That is, in case where the distribution of the occurrence frequencies is definitely one-sided, a length of a piece of compressed data converted in a first coding is adjusted. Therefore, the positional information of the compressed data can be moreover shortened, and the data compressing efficiency is enhanced.

Table 5 shows constitutional contents of each of pieces of compressed data for a piece of input data having a byte (or 8 bits). That is, in the eighth embodiment, 7 types of coding levels including a zeroth coding level "0" in which a piece of original data is converted into a code having 8 bits without adding an identification code are prepared, and pieces of compressed data are produced according to the 7 types of coding levels.

TABLE 5

| level | constitutional contents of compressed data |
| --- | --- |
| 0 | original data having 8 bits is converted into a code having the same 8 bits without identification code |
| 1 | identification code "00" + positional information having 4 bits (0 to 15), total 6 bits |
|   | identification code "010" + positional information having 4 bits (16 to 31), total 7 bits |
|   | identification code "011" + positional information having 5 bits (32 to 63), total 8 bits |
|   | identification code "10" + positional information having 6 bits (64 to 127), total 8 bits |
|   | identification code "11" + positional information having 7 bits (128 to 255), total 9 bits |
| 2 | identification code "000" + positional information having 2 bits (0 to 3), total 5 bits |
|   | identification code "001" + positional information having 3 bits (4 to 11), total 6 bits |
|   | identification code "010" + positional information having 4 bits (12 to 27), total 7 bits |
|   | identification code "011" + positional information having 5 bits (28 to 59), total 8 bits |
|   | identification code "1" + positional information having 8 bits (60 to 255), total 9 bits |
| 3 | identification code "000" + positional information having 1 bit (0 to 1), total 4 bits |
|   | identification code "001" + positional information having 2 bits (2 to 5), total 5 bits |
|   | identification code "010" + positional information having 3 bits (6 to 13), total 6 bits |
|   | identification code "011" + positional information having 4 bits (14 to 29), total 7 bits |
|   | identification code "1" + positional information having 8 bits (30 to 255), total 9 bits |
| 4 | identification code "00" + positional information having 1 bit (0 to 1), total 3 bits |
|   | identification code "010" + positional information |

TABLE 5-continued

| level | constitutional contents of compressed data |
|---|---|
| | having 1 bit (2 to 3), total 4 bits |
| | identification code "011" + positional information |
| | having 2 bits (4 to 7), total 5 bits |
| | identification code "1" + positional information |
| | having 8 bits (8 to 255), total 9 bits |
| 5 | identification code "00" (0 to 1), total 2 bits |
| | identification code "01" + positional information |
| | having 1 bit (1 to 2), total 3 bits |
| | identification code "1" + positional information |
| | having 8 bits (3 to 255), total 9 bits |
| 6 | identification code "0" (0), total 1 bit |
| | identification code "1" + positional information |
| | having 8 bits (1 to 255), total 9 bits |
| | remarks: original data denotes a piece of input data (1 bytes) to be compressed. |

In a first coding level of the Table 5, for example, one of five types of identification codes is allocated to each of 256 data samples to identify 256 pieces of positional information obtained by converting the data samples. In detail, an identification code "00" is allocated to 16 data samples to identify pieces of positional information placed in positions ranging from a head (or a zeroth) position to a fifteenth position, and each of the positional information has 4 bits. Therefore, each of 16 pieces of compressed data respectively composed of the identification code "00" and the positional information has 6 bits. In the same manner, an identification code "010" is allocated to 16 data samples to identify pieces of positional information placed in positions ranging from a sixteenth position to a thirty-first position, and each of the positional information has 4 bits. Therefore, each of 16 pieces of compressed data respectively composed of the identification code "010" and the positional information has 7 bits. Also, an identification code "011" is allocated to 32 data samples to identify pieces of positional information placed in positions ranging from a thirty-second position to a sixty-third position, and each of the positional information has 5 bits. Therefore, each of 32 pieces of compressed data respectively composed of the identification code "011" and the positional information has 8 bits. Also, an identification code "10" is allocated to 64 data samples to identify pieces of positional information placed in positions ranging from a sixty-fourth position to one hundred twenty-seventh position, and each of the positional information has 6 bits. Therefore, each of 64 pieces of compressed data respectively composed of the identification code "10" and the positional information has 8 bits. Also, an identification code "11" is allocated to 128 data samples to identify pieces of positional information placed in positions ranging from a one hundred twenty-eighth position to two hundred fifty-fifth position, and each of the positional information has 7 bits. Therefore, each of 128 pieces of compressed data respectively composed of the identification code "11" and the positional information has 9 bits. In a second coding level of the Table 5, one of the five types of identification codes is allocated to each of 256 data samples, in the same manner as in the first coding level. In detail, an identification code "000" is allocated to 4 data samples to identify pieces of positional information placed in positions ranging from a head (or a zeroth) position to a third position, and each of the positional information has 2 bits. Therefore, each of 4 pieces of compressed data respectively has 5 bits. In the same manner, an identification code "001" is allocated to 8 data samples to identify pieces of positional information placed in positions ranging from a fourth position to an eleventh position, and each of the positional information has 3 bits. Therefore, each of 8 pieces of compressed data respectively has 6 bits. Also, an identification code "010" is allocated to 16 data samples to identify pieces of positional information placed in positions ranging from a twelfth position to a twenty-seventh position, and each of the positional information has 4 bits. Therefore, each of 16 pieces of compressed data respectively has 7 bits. Also, an identification code "011" is allocated to 32 data samples to identify pieces of positional information placed in positions ranging from a twenty-eighth position to a fifth-ninth position, and each of the positional information has 5 bits. Therefore, each of 32 pieces of compressed data respectively has 8 bits. Also, an identification code "1" is allocated to 196 data samples to identify pieces of positional information placed in positions ranging from a sixtieth position to a two hundred fifty-fifth position, and each of the positional information has 7 bits. Therefore, each of 196 pieces of compressed data respectively has 9 bits.

In a third coding level of the Table 5, one of the five types of identification codes is allocated to each of 256 data samples, in the same manner as in the first and second coding levels. In detail, an identification code "000" is allocated to 2 data samples to identify pieces of positional information placed in positions ranging from a head (or a zeroth) position to a first position, and each of the positional information has 1 bits. Therefore, each of 2 pieces of compressed data respectively has 4 bits. In the same manner, an identification code "001" is allocated to 4 data samples to identify pieces of positional information placed in positions ranging from a second position to a fifth position, and each of the positional information has 2 bits. Therefore, each of 4 pieces of compressed data respectively has 5 bits. Also, an identification code "010" is allocated to 8 data samples to identify pieces of positional information placed in positions ranging from a sixth position to a thirteenth position, and each of the positional information has 3 bits. Therefore, each of 8 pieces of compressed data respectively has 6 bits. Also, an identification code "011" is allocated to 16 data samples to identify pieces of positional information placed in positions ranging from a fourteenth position to a twenty-ninth position, and each of the positional information has 4 bits. Therefore, each of 16 pieces of compressed data respectively has 7 bits. Also, an identification code "1" is allocated to 196 data samples to identify pieces of positional information placed in positions ranging from a sixtieth position to a two hundred fifty-fifth position, and each of the positional information has 8 bits. Therefore, each of 196 pieces of compressed data respectively has 9 bits.

In a fourth coding level of the Table 5, one of four types of identification codes is allocated to each of 256 data samples. In detail, an identification code "00" is allocated to 2 data samples to identify pieces of positional information placed in positions ranging from a head (or a zeroth) position to a second position, and each of the positional information has 1 bits. Therefore, each of 2 pieces of compressed data respectively has 3 bits. In the same manner, an identification code "010" is allocated to 2 data samples to identify pieces of positional information placed in positions ranging from a second position to a third position, and each of the positional information has 1 bits. Therefore, each of 2 pieces of compressed data respectively has 4 bits. Also, an identification code "011" is allocated to 4 data samples to identify pieces of positional information placed in positions ranging from a fourth position to a seventh position, and each of the positional information has 2 bits. Therefore, each of 4 pieces of compressed data respectively has 5 bits. Also, an identification code "1" is allocated to 248 data samples to identify pieces of positional information placed in positions ranging from an eighth position to a two hundred fifty-fifth position, and each of the positional information has 8 bits. Therefore, each of 248 pieces of compressed data respectively has 9 bits.

In a fifth coding level of the Table 5, one of three types of identification codes is allocated to each of 256 data samples. In detail, only an identification code "00" is allocated to a data sample to identify a head (or a zeroth) position. Therefore, a piece of compressed data has 2 bits. In the same manner, an identification code "01" is allocated to 2 data samples to identify pieces of positional information placed in a first position and a second position, and each of the positional information has 1 bit. Therefore, each of 2 pieces of compressed data respectively has 3 bits. Also, an identification code "1" is allocated to 253 data samples to identify pieces of positional information placed in positions ranging from a third position to a two hundred fifty-fifth position, and each of the positional information has 8 bits. Therefore, each of 253 pieces of compressed data respectively has 9 bits.

In a sixth coding level of the Table 5, one of three types of identification codes is allocated to each of 256 data samples. In detail, only an identification code "0" is allocated to a data sample to identify a head (or a zeroth) position. Therefore, a piece of compressed data has 1 bit. In the same manner, an identification code "1" is allocated to 255 data samples to identify pieces of positional information placed in positions ranging from a first position to a two hundred fifty-fifth position, and each of the positional information has 8 bits. Therefore, each of 255 pieces of compressed data respectively has 9 bits.

The 7 types of coding levels shown in Table 5 are stored in advance in the memory 45, and pieces of input data DIN to be compressed are coded by the code converting editor 43 while referring the 7 types of coding levels. In the level adjusting editor 44, the coding levels allocated to pieces of compressed data by the code converting editor 43 are checked, and a piece of shorter positional information is allocated to each of one or more pieces of compressed data obtained by converting pieces of input data DIN in which the distribution of occurrence frequencies is definitely one-sided, in place of a piece of positional information allocated to each of the compressed data by the code converting editor 43.

Next, an eighth data compressing method according to the eighth embodiment of the present invention is described.

For example, in case where pieces of input data to be compressed are coded according to the ununiformity of an occurrence frequency distribution, as a data compressing flow chart is shown in FIG. 24(A), all of pieces of input data to be compressed stored in the input data file 50 are read out, and an occurrence frequency table is produced in a step P1. Thereafter, a code table is produced from the occurrence frequency table in a step P2, in the same manner as in the sixth embodiment.

Thereafter, an offset coding processing in which bit lengths of pieces of compressed data obtained by coding the input data are adjusted by adjusting a coding level applied to produce the compressed data with the level adjusting editor 44 in a step P3. In detail, the control algorithm proceeds to a step P31 in a sub-routine shown in FIG. 25. In the step P31, a piece of input data to be compressed is read out from the input data file 50 and is written in the memory 45, and a coding processing is performed for the input data by the code converting editor 43 in a step P32 to obtain a piece of compressed data. As is described in the sixth embodiment, the coding processing is performed for each of bytes or characters. Also, one of the coding levels shown in Table 5 is selected by the code converting editor 43 according to the ununiformity of a distribution of the occurrence frequency produced, and the compressed data is produced by applying a selected coding level.

Thereafter, a bit length of the compressed data is grasped in a step P33. That is, it is judged whether or not a bit length of the compressed data is longer than that of the input data having an 8-bit length. In case where a bit length of the compressed data produced by the code converting editor 43 is equal to or lower than 8 bits (NO), the control algorithm proceeds to a step P35. In contrast, in case where a bit length of the compressed data is higher than 9 bits (YES), the control algorithm proceeds to a step P34, the selected coding level applied to produce the compressed data is reduced to a reduced coding level, and a piece of adjusted compressed data is produced by applying the reduced coding level. Thereafter, the control algorithm returns to the main routine. For example, the fifth coding level is applied as the selected coding level by the code converting editor 43 to produce the compressed data because it is judged by the code converting editor 43 that an occurrence distribution of pieces of next input data subsequent to a piece of input data to be compressed is one-sided. However, when it is judged by the level adjusting editor 44 that the occurrence distribution of the next input data is not one-sided so much, the fourth coding level is adopted by the level adjusting editor 44 as the reduced coding level, and a piece of adjusted compressed data is produced by the code converting editor 43 by applying the fourth coding level.

Also, in case where the bit length of the compressed data is equal to or lower than 8 bits in the step P33, it is judged in the step P35 whether or not the selected coding level is equal to the highest coding level. In case where the selected coding level is equal to the highest coding level (YES), the control algorithm returns to the main routine. In contrast, in case where the selected coding level is not equal to the highest coding level (NO), the control algorithm proceeds to a step P36, and a pseudo-level adjustment is performed to adopt an appropriate coding level. In the pseudo-level adjustment, the input data is tentatively performed by applying a pseudo-level which is one level higher than the selected coding level to find out whether a bit length of the compressed data is shortened or lengthened when the appropriate coding level is applied to produce the compressed data.

Thereafter, it is judged in a step P37 whether or not a bit length of a pieces of tentative compressed data obtained by applying the pseudo-level is shorter than the bit length of the compressed data obtained by applying the selected coding level. In case where the bit length of the tentative compressed data is shorter than the bit length of the compressed data (YES), the control algorithm proceeds to a step P38, and the selected coding level is risen. For example, in case where it is judged by the level adjusting editor 44 that the occurrence distribution of the next input data subsequent to the input data is considerably one-sided after the fifth coding level is applied by the code converting editor 43 because it is judged by the editor 43 that the occurrence distribution is one-sided, the selected coding level is risen to the fourth coding level by one level, and a piece of compressed data adjusted is produced by the code converting editor 43 by applying the fourth coding level. In contrast, in case where the bit length of the tentative compressed data is not shorter than the bit length of the compressed data (NO) in the step P37, the pseudo-level adjustment is cancelled, and the control algorithm returns to the main routine.

Thereafter, in a step P4 of the main routine, it is judged whether or not all of the input data to be compressed stored in the input data file 50 are coded. In case where all of the input data DIN to be compressed are coded (YES), the control algorithm is finished. In contrast, in case where all of the input data DIN to be compressed are not coded (NO), the control algorithm returns to the step P2, and the coding processing of the input data DIN is continued.

Accordingly, the input data to be compressed can be coded according to the ununiformity of an occurrence frequency distribution to shorten the bit lengths of the compressed data, and the compressed data can be stored in the compressed data file 51.

Next, an eighth data reproducing (or decoding) method according to the eighth embodiment of the present invention is described with reference to FIG. 24(B). As a reproducing flow chart stored in the EPROM 46 as a control algorithm is shown in FIG. 24(B), in a step P1, all of pieces of compressed data stored in the compressed data file 51 are read out, and a code table shown in FIGS. 19(A) and 19(B) is reproduced from identification codes and pieces of positional information composing the compressed data. Thereafter, in a step P2, a piece of compressed data is again read out from the compressed data file 51, and the compressed data is decoded while grasping the code table in which the positional information and the identification codes are adjusted according to the level adjustment. The decoding of the compressed data is performed according to the configuration of the code tree shown in FIG. 20(B).

Thereafter, it is judged in a step P3 whether or not all of the compressed data stored in the compressed data file 51 are decoded. In case where all of the compressed data are decoded (YES), the control algorithm is finished. In contrast, in case where all of the compressed data are not decoded (NO), the control algorithm returns to the step P2, and the decoding processing for the compressed data is continued. Therefore, all of the compressed data are decoded to pieces of original data, and the original data are stored in the input data file 50.

As is described above, in the eighth data compressing method according to the eighth embodiment of the present invention, as shown in FIG. 25, because the lengths of the compressed data are adjusted by the level adjusting editor 44 in the steps P33 to P38 after the input data to be compressed are converted into the compressed data by the code converting editor 43 in the step P32, the offset coding processing in which pieces of adjusted compressed data obtained by dynamically adjusting the lengths of the compressed data according to the level adjustment are produced by considering types of the input data can be performed.

That is, in the offset coding processing of the eighth embodiment, because the occurrence frequencies of the input data to be compressed are definitely distributed in case where the input data are formed of pieces of program data, the input data can be converted into the compressed data respectively having a piece of shorter positional information. Also, in case where the occurrence frequencies of the input data to be compressed are one-sidedly distributed, the input data can be converted into the compressed data respectively having a piece of shorter positional information by rising the selected coding level.

In addition, to heighten the data compressing efficiency, it is preferred that pieces of statistic information about the occurrence probability of the input data be collected in advance, the occurrence frequencies of the input data be grasped in advance, and pieces of input data respectively having a high occurrence frequency be initially set in upper addresses of the memory 45 in case where the occurrence frequencies of the input data are grasped.

To be concrete, an initial value of a counter in which an occurrence frequency of an input code corresponding to a piece of input data having a high occurrence frequency is counted is set to one or a value higher than one. Therefore, a probability that the input code is converted into a piece of shorter positional information composed of a shorter coded bit string is heightened. For example, in a computer (C source) program or the like, an occurrence probability of a series of codes "0A" subsequent to a series of codes "0D" indicated according to the hexadecimal notation is high. In this case, a probability that the series of codes "0A" is converted into a piece of shorter positional information is heightened. Therefore, the higher the occurrence frequency of the input data, the higher the probability that the input data is converted into a shorter positional information. Also, even though the amount of statistic information is small or the occurrence frequencies of a plurality of next characters or next character strings subsequent to a character are uniformly distributed around an average value and the prediction of the occurrence of a next character or a next character string, the occurrence of a next character or a next character string can be accurately predicted, and the data compressing efficiency can be enhanced.

As is described above, in the sixth data processing apparatus of the present invention, because the data comparing editor 42 in which the occurrence of a piece of next input data subsequent to a piece of input data DIN to be compressed is predicted while referring the occurrence frequency table produced in the occurrence frequency producing editor 41, a character or a series of characters of the next input data can be converted into a piece of shorter positional information by the data converting editor 43 as an occurrence probability of the character or the series of characters becomes higher, and the character or the series of characters can be converted into a piece of longer positional information by the data converting editor 43 as an occurrence probability of the character or the series of characters becomes lower. Therefore, the compressing efficiency for a series of data can be heightened as compared with that in the Huffman coding method in which an occurrence probability of each of characters is calculated.

Also, in the seventh data processing apparatus of the present invention, because the occurrence frequency table is renewed by the occurrence frequency producing editor 41 each time a piece of input data is input to the editor 41, pieces of positional information can be rewritten at a short time while being followed by the renewal of the occurrence frequency table, and the code table can be dynamically reconstructed. Also, the code table can be renewed without rearranging all of the positional information, and the data compressing operation can be performed at a high speed to shorten the data compressing time.

Also, in the eighth data processing apparatus of the present invention, because bit lengths of pieces of compressed data are adjusted by the level adjusting editor 44 after pieces of input data to be compressed are converted into the compressed data, the offset coding processing in which pieces of adjusted compressed data obtained by dynamically adjusting the lengths of the compressed data according to the level adjustment are produced by considering types of the input data can be performed. That is, in case where the occurrence frequencies of the input data to be compressed are definitely distributed, the input data can be converted into the compressed data respectively having a piece of shorter positional information. Also, in case where the occurrence frequencies of the input data to be compressed are one-sidedly distributed, the input data can be converted into the compressed data respectively having a piece of shorter positional information by rising the selected coding level.

Therefore, in case where a data compressing function for dynamically coding a byte of data or a character having an occurrence frequency is used for an objective apparatus, a memory capacity of the objective apparatus can be reduced.

In the data processing method according to the present invention, because the occurrence frequency table in which an occurrence frequency of each of types of input data to be compressed is listed is produced, a connection relationship between an objective character and a front or rear character of the objective character and another connection relationship between a front character and a rear character in a word can be grasped.

Also, in the data processing method according to the present invention, the compressed data composed of the positional information and the identification code can be directly output from the code table.

Therefore, the data compressing apparatus for coding the input data at a high speed and the data reproducing apparatus for decoding the compressed data at a high speed can be manufactured while predicting the occurrence of the character or the character string. Therefore, the apparatuses contribute to substantially increase a storage capacity of a magnetic disk apparatus or the like and to shorten a transmission time required for a data transmission.

What is claimed is:

1. A data processing apparatus, comprising:
   a dictionary buffer for storing one or more pieces of dictionary data formed by utilizing pieces of input data; and dictionary control means for
      comparing the dictionary data stored in the dictionary buffer with the input data input one after another for the purpose of coding and compressing a piece of particular dictionary data which is included in the dictionary data and agrees with the input data by comparing the dictionary data with the input data or for the purpose of decoding a piece of particular coded compressed data,
      expelling the particular dictionary data from the dictionary buffer in case where the particular dictionary data agrees with the input data, placing the dictionary data stored in a data writing range of the dictionary buffer, from which the particular dictionary data is expelled, close together in a direction, and
      writing a piece of particular input data agreeing with the particular dictionary data in the dictionary buffer in which the dictionary data of the data writing range are placed close together.

2. The data processing apparatus according to claim 1, in which at least one or more input data strings are used as the input data, and at least one or more dictionary data strings are used as the dictionary data.

3. The data processing apparatus according to claim 1, the data processing apparatus further comprising an auxiliary dictionary buffer for storing the particular dictionary data expelled from the dictionary buffer.

4. The data processing apparatus according to claim 1, the data processing apparatus further comprising a fixed dictionary buffer for storing one or more pieces of fixed data or one or more fixed data strings, which are selected from the input data and occur at a high occurring frequency as compared with the input data by examining the occurring frequency of each of the input data in advance, as pieces of dictionary data or a plurality of dictionary data strings.

5. The data processing apparatus according to claim 1 in which the dictionary buffer of the data processing apparatus comprises a memory region formed in a ring-shaped structure by connecting ends of the memory region in a non-ending loop shape, the particular input data being written in the memory region as a piece of dictionary data.

6. A data processing method, comprising the steps of:
   comparing one or more pieces of dictionary data with one or more pieces of input data input one after another for the purpose of coding and compressing a piece of particular dictionary data agreeing with the input data by comparing the dictionary data with the input data or a piece of coded compressed data is decoded;
   expelling the particular dictionary data from a data writing range of a dictionary in case where the particular dictionary data agrees with the input data;
   placing the dictionary data stored in the data writing range of the dictionary, from which the particular dictionary data is expelled, close together in a direction; and
   writing a piece of particular input data agreeing with the particular dictionary data in the dictionary in which the dictionary data of the data writing range are placed close together.

7. The data processing method according to claim 6, the data processing method further comprising the step of referring the particular dictionary data expelled from the dictionary in the step of comparing one or more pieces of dictionary data with one or more pieces of input data.

8. The data processing method according to claim 6, the data processing method further comprising the step of referring one or more pieces of fixed data or one or more fixed data strings, which are selected from the input data and occur at a high occurring frequency as compared with the input data by examining the occurring frequency of each of the input data in advance, in the step of comparing one or more pieces of dictionary data with one or more pieces of input data.

9. The data processing method according to claim 6, the data processing method further comprising the step of regarding the particular input data written in an input memory region subsequent to a dictionary memory region of the dictionary, in which the dictionary data are written, as a piece of dictionary data in the step of comparing one or more pieces of dictionary data with one or more pieces of input data.

* * * * *